United States Patent
Gyouten et al.

(10) Patent No.: US 11,200,862 B2
(45) Date of Patent: Dec. 14, 2021

(54) SHIFT REGISTER AND DISPLAY DEVICE PROVIDED WITH THE SAME

(71) Applicant: SHARP KABUSHIKI KAISHA, Sakai (JP)

(72) Inventors: Seijirou Gyouten, Sakai (JP); Satoshi Horiuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/225,545

(22) Filed: Apr. 8, 2021

(65) Prior Publication Data

US 2021/0335311 A1 Oct. 28, 2021

Related U.S. Application Data

(60) Provisional application No. 63/014,333, filed on Apr. 23, 2020.

(51) Int. Cl.
*G11C 19/00* (2006.01)
*G09G 3/36* (2006.01)
*G11C 19/28* (2006.01)

(52) U.S. Cl.
CPC ......... *G09G 3/3677* (2013.01); *G09G 3/3688* (2013.01); *G11C 19/28* (2013.01); *G09G 2300/0408* (2013.01); *G09G 2310/0283* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2012/0194489 A1 | 8/2012 | Iwamoto et al. | |
| 2018/0211627 A1* | 7/2018 | Shi | G11C 19/28 |
| 2018/0336957 A1* | 11/2018 | Mi | G11C 19/287 |
| 2019/0019470 A1* | 1/2019 | Zeng | G09G 3/20 |
| 2019/0108810 A1* | 4/2019 | Iwase | G06F 3/0412 |
| 2019/0114984 A1* | 4/2019 | Tanaka | G09G 3/3677 |
| 2019/0147821 A1* | 5/2019 | Tagawa | G06F 3/0416 345/173 |

FOREIGN PATENT DOCUMENTS

WO 2011/055570 A1 5/2011

\* cited by examiner

*Primary Examiner* — Tuan T Lam
(74) *Attorney, Agent, or Firm* — ScienBiziP, P.C.

(57) ABSTRACT

A unit circuit of a shift register includes an output transistor whose control terminal is connected to a first node, first and second set transistors, first and second reset transistors, a control signal generating circuit that generates a control signal that changes to an on level when a first clock signal changes to an on level while the potential of the first node is at an off level, and that outputs the generated control signal to the unit circuits at a preceding stage and a next stage, a transistor that applies an off-level potential to the first node based on a control signal output from the unit circuit at the preceding stage, and a transistor that applies an off-level potential to the first node based on a control signal output from the unit circuit at the next stage.

9 Claims, 43 Drawing Sheets

SHIFT REGISTER AND DISPLAY DEVICE PROVIDED WITH THE SAME

CROSS-REFERENCE TO RELATED APPLICATIONS

This application claims the benefit of priority to U.S. Provisional Application No. 63/014,333 filed on Apr. 23, 2020. The entire contents of the above-identified application are hereby incorporated by reference.

BACKGROUND

Technical Filed

The disclosure relates to a shift register, particularly to a shift register that can shift in both directions, and to a display device provided with the shift register.

In a display device such as a liquid crystal display device and an organic electroluminescence display device, in order to downsize the device and reduce power consumption of the device, a technology (a gate driver monolithic technology) is used that uses a thin film transistor (hereinafter referred to as a TFT) to form a scanning line drive circuit integrally with a pixel circuit on a display panel. The scanning line drive circuit is configured using a shift register provided with a plurality of unit circuits connected at multiple stages. A shift register that can shift in both directions is used for a scanning line drive circuit capable of switching the scanning direction.

With respect to the unit circuit of the shift register, many circuit configurations are known in the related art. In FIG. 17 of WO 2011/55570, a unit circuit illustrated in FIG. 27 is described as the unit circuit of the shift register that can shift in both directions. In a unit circuit 91 illustrated in FIG. 27, a clock signal CKA is supplied to a drain terminal, a source terminal is connected to an output terminal GOUT, and a TFT: TS whose gate terminal is connected to a node nA functions as an output transistor. The unit circuit 91 includes two potential stabilizing circuits 92 and 93 in order to prevent fluctuations in the potential of the node nA when the clock signal CKA changes to a high level.

When the shift register performs a forward shift, the potential stabilizing circuit 93 operates. By the action of the potential stabilizing circuit 93, before the clock signal CKA changes to the high level, the potential of a node nB2 is controlled to be at the high level, and a low level potential VSS is applied to the node nA via a TFT: T11. When the shift register performs a reverse shift, the potential stabilizing circuit 92 operates. By the action of the potential stabilizing circuit 92, before the clock signal CKA changes to the high level, the potential of a node nB1 is controlled to be at the high level, and the low level potential VSS is applied to the node nA via a TFT: T8.

In a period including a timing at which the clock signal CKA changes to the high level in this manner, by controlling the TFT: T8 or T11 to be in an on state and applying the low level potential VSS to the node nA, fluctuations in the potential of the node nA can be prevented. As a result, malfunction of the shift register and a display device can be prevented.

In WO 2011/55570, as illustrated in FIG. 28, it is also described that a TFT: T21 that applies the low level potential VSS to the node nB1 when a clock signal CKD is at the high level, and a TFT: T22 that applies the low level potential VSS to the node nB2 when a clock signal CKC is at the high level are added to the unit circuit 91. According to a shift register including a unit circuit 95 illustrated in FIG. 28, by periodically controlling the potentials of the nodes nB1 and nB2 using the TFTs: T21 and T22, fluctuations in threshold voltages of the TFTs: T8 and T11 can be prevented.

The unit circuit 91 includes the potential stabilizing circuits 92 and 93 to prevent the fluctuations in the potential of the node nA. The unit circuit 95 is obtained by adding two TFTs to the unit circuit 91. Thus, in the shift register including the unit circuit 91 or 95, there is a problem in that a circuit volume of the shift register increases and a frame size of a display panel (a size of a peripheral portion of a display region) becomes large.

SUMMARY

Therefore, an object is to provide a shift register that is capable of shifting in both directions and preventing fluctuations in the potential of a node connected to a control terminal of an output transistor in a unit circuit, and that has a small circuit volume.

(1) A shift register according to some of embodiments of the disclosure is a shift register configured to shift in both directions.

The shift register includes a plurality of unit circuits connected at multiple stages, and the unit circuit includes an output transistor, one of conduction terminals thereof being supplied with a first clock signal, another conduction terminal thereof being connected to an output terminal of an output signal, and a control terminal thereof being connected to a first node, a first set transistor configured to apply an on-level potential to the first node based on a first set signal, a first reset transistor configured to apply an off-level potential to the first node based on a first reset signal, a second set transistor configured to apply an on-level potential to the first node based on a second set signal, a second reset transistor configured to apply an off-level potential to the first node based on a second reset signal, a control signal generating circuit configured to generate a control signal that changes to an on level when the first clock signal changes to an on level while a potential of the first node is at an off level, and to output the control signal to the unit circuits at a preceding stage and a next stage, a first potential stabilizing transistor configured to apply an off-level potential to the first node based on a control signal output from the unit circuit at the preceding stage, and a second potential stabilizing transistor configured to apply an off-level potential to the first node based on a control signal output from the unit circuit at the next stage.

According to the shift register described above, a bidirectional shift can be performed using two types of set signals and two types of reset signals. Further, at a timing when the first clock signal changes to the on level, one of the first and second potential stabilizing transistors is in the on state, and the off level is applied to the first node. Therefore, it is possible to prevent the potential of the first node from fluctuating when the first clock signal changes to the on level. Further, by outputting the control signal generated by the control signal generating circuit in the current unit circuit to the unit circuits at the preceding stage and the next stage, a circuit volume of the shift register can be reduced compared to a case where circuits for preventing the fluctuations in the potential of the first node are provided in the unit circuit for each shift direction. Therefore, it is possible to provide the shift register, with a small circuit volume, that is capable of shifting in both directions and preventing the fluctuations in the potential of the first node connected to the control terminal of the output transistor in the unit circuit.

(2) The shift register according to some of the embodiments of the disclosure has the configuration of (1) described above, and the control signal generating circuit includes a first transistor that, based on the first clock signal, applies an on-level potential to a second node connected to an output terminal of the control signal, and a second transistor that, based on the potential of the first node, applies an off-level potential to the second node.

(3) The shift register according to some of the embodiments of the disclosure has the configuration of (2) described above, and the control signal generating circuit further includes a third transistor that, based on the first clock signal and a second clock signal that differs in phase from the first clock signal by a half period, applies an off-level potential to the second node.

(4) The shift register according to some of the embodiments of the disclosure has the configuration of (3) described above, and the control signal generating circuit further includes a fourth transistor that, based on a second control signal that is set to an on level after the first clock signal stops, applies an off level potential to the second node.

(5) The shift register according to some of the embodiments of the disclosure has the configuration of (1) described above, instead of the control signal output from the unit circuit at the preceding stage, one clock signal among multi-phase clock signals is supplied to the first potential stabilizing transistor in the unit circuit at an initial stage, and instead of the control signal output from the unit circuit at the next stage, another clock signal among the multi-phase clock signals is supplied to the second potential stabilizing transistor in the unit circuit at a final stage.

(6) The shift register according to some of the embodiments of the disclosure has the configuration of (1) described above, and further includes an initial stage control signal generating circuit configured to generate an initial stage control signal, and a final stage control signal generating circuit configured to generate a final stage control signal.

Instead of the control signal output from the unit circuit at the preceding stage, the initial stage control signal is supplied to the first potential stabilizing transistor in the unit circuit at an initial stage, and instead of the control signal output from the unit circuit at the next stage, the final stage control signal is supplied to the second potential stabilizing transistor in the unit circuit at a final stage.

(7) The shift register according to some of the embodiments of the disclosure has the configuration of (1) described above, one clock signal among four-phase clock signals is supplied to the unit circuit as the first clock signal, the first set signal is an output signal of the unit circuit at the preceding stage, the first reset signal is an output signal of a unit circuit at a stage three stages after, the second set signal is an output signal of the unit circuit at the next stage, and the second reset signal is an output signal of a unit circuit at a stage three stages preceding.

(8) The shift register according to some of the embodiments of the disclosure has the configuration of (1) described above, one clock signal among six-phase clock signals is supplied to the unit circuit as the first clock signal, the first set signal is an output signal of a unit circuit at a stage two stages preceding, the first reset signal is an output signal of a unit circuit at a stage four stages after, the second set signal is an output signal of a unit circuit two stages after, and the second reset signal is an output signal of a unit circuit at a stage four stages preceding.

(9) A display device according to some of the embodiments of the disclosure includes a plurality of pixel circuits, a plurality of scanning lines, a plurality of data lines, a data line drive circuit configured to drive the data lines, and a scanning line drive circuit including the shift register having the configuration of (1) described above and configured to drive the scanning lines.

These and other objects, features, aspects, and advantages of the disclosure will become more apparent from the following detailed description of the disclosure with reference to the accompanying drawings.

BRIEF DESCRIPTION OF DRAWINGS

The disclosure will be described with reference to the accompanying drawings, wherein like numbers reference like elements.

DESCRIPTION OF EMBODIMENTS

A shift register according to each of embodiments will be described below with reference to the drawings. The shift register to be described below includes n (n is an integer of 2 or greater) unit circuits connected at multiple stages. The n unit circuits will be referred to as unit circuits at a first stage, a second stage, a third stage, . . . , an n-th stage in order of connection, and the unit circuits in the vicinity of the first stage will be referred to as a lead section, those in the vicinity of the n-th stage will be referred to as an end section, and the remaining stages will be referred to as an intermediate section. In the following description, m is an integer of 2 or greater, n is 1080, i is an integer of 1 or greater and n or less, and j is an integer of 1 or greater and m or less.

Further, if a transistor is turned on when a signal is supplied to a control terminal of the transistor, a level of the signal will be referred to as an on level, and the potential of the signal will be referred to as an on level potential. Conversely, if the transistor is turned off, the level of the signal will be referred to as an off level, and the potential of the signal will be referred to as an off level potential. For example, in an n-channel transistor, a high level is the on level and a low level is the off level.

First Embodiment

Figure 1A:
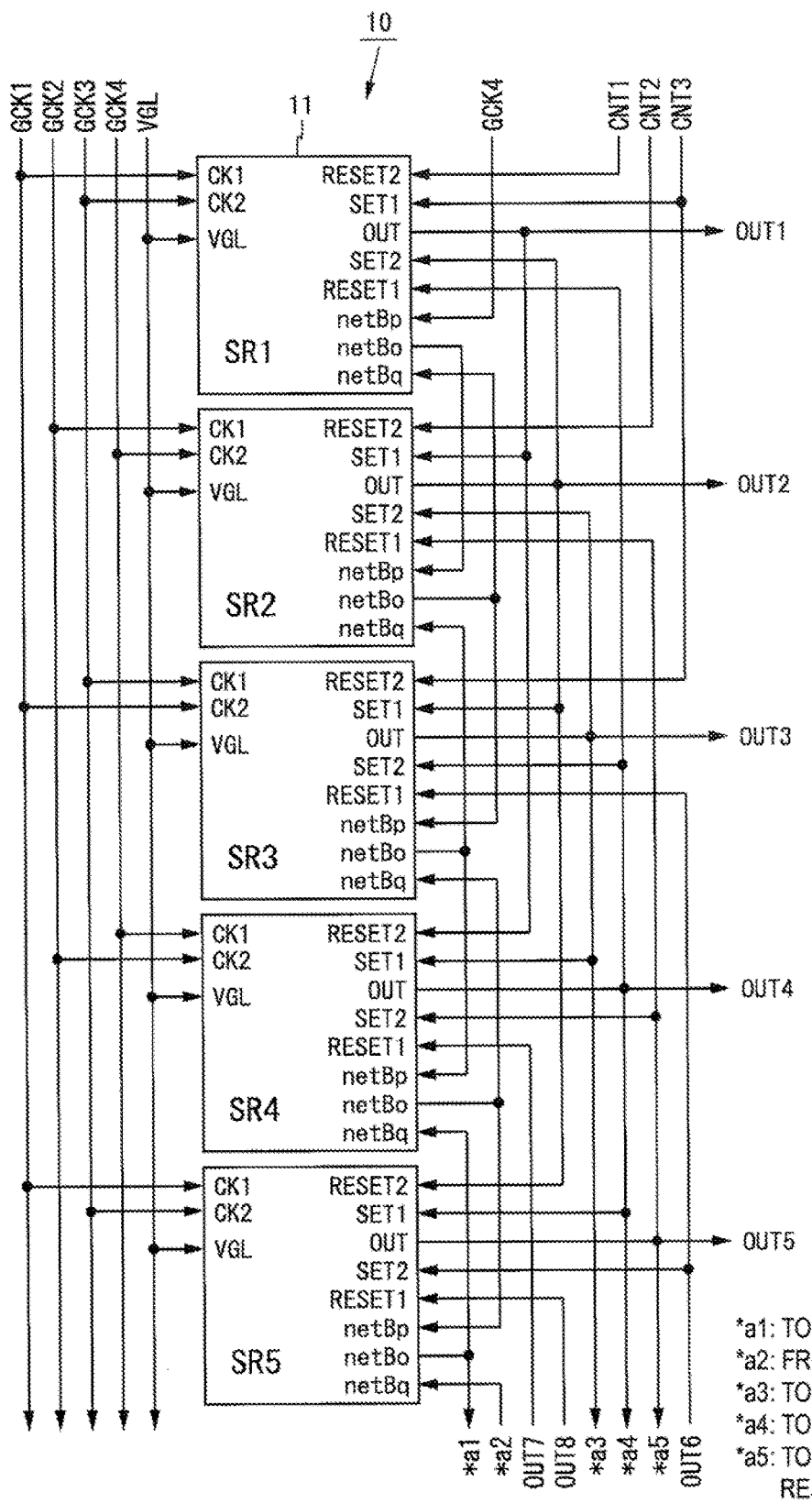
FIG. 1A is a block diagram illustrating a configuration of a lead section of a shift register according to a first embodiment.
Figure 1B:
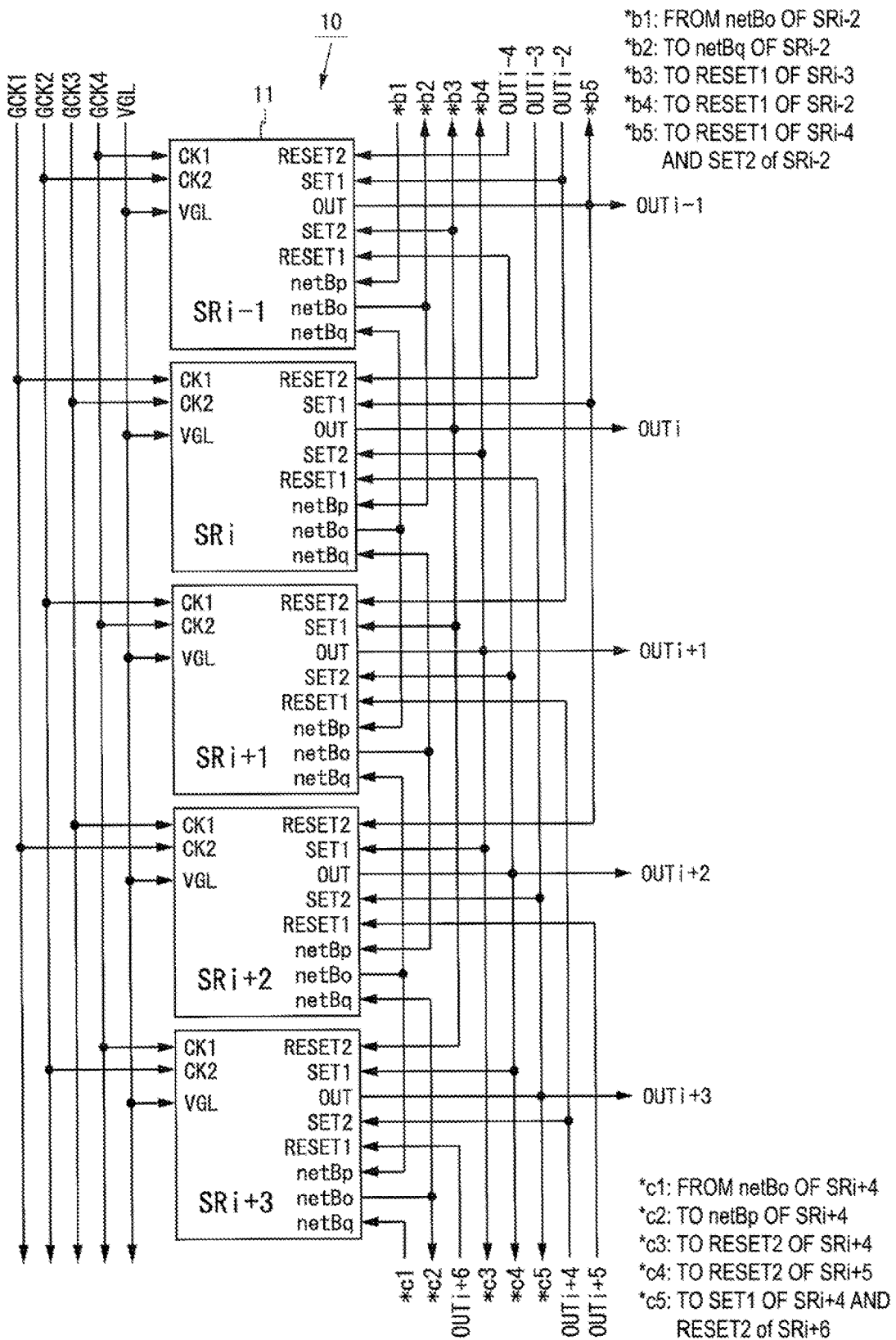
FIG. 1B is a block diagram illustrating a configuration of an intermediate section of the shift register according to the first embodiment.
Figure 1C:
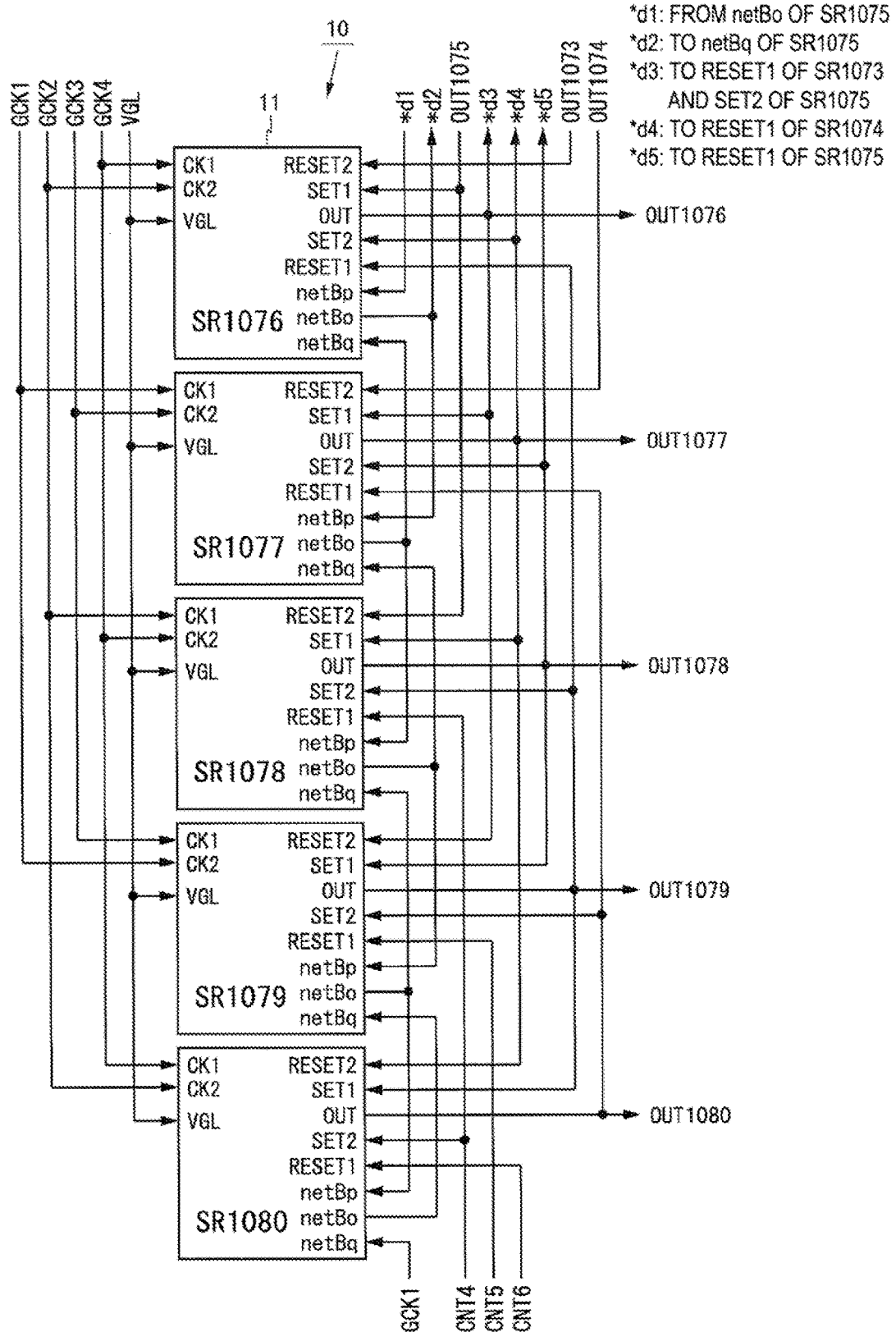
FIG. 1C is a block diagram illustrating a configuration of an end section of a shift register according to the first embodiment.

FIG. 1A to FIG. 1C are block diagrams illustrating a configuration of a shift register according to a first embodiment. A shift register 10 according to the present embodiment includes n unit circuits 11 connected at multiple stages. FIG. 1A to FIG. 1C illustrate configurations of a lead section, an intermediate section, and an end section of the shift register 10, respectively. SRi in the drawings indicates the unit circuit 11 at the i-th stage. Four-phase gate clocks GCK1 to GCK4, control signals CNT1 to CNT6, and a low level potential VGL are supplied to the shift register 10. The shift register 10 outputs output signals OUT1 to OUTn based on these signals and the potential.

Figure 2:
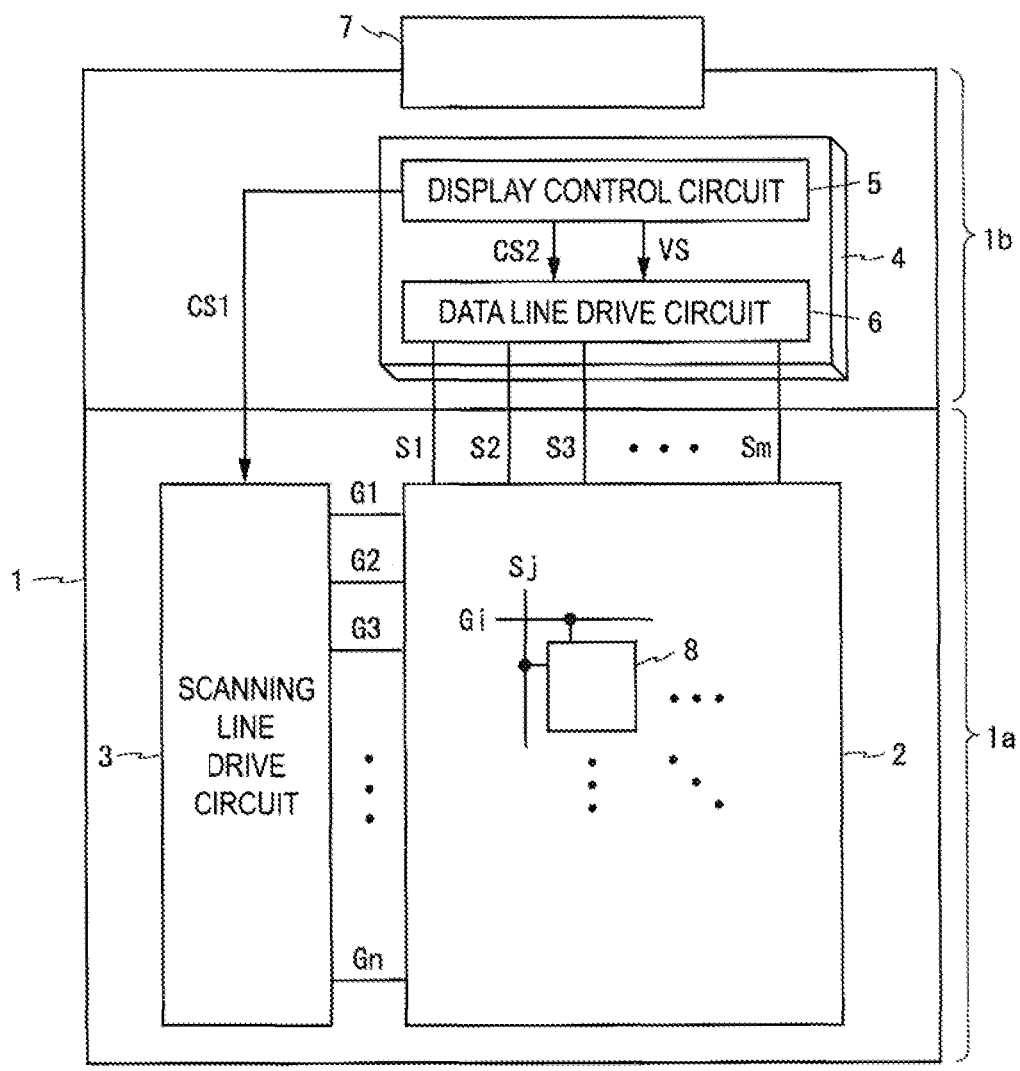
FIG. 2 is a diagram illustrating a configuration of a liquid crystal display device including the shift register according to the first embodiment.

An example of a usage mode of the shift register 10 will be described with reference to FIG. 2 and FIG. 3. FIG. 2 is a diagram illustrating a configuration of a liquid crystal display device including the shift register 10. The liquid crystal display device illustrated in FIG. 2 is provided with a liquid crystal panel 1 including an opposing region 1*a* and a non-opposing region 1*b*. A display region 2 and a scanning line drive circuit 3 are formed in the opposing region 1*a*. The scanning line drive circuit 3 is formed on the liquid crystal panel 1 integrally with a pixel circuit 8 in the display region 2 using a TFT (a gate driver monolithic configuration). A data line drive IC4, which includes a display control circuit 5 and a data line drive circuit 6, is mounted on the non-opposing region 1*b*. A flexible printed circuit board 7 is fixed to the non-opposing region 1*b* in order to connect the liquid crystal panel 1 to a host device (not illustrated).

The display region 2 includes scanning lines G1 to Gn, data lines S1 to Sm, and (m×n) of the pixel circuits 8. The scanning lines G1 to Gn are arranged parallel to each other. The data lines S1 to Sm are arranged parallel to each other so as to be orthogonal to the scanning lines G1 to Gn. The scanning lines G1 to Gn and the data lines S1 to Sm intersect at (m×n) locations. Each of the (m×n) pixel circuits 8 is arranged in the vicinity of each of intersection points between the scanning lines G1 to Gn and the data lines S1 to Sm.

Figure 3:
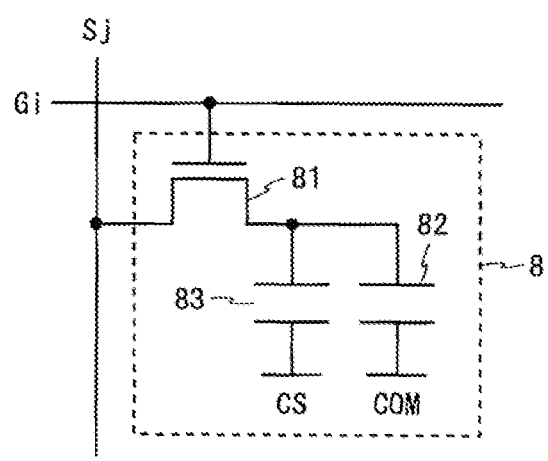
FIG. 3 is a circuit diagram illustrating a pixel circuit of the liquid crystal display device illustrated in FIG. 2.

FIG. 3 is a circuit diagram of the pixel circuit 8. FIG. 3 illustrates the pixel circuit 8 arranged in the vicinity of the intersection point of the scanning line Gi and the data line Sj. The pixel circuit 8 includes a TFT 81, a liquid crystal capacitor 82, and an auxiliary capacitor 83. A gate terminal of the TFT 81 is connected to the scanning line Gi. One of conduction terminals (a terminal on the left side in FIG. 3) of the TFT 81 is connected to the data line Sj. The other conduction terminal of the TFT 81 is connected to one of electrodes (an upper electrode in FIG. 3) of the liquid crystal capacitor 82 and one of electrodes (an upper electrode in FIG. 3) of the auxiliary capacitor 83. The other electrode of the liquid crystal capacitor 82 is connected to a common electrode COM, and the other electrode of the auxiliary capacitor 83 is connected to an auxiliary capacitance line CS.

The display control circuit 5 outputs a control signal CS1 to the scanning line drive circuit 3, and outputs a control signal CS2 and an image signal VS to the data line drive circuit 6. The scanning line drive circuit 3 drives the scanning lines G1 to Gn based on the control signal CS1. The data line drive circuit 6 drives the data lines S1 to Sm based on the control signal CS2 and the image signal VS.

More specifically, the scanning line drive circuit 3 sequentially selects one of the scanning lines G1 to Gn based on the control signal CS1, and applies a high-level voltage to the selected scanning line and a scanning line to be selected next. In this way, the m pixel circuits 8 connected to the selected scanning line are selected, and also, the m pixel circuits 8 connected to the scanning line to be selected next are preliminarily selected. The data line drive circuit 6 applies m potentials, corresponding to the image signal VS, to the data lines S1 to Sm based on the control signal CS2. In this way, the m potentials corresponding to the image signal VS are written to the m pixel circuits 8 connected to the selected scanning line, respectively. The pixel circuit 8 corresponds to a pixel, and a brightness of the pixel changes in accordance with the potential written to the pixel circuit 8. Thus, by writing a desired potential in all of the pixel circuits 8 using the scanning line drive circuit 3 and the data line drive circuit 6, a desired image can be displayed in the display region 2.

Note that in FIG. 2, the display control circuit 5 included in the data line drive IC4 outputs the control signal CS1 to the scanning line drive circuit 3. Alternatively, a display control circuit (not illustrated) included in the host device may output a control signal to the scanning line drive circuit 3 via the flexible printed circuit board 7.

The shift register 10 functions as the scanning line drive circuit 3 or a part of the scanning line drive circuit 3. The output signals OUT1 to OUTn of the shift register 10 are applied to the scanning lines G1 to Gn, respectively. The shift register 10 performs either an operation for controlling the output signals OUT1 to OUTn to be at the high level in ascending order (hereinafter referred to as a forward shift), or an operation for controlling the output signals OUT1 to OUTn to be at the high level in decreasing order (hereinafter referred to as a reverse shift), in accordance with timings at which the gate clocks GCK1 to GCK4 change. In this way, the shift register 10 switches a shift direction in accordance with four-phase clock signals supplied from outside.

As illustrated in FIG. 1A to FIG. 1C, the unit circuit 11 has clock terminals CK1 and CK2, set terminals SET1 and SET2, reset terminals RESET1 and RESET2, control terminals netBp and netBq, output terminals OUT and netBo, and a power supply terminal VGL. The low level potential VGL is supplied to the power supply terminal VGL of the unit circuit 11 at each stage.

Hereinafter, a signal input from a terminal of a unit circuit will referred to by the same name as the terminal. For example, a signal input from the clock terminal CK1 will referred to as a clock signal CK1. Further, a signal output from the output terminal OUT of the unit circuit 11 at the i-th stage will referred to as an output signal OUTi, and a signal output from the output terminal netBo of the unit circuit 11 at the i-th stage will be referred to as a control signal netBi.

The n unit circuits 11 are classified into four groups in order of connection. When k is an integer of 1 or greater and 270 or less, the unit circuit 11 at the (4k−3)th stage is classified as being in a first group, the unit circuit 11 at the (4k−2)th stage is classified as being in a second group, the unit circuit 11 at the (4k−1)th stage is classified as being in a third group, and the unit circuit 11 at the 4k-th stage is classified as being in a fourth group. In FIG. 1B, the unit circuit 11 at the i-th stage is classified as being in the first group.

The gate clock GCK1 is supplied to the clock terminal CK1 of the unit circuit 11 in the first group and the clock terminal CK2 of the unit circuit 11 in the third group. The gate clock GCK2 is supplied to the clock terminal CK1 of the unit circuit 11 in the second group and the clock terminal CK2 of the unit circuit 11 in the fourth group. The gate clock GCK3 is supplied to the clock terminal CK1 of the unit circuit 11 in the third group and the clock terminal CK2 of the unit circuit 11 in the first group. The gate clock GCK4 is supplied to the clock terminal CK1 of the unit circuit 11 in the fourth group and the clock terminal CK2 of the unit circuit 11 in the second group.

An output signal OUTi−1 of the unit circuit 11 at the preceding stage is supplied to the set terminal SET1 of the unit circuit 11 at the i-th stage. Note that the control signal CNT3 is supplied to the set terminal SET1 of the unit circuit 11 at the first stage. An output signal OUTi+3 of the unit circuit 11 at a stage three stages after the i-th stage is supplied to the reset terminal RESET1 of the unit circuit 11 at the i-th stage. Note that, to the reset terminals RESET1 of the unit circuits 11 at the (n−2)th to n-th stages, the control signals CNT4 to CNT6 are supplied, respectively.

An output signal OUTi+1 of the unit circuit 11 at the next stage is supplied to the set terminal SET2 of the unit circuit 11 at the i-th stage. Note that, to the set terminal SET2 of the unit circuit 11 at the n-th stage, the control signal CNT4 is supplied. An output signal OUTi−3 of the unit circuit 11 at a stage three stages before the i-th stage is supplied to the reset terminal RESET2 of the unit circuit 11 at the i-th stage. Note that, to the reset terminals RESET2 of the unit circuits 11 at the first to third stages, the control signals CNT1 to CNT3 are supplied, respectively.

A control signal netBi−1 output from the unit circuit 11 at the preceding stage is supplied to the control terminal netBp of the unit circuit 11 at the i-th stage. Note that, to the control terminal netBp of the unit circuit 11 at the first stage, the gate clock GCK4 is supplied. A control signal netBi+1 output from the unit circuit 11 at the next stage is supplied to the control terminal netBq of the unit circuit 11 at the i-th stage. Note that, to the control terminal netBq of the unit circuit 11 at the n-th stage, the gate clock GCK1 is supplied.

Figure 4:
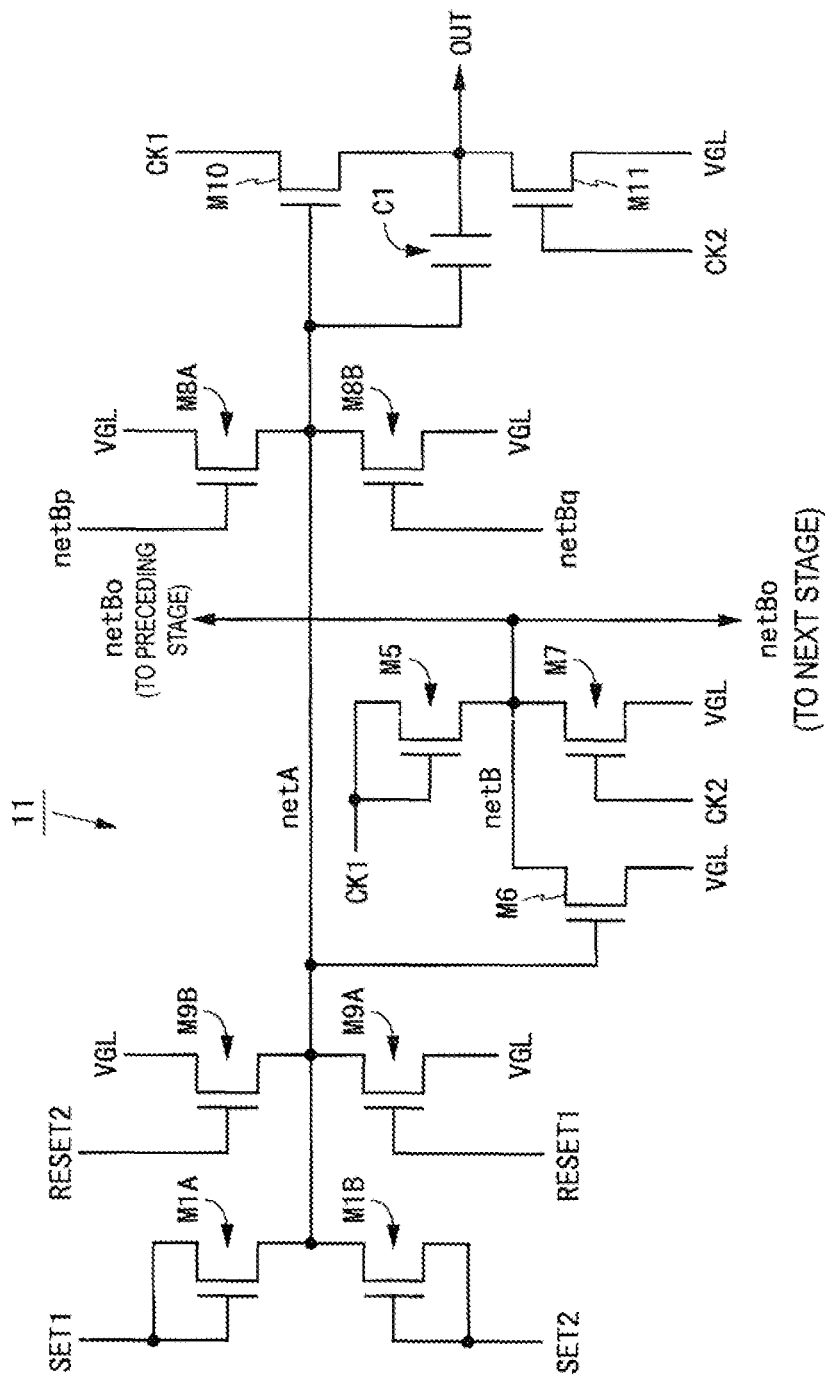
FIG. 4 is a circuit diagram illustrating a configuration of a unit circuit of the shift register according to the first embodiment.

FIG. 4 is a circuit diagram of the unit circuit 11. As illustrated in FIG. 4, the unit circuit 11 includes eleven TFTs: M1A, M1B, M5 to M7, M8A, M8B, M9A, M9B, M10, and M11, and a capacitor C1. Each of the TFTs in the unit circuit 11 is an n-channel TFT. In FIG. 4, a node to which a gate terminal of the TFT: M10 is connected is referred to as a node netA, and a node to which the output terminal netBo is connected is referred to as a node netB.

Source terminals of the TFTs: M1A and M1B, drain terminals of the TFTs: M8A, M8B, M9A, and M9B, and gate terminals of the TFTs: M6 and M10 are connected to the node netA. A source terminal of the TFT: M5 and drain terminals of the TFTs: M6 and M7 are connected to the node netB. A drain terminal of the TFT: M10 is connected to the clock terminal CK1. A source terminal of the TFT: M10 and a drain terminal of the TFT: M11 are connected to the output terminal OUT.

A drain terminal and a gate terminal of the TFT: M1A are connected to the set terminal SET1. A drain terminal and a gate terminal of the TFT: M1B are connected to the set terminal SET2. A gate terminal of the TFT: M9A is connected to the reset terminal RESET1. A gate terminal of the TFT: M9B is connected to the reset terminal RESET2. A gate terminal of the TFT: M8A is connected to the control terminal netBp. A gate terminal of the TFT: M8B is connected to the control terminal netBq. A drain terminal and a gate terminal of the TFT: M5 are connected to the clock terminal CK1. Gate terminals of the TFTs: M7 and M11 are connected to the clock terminal CK2. The low level potential VGL is applied to the source terminals of the TFTs: M6, M7, M8A, M8B, M9A, M9B, and M11. The capacitor C1 is provided between the gate terminal and the source terminal of the TFT: M10.

The TFTs: M5 to M7 generate the control signal netBi based on the potentials of the clock signals CK1 and CK2 and the node netA. The control signal netBi is not used in the unit circuit 11 at its own stage, and is output to the unit circuits 11 at the preceding stage and the next stage. In the unit circuit 11 at the preceding stage, based on the control signal netBi, the TFT: M8B applies the low level potential VGL to the node netA in the unit circuit 11 at the preceding stage. In the unit circuit 11 at the next stage, based on the control signal netBi, the TFT: M8A applies the low level potential VGL to the node netA in the unit circuit 11 at the next stage.

A first clock signal is supplied to one of conduction terminals of the TFT: M10, the other conduction terminal of the TFT: M10 is connected to the output terminal of the output signal, and a control terminal of the TFT: M10 functions as an output transistor connected to a first node. The TFT: M1A functions as a first set transistor that applies an on-level potential to the first node based on a first set signal. The TFT: M9A functions as a first reset transistor that applies an off-level potential to the first node based on a first reset signal. The TFT: M1B functions as a second set transistor that applies the on-level potential to the first node based on a second set signal. The TFT: M9B functions as a second reset transistor that applies the off-level potential to the first node based on a second reset signal.

The TFTs: M5 to M7 function as a control signal generating circuit that generates a control signal that changes to the on level when the first clock signal changes to the on level while the potential of the first node is at the off level, and outputs the generated control signal to the unit circuits at the preceding stage and the next stage. The TFT: M5 functions as a first transistor that applies the on-level potential to a second node connected to the output terminal of the control signal, based on the first clock signal. The TFT: M6 functions as a second transistor that applies the off-level potential to the second node based on the potential of the first node. The TFT: M7 functions as a third transistor that applies the off-level potential to the second node based on the first clock signal and a second clock signal that differs in phase from the first clock signal by a half period. The TFT: M8A functions as a first potential stabilizing transistor that applies the off-level potential to the first node based on the control signal output from the unit circuit at the preceding stage. The TFT: M8B functions as a second potential stabilizing transistor that applies the off-level potential to the first node based on the control signal output from the unit circuit at the next stage.

Figure 5A:
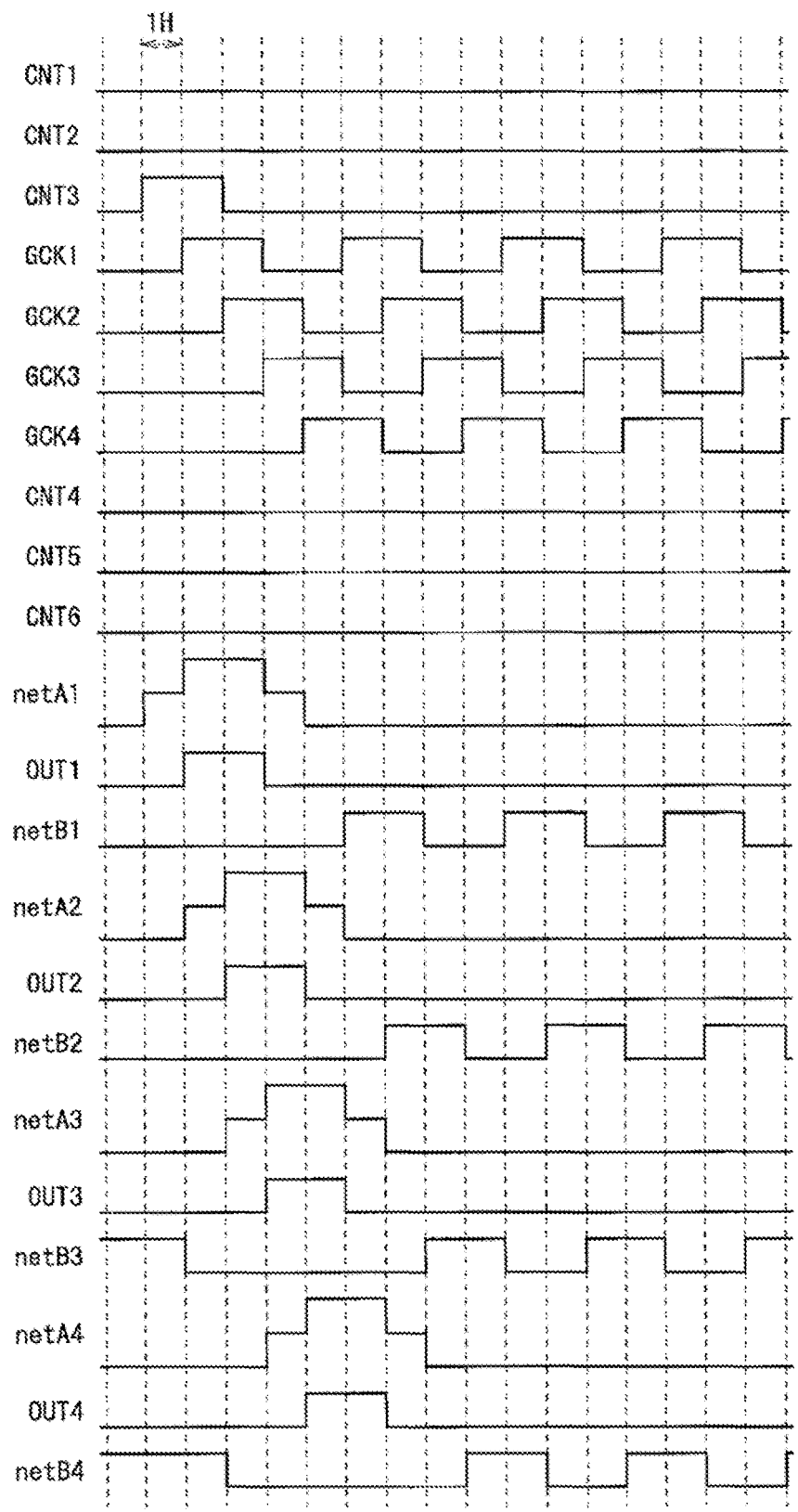
FIG. 5A is a timing chart during a forward shift of the lead section of the shift register according to the first embodiment.
Figure 5B:
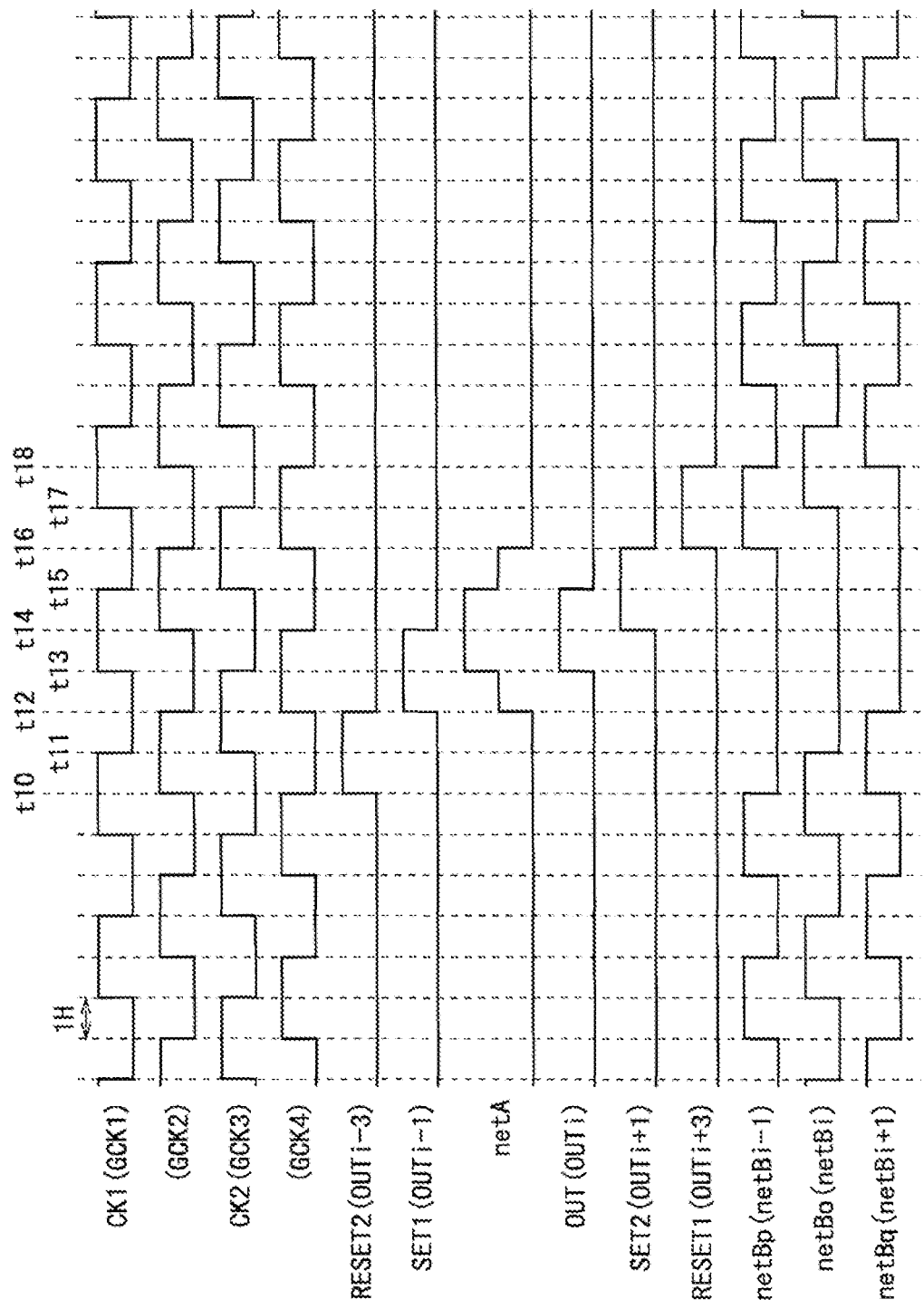
FIG. 5B is a timing chart during the forward shift of the intermediate section of the shift register according to the first embodiment.
Figure 5C:
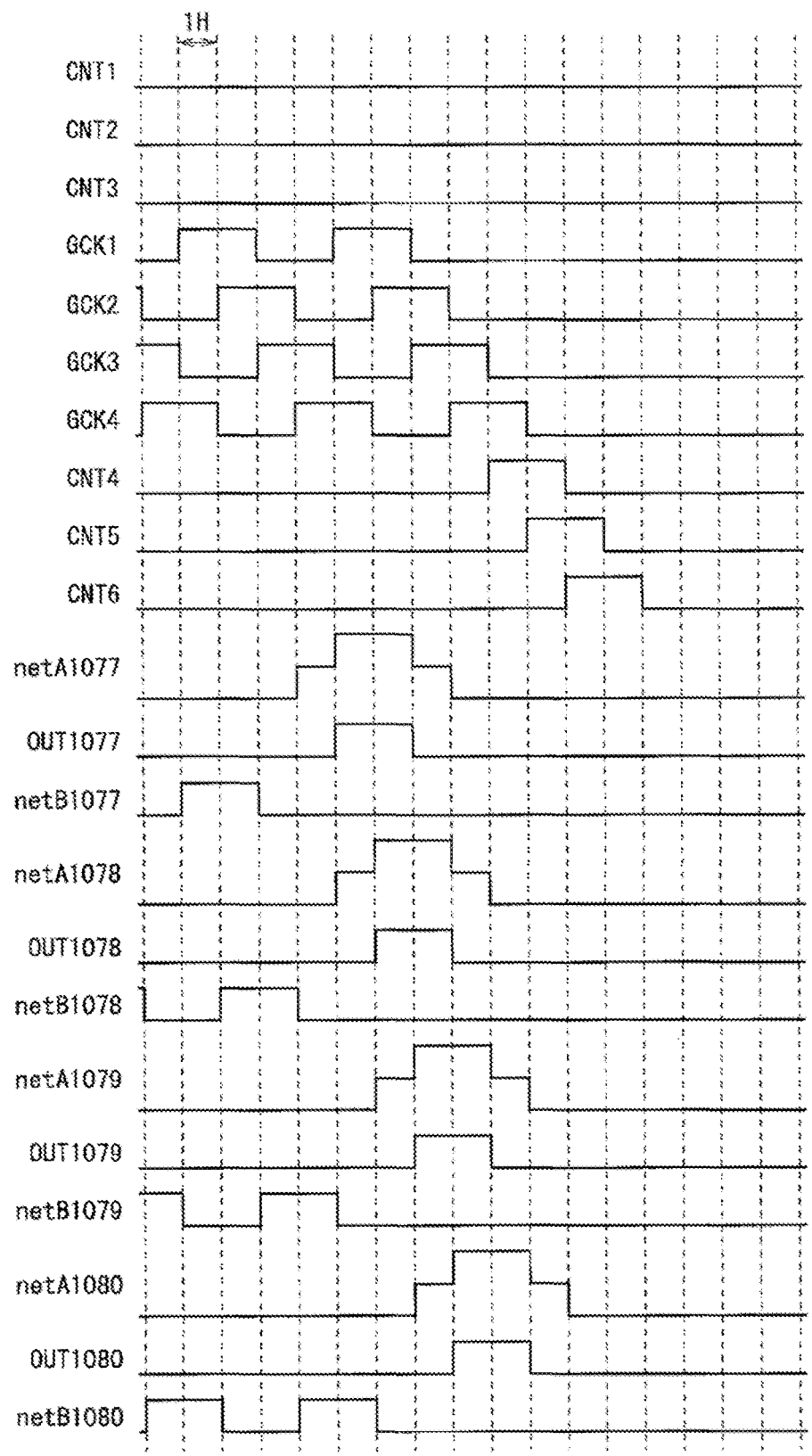
FIG. 5C is a timing chart during the forward shift of the end section of the shift register according to the first embodiment.

FIG. 5A to FIG. 5C are timing charts during the forward shift of the shift register 10. FIG. 5A to FIG. 5C illustrate timings of the lead section, the intermediate section, and the end section of the shift register 10, respectively. FIG. 5B illustrates timings of the unit circuit 11 at the i-th stage, which is classified as being in the first group. Intervals illustrated in the timing charts and indicated by dashed lines are each a period 1H (one horizontal period).

As illustrated in FIG. 5A to FIG. 5C, a period of each of the gate clocks GCK1 to GCK4 is a period 4H, and the length of a high level period and the length of a low level period are both a period 2H. The gate clocks GCK2 to GCK4 are delayed by the period 1H with respect to the gate clocks GCK1 to GCK3, respectively. The control signals CNT1 to CNT2 are always at the low level.

As illustrated in FIG. 5A, before the start of the forward shift, the gate clocks GCK1 to GCK4 and the control signals CNT3 to CNT6 are all at the low level. At the start of the forward shift, first, the control signal CNT3 is set to the high level only for the period 2H. The gate clocks GCK 1 to GCK4 are set to the high level only for the period 2H with a delay of the period 1H with respect to the control signal CNT3 and the gate clocks GCK1 to GCK3, respectively. After that, each of the gate clocks GCK1 to GCK4 is alternately set to the high level and the low level for the period 2H each time.

As illustrated in FIG. 5C, at the end of the forward shift, first, the gate clock GCK1 is fixed to the low level. The gate clocks GCK2 to GCK4 are fixed to the low level with a delay of the period 1H with respect to the gate clocks GCK1 to GCK3, respectively. The control signal CNT4 is set to the high level only for the period 2H with a delay of the period 1H after the gate clock GCK4 changes to the high level a last time. The control signals CNT5 to CNT6 are set to the high level only for the period 2H with a delay of the period 1H with respect to the control signals CNT4 to CNT5, respectively.

With reference to FIG. 5B, an operation of the unit circuit 11 at the i-th stage during the forward shift will be described. When the unit circuit 11 is classified as being in the first group, the clock signal CK1 is the gate clock GCK1, and the clock signal CK2 is the gate clock GCK3. The clock signal CK2 differs in phase from the clock signal CK1 by a half period.

Immediately before a time t10, the clock signal CK1 and the control signal netBp are at the high level, and the clock signal CK2, the set signals SET1 and SET2, the reset signals RESET1 and RESET2, and the control signal netBq are at the low level. Thus, the TFTs: M5 and M8A are in an on state, and the TFTs: M1A, M1B, M7, M8B, M9A, M9B, and M11 are in an off state. Therefore, the potential of the node netA is at the low level, and the TFTs: M6 and M10 are in the off state. Thus, the potential of the node netB is at the high level, and the output signal OUTi is at the low level.

At the time t10, the control signal netBp changes to the low level, and the reset signal RESET2 and the control signal netBq change to the high level. Accordingly, the TFT: M8A is turned off, and the TFTs: M8B and M9B are turned on. Even when the state of the TFT changes, the potentials of the nodes netA and netB and the output signal OUTi do not change.

At a time t11, the clock signal CK1 changes to the low level, and the clock signal CK2 changes to the high level. Accordingly, the TFT: M5 is turned off, and the TFTs: M7 and M11 are turned on. Thus, the potential of the node netB changes to the low level.

At a time t12, the reset signal RESET2 and the control signal netBq change to the low level, and the set signal SET1 changes to the high level. Accordingly, the TFTs: M8B and M9B are turned off, and the TFT: M1A is turned on. Thus, the potential of the node netA changes to the high level, and the TFTs: M6 and M10 are turned on.

At a time t13, the clock signal CK2 changes to the low level, and the clock signal CK1 changes to the high level. Accordingly, the TFTs: M7 and M11 are turned off, and the TFT: M5 is turned on. At this time, since the TFT: M10 is in the on state, the output signal OUTi changes to the high level. Further, since the capacitor C1 is present between the gate terminal and the source terminal of the TFT: M10, when the clock signal CK1 changes to the high level, the potential of the node netA becomes higher than a normal high level due to a bootstrap effect. Therefore, the output signal OUTi is set to the high level, which is the same level as that of the clock signal CK1, without being reduced by an amount corresponding to a threshold voltage of the TFT: M10.

Note that since the TFT: M6 is turned on at the time t12 and the TFT: M5 is turned on at the time t13, in a period from the time t13 to a time t15, the TFTs: M5 and M6 are both set to be in the on state. In this period, a current passing through the TFTs: M5 and M6 flows between the clock terminal CK1 and the power supply terminal VGL, and the potential of the node netB is determined based on a ratio of on-resistance values of the TFTs: M5 and M6. When both the TFTs: M5 and M6 are in the on state, in order to bring the potential of the node netB to a level close to the low level potential VGL, the sizes of the TFTs: M5 and M6 are designed so that the on-resistance value of the TFT: M6 is much smaller than the on-resistance value of the TFT: M5.

At a time t14, the set signal SET1 changes to the low level, and the set signal SET2 changes to the high level. Accordingly, the TFT: M1A is turned off, and the TFT: M1B is turned on. Even when the state of the TFT changes, the potentials of the nodes netA and netB and the output signal OUTi do not change.

At the time t15, the clock signal CK1 changes to the low level, and the clock signal CK2 changes to the high level. Accordingly, the TFT: M5 is turned off, and the TFTs: M7 and M11 are turned on. At this time, since the TFT: M10 is in the on state, the output signal OUTi changes to the low level. Further, when the clock signal CK1 changes to the low level, the potential of the node netA returns to the normal high level.

At a time t16, the set signal SET2 changes to the low level, and the reset signal RESET1 and the control signal netBp change to the high level. Accordingly, the TFT: M1B is turned off, and the TFTs: M8A and M9A are turned on. Thus, the potential of the node netA changes to the low level, and the TFTs: M6 and M10 are turned off.

At a time t17, the clock signal CK2 changes to the low level, and the clock signal CK1 changes to the high level. Accordingly, the TFTs: M7 and M11 are turned off, and the TFT: M5 is turned on. Thus, the potential of the node netB changes to the high level.

At a time t18, the reset signal RESET1 and the control signal netBp change to the low level, and the control signal netBq changes to the high level. Accordingly, the TFTs: M8A and M9A are turned off, and the TFT: M8B is turned on. Even when the state of the TFT changes, the potentials of the nodes netA and netB and the output signal OUTi do not change.

During the forward shift, the set signal SET2 and the reset signal RESET2 do not affect the operation of the unit circuit 11. The potential of the node netA changes to the high level when the set signal SET1 changes to the high level, and changes to the low level when the reset signal RESET1 changes to the high level. The output signal OUTi is at the high level when the potential of the node netA and the clock signal CK1 are at the high level, and is otherwise at the low level. The potential of the node netB is at the low level while the potential of the node netA is at the high level, changes to the high level when the clock signal CK1 changes to the high level while the potential of node netA is at the low level, and changes to the low level when the clock signal CK2 changes to the high level.

The output signal OUTi is set to the high level only for the period 2H with a delay of the period 1H with respect to the set signal SET1. The set signal SET1 is the output signal OUTi-1 of the unit circuit 11 at the preceding stage. Thus, during the forward shift, the output signals OUT1 to OUTn are each set to the high level only for the period 2H in ascending order, with a delay of the period 1H therebetween.

Figure 6A:
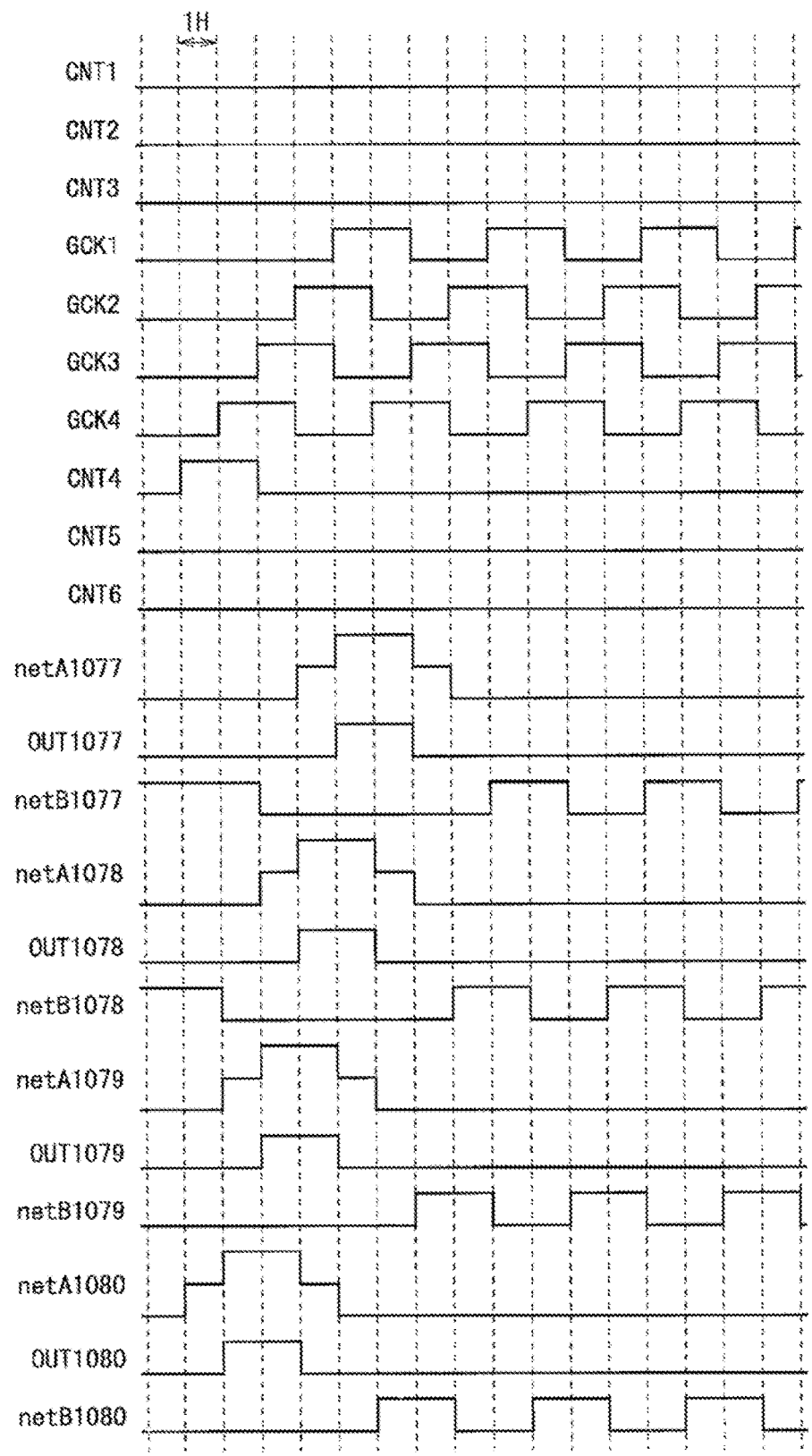
FIG. 6A is a timing chart during a reverse shift of the end section of the shift register according to the first embodiment.
Figure 6B:
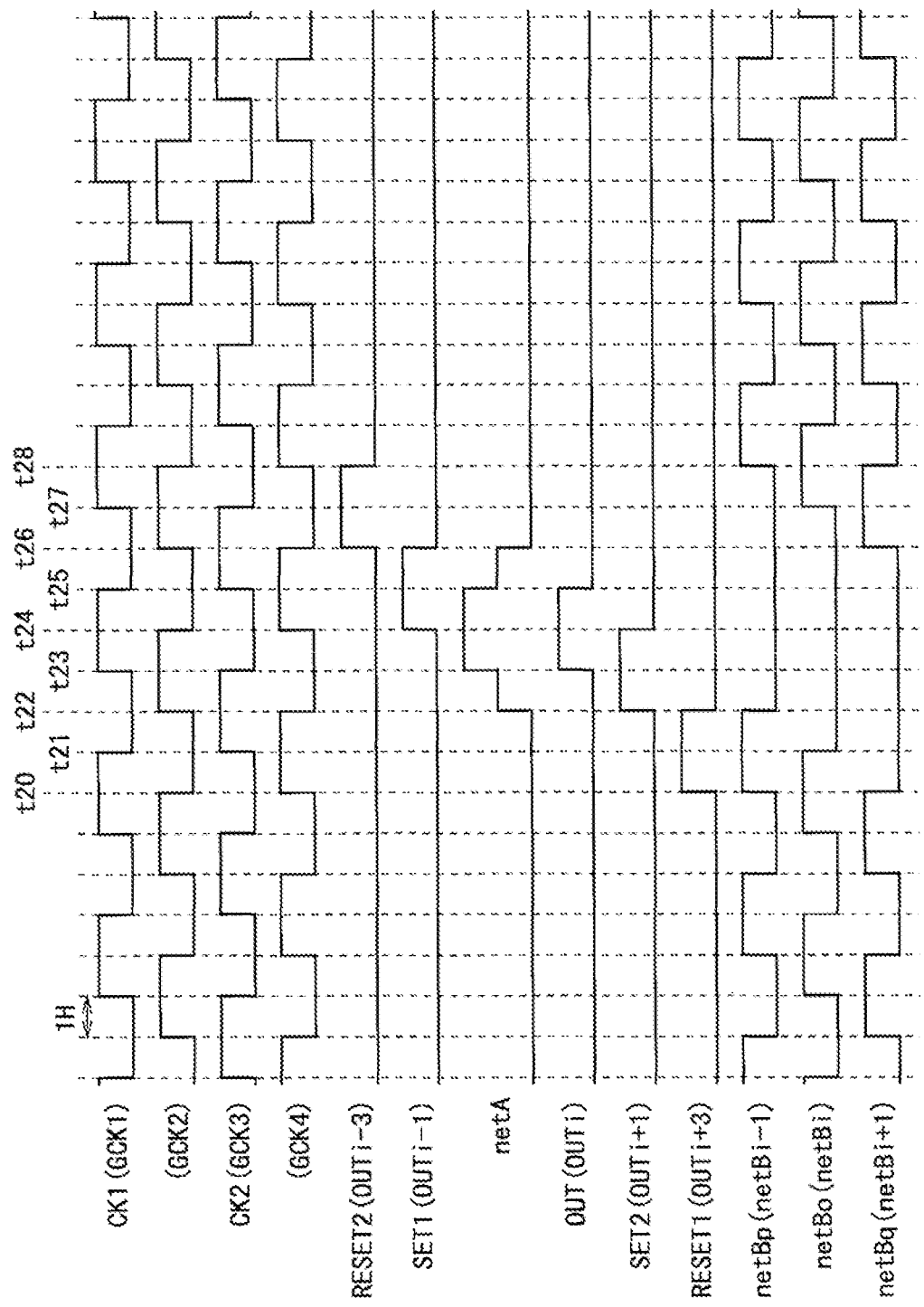
FIG. 6B is a timing chart during the reverse shift of the intermediate section of the shift register according to the first embodiment.
Figure 6C:
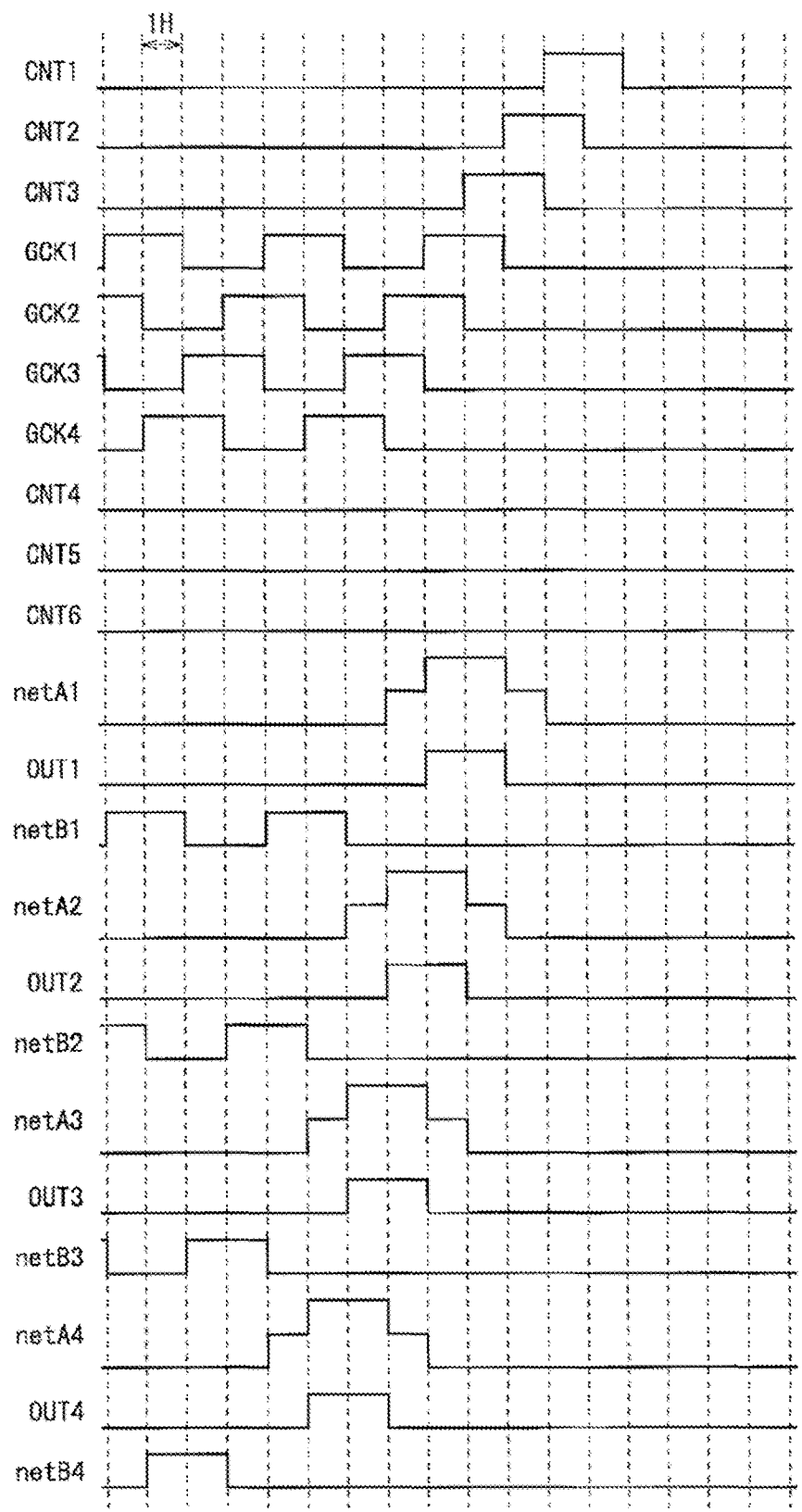
FIG. 6C is a timing chart during the reverse shift of the lead section of the shift register according to the first embodiment.

FIG. 6A to FIG. 6C are timing charts during the reverse shift of the shift register 10. FIG. 6A to FIG. 6C illustrate timings of the end section, the intermediate section, and the lead section of the shift register 10, respectively. FIG. 6B illustrates timings of the unit circuit 11 at the i-th stage, which is classified as being in the first group.

As illustrated in FIG. 6A to FIG. 6C, the period of each of the gate clocks GCK1 to GCK4, the length of the high level period, and the length of the low level period are the same as those of the forward shift. The gate clocks GCK1 to GCK3 are delayed by the period 1H with respect to the gate clocks GCK2 to GCK4, respectively. The control signals CNT5 to CNT6 are always at the low level.

As illustrated in FIG. 6A, before the start of the reverse shift, the gate clocks GCK1 to GCK4 and the control signals CNT1 to CNT4 are all at the low level. At the start of the reverse shift, first, the control signal CNT4 is set to the high level only for the period 2H. The gate clocks GCK 1 to GCK4 are set to the high level only for the period 2H with a delay of the period 1H with respect to the gate clocks GCK2 to GCK4 and the control signal CNT4, respectively. After that, each of the gate clocks GCK1 to GCK4 is alternately set to the high level and the low level for the period 2H each time.

As illustrated in FIG. 6C, at the end of the reverse shift, first, the gate clock GCK4 is fixed to the low level. The gate clocks GCK1 to GCK3 are fixed to the low level with a delay of the period 1H with respect to the gate clocks GCK2 to GCK4, respectively. The control signal CNT3 is set to the high level only for the period 2H with a delay of the period 1H after the gate clock GCK1 changes to the high level a last time. The control signals CNT1 to CNT2 are set to the high level only for the period 2H with a delay of the period 1H with respect to the control signals CNT2 to CNT3, respectively.

With respect to the operation of the unit circuit 11 at the i-th stage in a period from before the time t10 to after the time t18 illustrated in FIG. 5B, in a period from before a time t20 to after a time t28 illustrated in FIG. 6B, the unit circuit 11 at the i-th stage performs an operation with the set signal SET1 switched with the set signal SET2, the reset signal RESET1 switched with the reset signal RESET2, the control signal netBp switched with the control signal netBq, and the TFTs: M1A, MBA, and M9A switched with TFTs: M1B, M8B, and M9B, respectively.

During the reverse shift, the set signal SET1 and the reset signal RESET1 do not affect the operation of the unit circuit 11. The potential of the node netA changes to the high level when the set signal SET2 changes to the high level, and changes to the low level when the reset signal RESET2 changes to the high level. The potential of the node netB and the output signal OUTi change in the same manner as in the forward shift.

The output signal OUTi is set to the high level only for the period 2H with a delay of the period 1H with respect to the set signal SET2. The set signal SET2 is the output signal OUTi+1 of the unit circuit 11 at the next stage. Therefore, during the reverse shift, the output signals OUT1 to OUTn are each set to the high level only for the period 2H in descending order, with a delay of the period 1H therebetween.

In the shift register 10, the control signal netBi−1 output from the unit circuit 11 at the preceding stage and the control signal netBi+1 output from the unit circuit 11 at the next stage are supplied to the unit circuits 11 at each stage. Since the unit circuit 11 at the first stage has no unit circuit at the preceding stage, instead of the control signal netBi−1, the gate clock GCK4 is supplied to the unit circuit 11 at the first stage. Since the unit circuit 11 at the n-th stage has no unit circuit at the next stage, instead of the control signal netBi+1, the gate clock GCK1 is supplied to the unit circuit 11 at the n-th stage.

In order for the shift register 10 to operate correctly, it is necessary for the gate clocks GCK1 to GCK4 to change as illustrated in FIG. 5A and FIG. 6A before the operation of the shift register 10, and change as illustrated in FIG. 5C and FIG. 6C after the operation of the shift register 10. For example, during the forward shift, the gate clocks GCK1 to GCK4 are all at the low level before the start of operation of the shift register 10, are set to the high level in ascending order following the control signal CNT3 when the operation of the shift register 10 is started, and are fixed to the low level in ascending order when the operation of the shift register 10 is stopped (see FIG. 5A and FIG. 5C).

Figure 7:
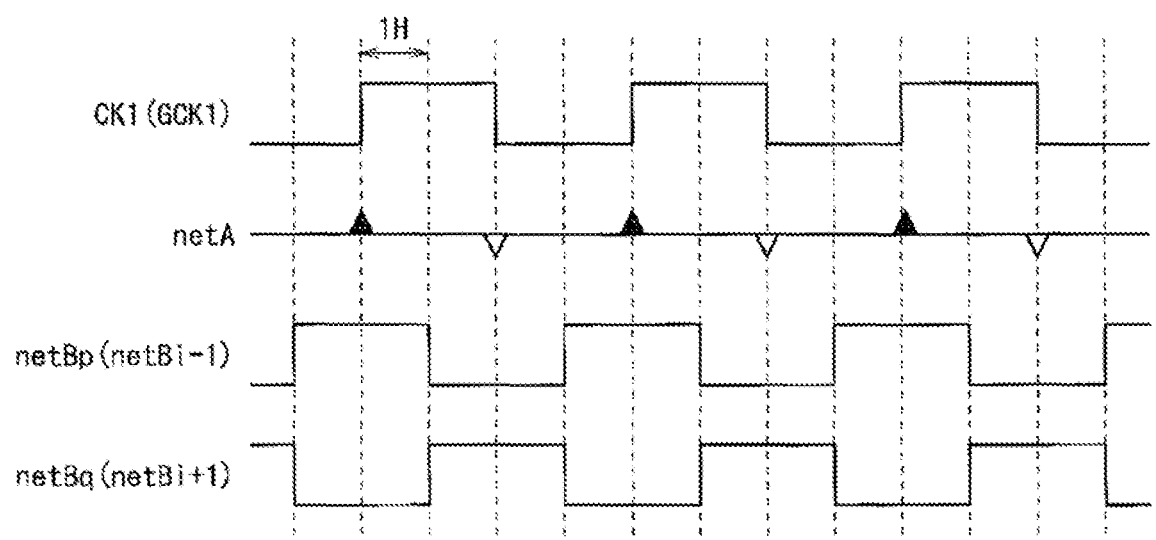
FIG. 7 is a diagram illustrating a part of FIG. 5B.
Figure 8:
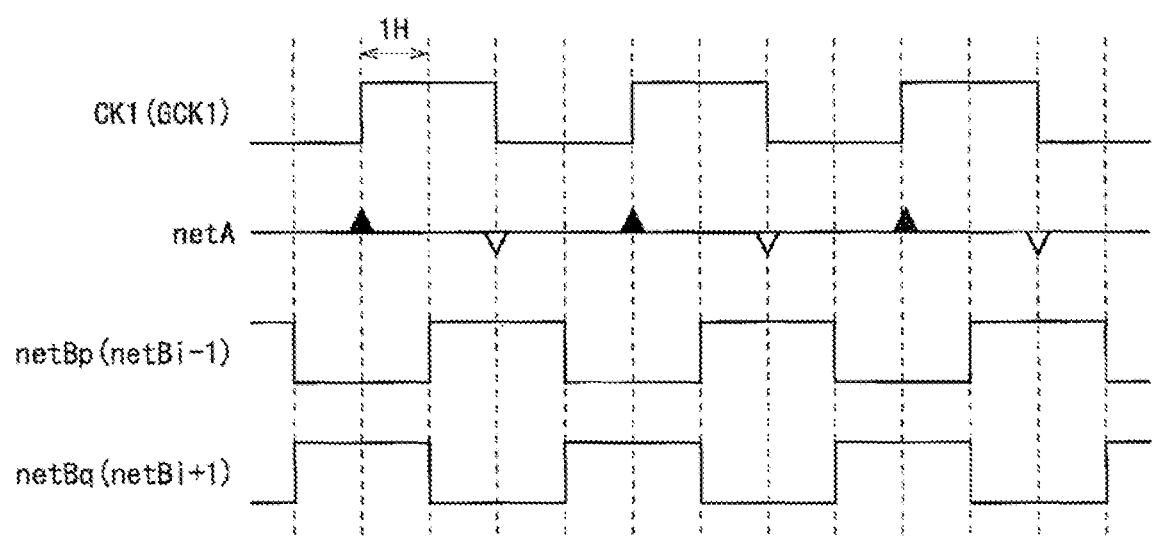
FIG. 8 is a diagram illustrating a part of FIG. 6B.

FIG. 7 is a diagram illustrating a part of FIG. 5B. FIG. 8 is a diagram illustrating a part of FIG. 6B. As illustrated in FIG. 7 and FIG. 8, the clock signal CK1 changes from the low level to the high level at a frequency of once during the 4H period, and changes from the high level to the low level at the same frequency. In the unit circuit 11, the clock signal CK1 is supplied to the drain terminal of the TFT: M10, and the gate terminal of the TFT: M10 is connected to the node netA. Thus, when the clock signal CK1 changes, the potential of the node netA changes slightly in the same direction due to an effect of parasitic capacitance (not illustrated) between the gate and drain of the TFT: M10. Hereinafter, this change will be referred to as "change due to noise", and a period in which the potential of the node netA is at the low level will be referred to as a non-select period.

When the clock signal CK1 changes to the low level, the potential of the node netA is reduced by the noise (see white triangles in FIG. 7 and FIG. 8). Even if the potential of the node netA is reduced by the noise, the shift register 10 operates correctly. When the clock signal CK1 changes to the high level, the potential of the node netA is increased by the noise (see black triangles in FIG. 7 and FIG. 8). When the potential of the node netA is increased by the noise, the TFT: M10 may be erroneously turned on, and the output signal OUTi may be erroneously set to the high level.

In order to prevent the malfunction described above, the unit circuit 11 includes the control signal generating circuit configured by the TFTs: M5 to M7, and the TFTs: M8A and M8B. In the non-select period during the forward shift, the control signal netBi−1 output from the unit circuit 11 at the preceding stage is ahead of the clock signal CK1 by the period 1H (see FIG. 7). Thus, before the clock signal CK1 changes to the high level, the control signal netBi−1 is controlled to be at the high level, and the TFT: M8A is in the on state. Therefore, the low level potential VGL is being applied to the node netA via the TFT: M8A at a timing when the clock signal CK1 changes to the high level.

In the non-select period during the reverse shift, the control signal netBi+1 output from the unit circuit 11 at the next stage is ahead of the clock signal CK1 by the period 1H (see FIG. 8). Thus, before the clock signal CK1 changes to the high level, the control signal netBi+1 is controlled to be at the high level, and the TFT: M8B is in the on state. Therefore, the low level potential VGL is being applied to the node netA via the TFT: M8B at the timing when the clock signal CK1 changes to the high level.

In the shift register 10, at the timing when the clock signal CK1 changes to the high level in the non-select period, one of the TFTs: M8A and M8B is in the on state, and the low level potential VGL is applied to the node netA. Therefore, according to the shift register 10, it is possible to prevent the potential of the node netA from fluctuating due to the noise when the clock signal CK1 changes to the high level.

Figure 27:
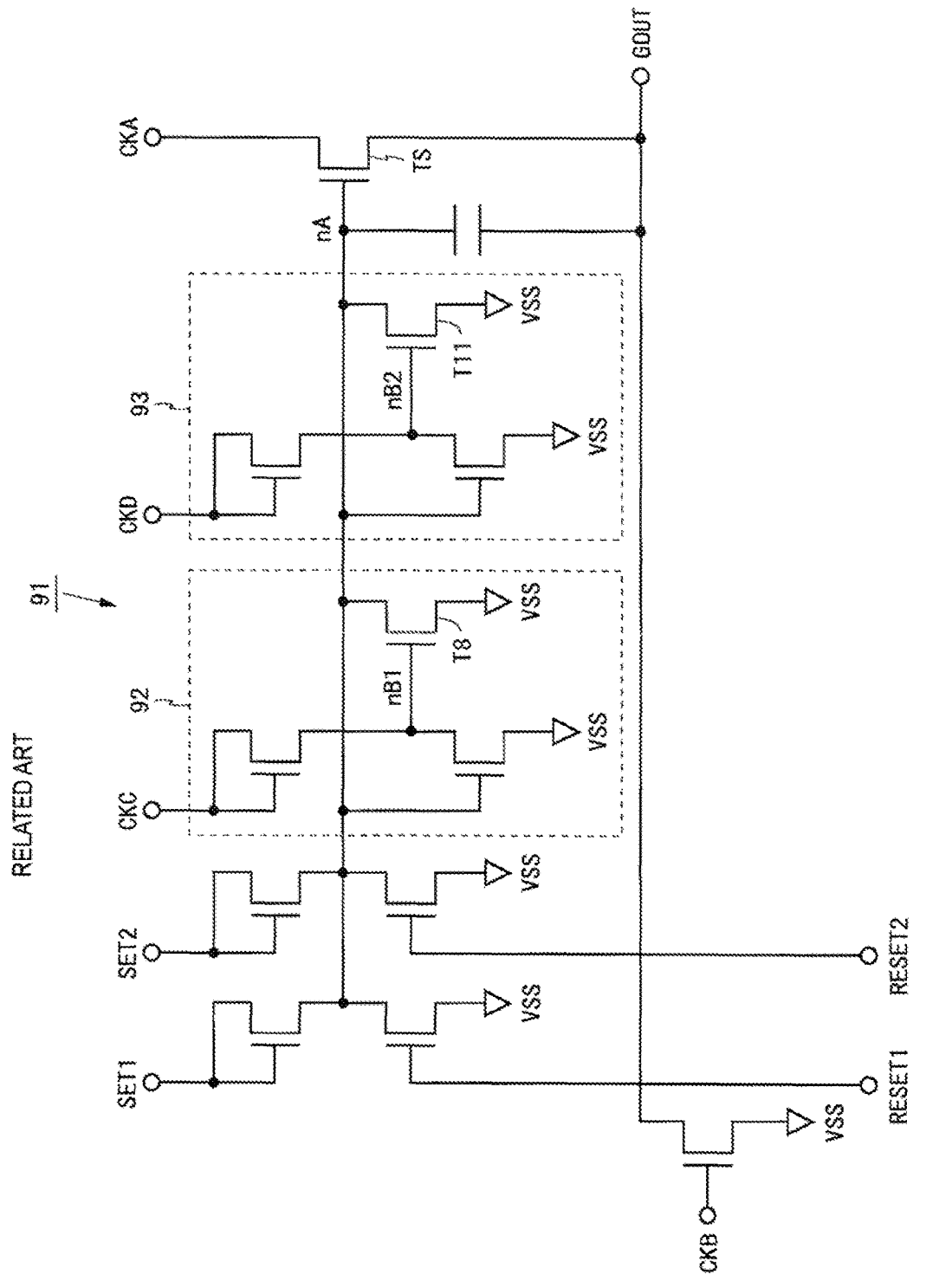
FIG. 27 is a circuit diagram of a unit circuit of a known shift register.
Figure 28:
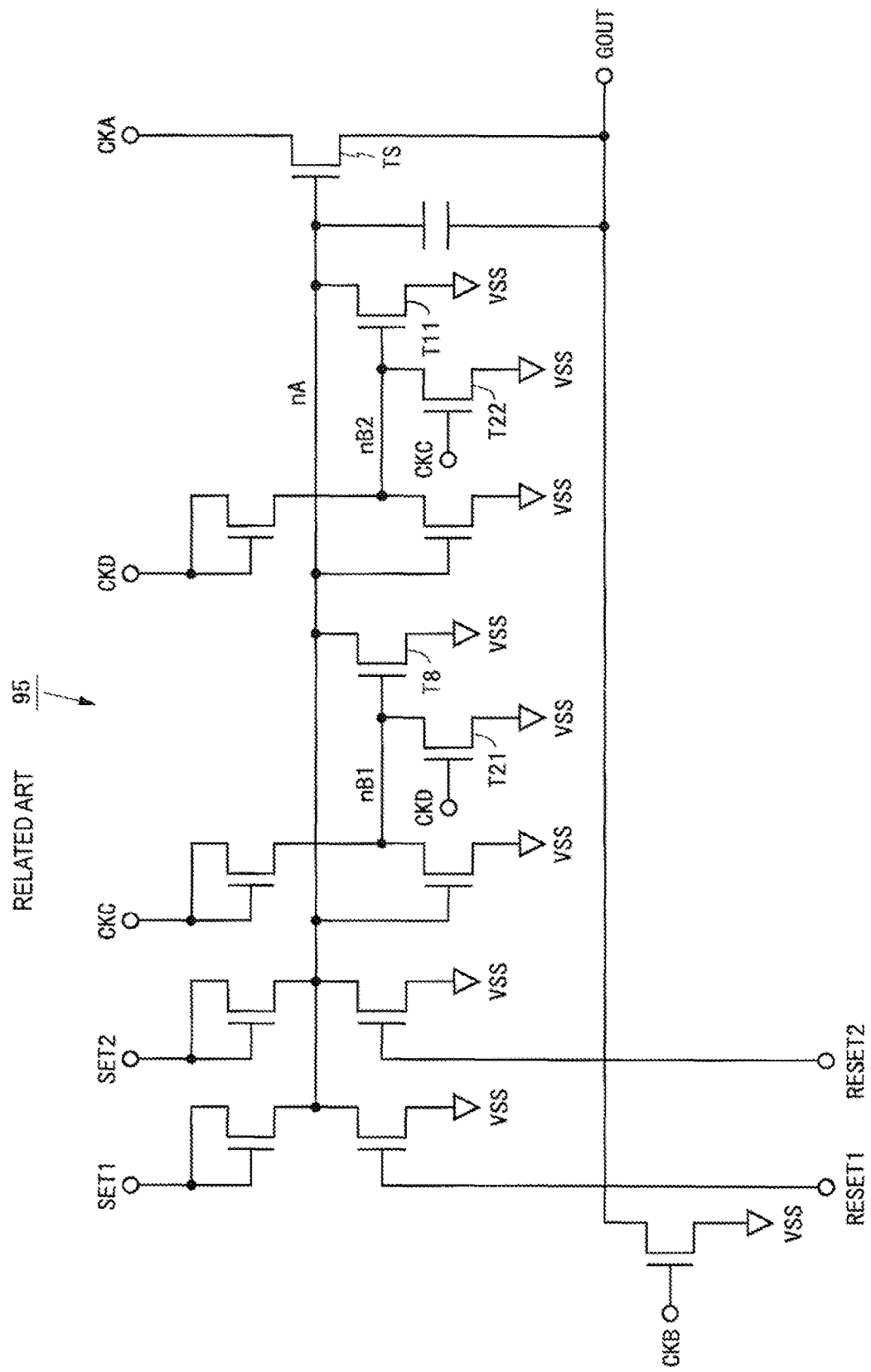
FIG. 28 is a circuit diagram of a unit circuit of the known shift register.

A circuit volume of the shift register 10 and a circuit volume of a known shift register will be compared below. A unit circuit 91 illustrated in FIG. 27 includes potential stabilizing circuits 92 and 93 to prevent fluctuations in the potential of a node nA (corresponding to the node netA in unit circuit 11). The number of TFTs in the potential stabilizing circuits 92 and 93 is six in total. In a unit circuit 95 illustrated in FIG. 28, TFTs: T21 and T22 are added to prevent fluctuations in threshold voltages of the TFTs: T8 and T11. The number of TFTs for preventing the fluctuations in the potential of the node nA is six in the unit circuit 91 and eight in the unit circuit 95.

In the unit circuit 11, the TFTs: M5, M6, M8A, and M8B are provided to prevent the fluctuations in the potential of the node netA. The TFT: M7 is provided to prevent fluctuations in threshold voltages of the TFT M8B in the unit circuit 11 at the preceding stage and of the TFT: M8A in the unit circuit 11 at the next stage. The number of TFTs for preventing the fluctuations in the potential of the node netA is five in the unit circuit 11.

The unit circuit 11 has a superior function to that of the unit circuit 91 and has the equivalent function to that of the unit circuit 95. Meanwhile, a circuit volume of the unit circuit 11 is smaller than a circuit volume of each of the unit circuits 91 and 95. Therefore, according to the shift register 10, the circuit volume thereof can be made smaller than that of a shift register including the unit circuit 95 and having the equivalent function to that of the shift register 10, and that of a shift register including the unit circuit 91 and not having some of the functions (a function of preventing fluctuations in the threshold voltage of the TFT) of the shift register 10.

As described above, the shift register 10 according to the present embodiment is a shift register that can shift in both directions and is provided with a plurality (n) of the unit circuits 11 connected at multiple stages. The unit circuit 11 includes the output transistor (TFT: M10), one of the conduction terminals (the drain terminal) of which is supplied with the first clock signal (the clock signal CK1), the other conduction terminal (the source terminal) of which is connected to the output terminal OUT of the output signal OUTi, and the control terminal (the gate terminal) of which is connected to the first node (the node netA), the first set transistor (the TFT: M1A) that applies the on level potential (the high-level potential) to the first node based on the first set signal (the set signal SET1), the first reset transistor (the TFT: M9A) that applies the off level potential (the low level potential) to the first node based on the first reset signal (the reset signal RESET1), the second set transistor (the TFT: M1B) that applies the on level potential to the first node based on the second set signal (the set signal SET2), the second reset transistor (the TFT: M9B) that applies the off level potential to the first node based on the second reset signal (the reset signal RESET2), the control signal generating circuit (the TFTs: M5 to M7) that generates the control signal netBi that changes to the on level when the first clock signal changes to the on level (the high level) while the potential of the first node is at the off level (the low level), and that outputs the generated control signal netBi to the unit circuits 11 at the preceding stage and the next stage, the first potential stabilizing transistor (the TFT: M8A) that applies the off level potential to the first node based on the control signal netBi−1 output from the unit circuit 11 at the preceding stage, and the second potential stabilizing transistor (the TFT: M8B) that applies the off level potential to the first node based on the control signal netBi+1 output from the unit circuit 11 at the next stage.

According to the shift register 10 configured in this way, a bidirectional shift can be performed using two types of set signals and two types of reset signals. Further, at a timing when the first clock signal changes to the on level, one of the first and second potential stabilizing transistors is in the on state, and the off level is applied to the first node. Therefore, it is possible to prevent the potential of the first node from fluctuating when the first clock signal changes to the on level. Further, by outputting the control signal netBi generated by the control signal generating circuit in the unit circuit 11 to the unit circuits 11 at the preceding stage and the next stage, the circuit volume can be reduced compared to a case where the circuits for preventing the fluctuations in the potential of the first node are provided in the unit circuit for each shift direction. Therefore, it is possible to provide the shift register 10, with a small circuit volume, that is capable of shifting in both directions and preventing the fluctuations in the potential of the first node connected to the control terminal of the output transistor in the unit circuit 11.

The control signal generating circuit includes the second node (the node netB) connected to the output terminal netBo of the control signal netBi, the first transistor (the TFT: M5) that applies the on-level potential to the second node based on the first clock signal, the second transistor (the TFT: M6) that applies the off-level potential to the second node based on the potential of the first node, and the third transistor (the TFT: M7) that applies the off-level potential to the second node based on the second clock signal (the clock signal CK2) that differs in phase from the first clock signal by a half period. By using the first and second transistors configured in this way, the control signal generating circuit can be configured that generates the control signal netBi that changes to the on level when the first clock signal changes to the on level while the potential of the first node is at the off level. By providing the third transistor in the control signal generating circuit, the control signal netBi is periodically controlled to be at the off level, and it is possible to prevent fluctuations in threshold voltages of the first and second potential stabilizing transistors, and prevent the fluctuations in the potential of the first node more effectively.

Instead of the control signal netBi−1 output from the unit circuit 11 at the preceding stage, one clock signal (the gate clock GCK4) among multi-phase clock signals (the gate clocks GCK1 to GCK4) is supplied to the first potential stabilizing transistor in a unit circuit at the initial stage (the unit circuit 11 at the first stage), and, instead of the control signal netBi+1 output from the unit circuit 11 at the next stage, another clock signal (the gate clock GCK1) among the multi-phase clock signals is supplied to the second potential stabilizing transistor in a unit circuit at the final stage (the unit circuit 11 at the n-th stage). By supplying the clock signals among the multi-phase clock signals to the unit circuits at the initial stage and the final stage in this manner, it is possible to operate the shift register 10 without providing circuits for outputting the control signals to the unit circuits at the initial stage and the final stage, at the front and rear of the shift register 10.

One clock signal among the four-phase clock signals (the gate clocks GCK1 to GCK4) is supplied to the unit circuit 11 as the first clock signal, the first set signal is the output signal OUTi−1 of the unit circuit 11 at the preceding stage, the first reset signal is the output signal OUTi+3 of the unit circuit 11 at the stage three stages after the current stage, the second set signal is the output signal OUTi+1 of the unit circuit 11 at the next stage, and the second reset signal is the output signal OUTi−3 of the unit circuit 11 at the stage three stages before the current stage. Therefore, the shift register 10 can be provided that has the above-described effects and operates based on the four-phase clock signals.

Figure 9:
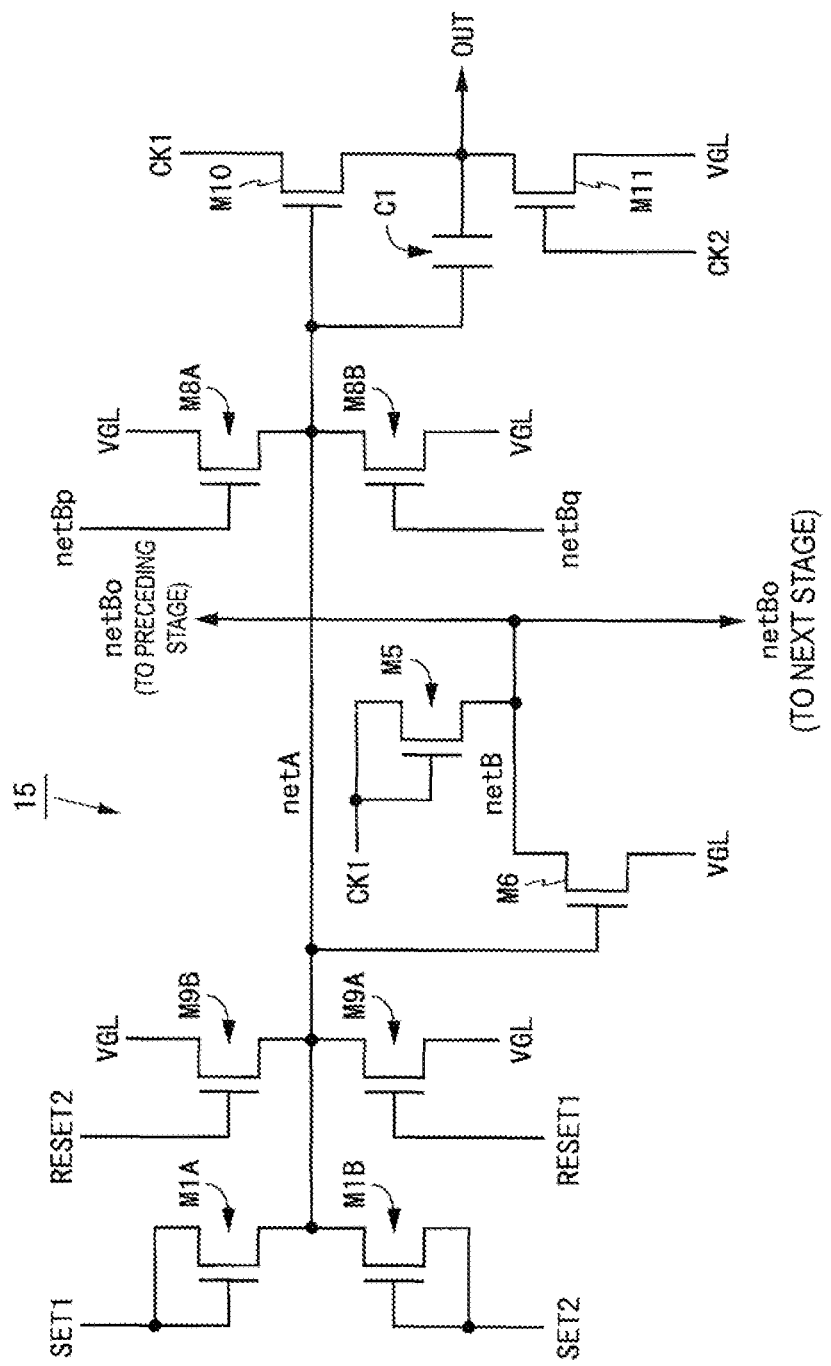
FIG. 9 is a circuit diagram illustrating a configuration of a unit circuit of a shift register according to a modified example of the first embodiment.

With respect to the shift register 10 according to the present embodiment, the following modified example can be configured. FIG. 9 is a circuit diagram illustrating a unit circuit of a shift register according to the modified example. A unit circuit 15 illustrated in FIG. 9 is obtained by removing the TFT: M7 from the unit circuit 11. The shift register according to the modified example is used when there is no need to consider fluctuations in the threshold voltages of the TFTs: M8A and M8B. The number of TFTs for preventing the fluctuations in the potential of the node netA is four in the unit circuit 15. The unit circuit 15 has the equivalent function to that of the unit circuit 91. Meanwhile, a circuit volume of the unit circuit 15 is smaller than the circuit volume of the unit circuit 91. Thus, according to the shift register of the modified example, the circuit volume can be made smaller than that of a shift register including the unit circuit 91 while having the equivalent function.

Second Embodiment

Figure 10:
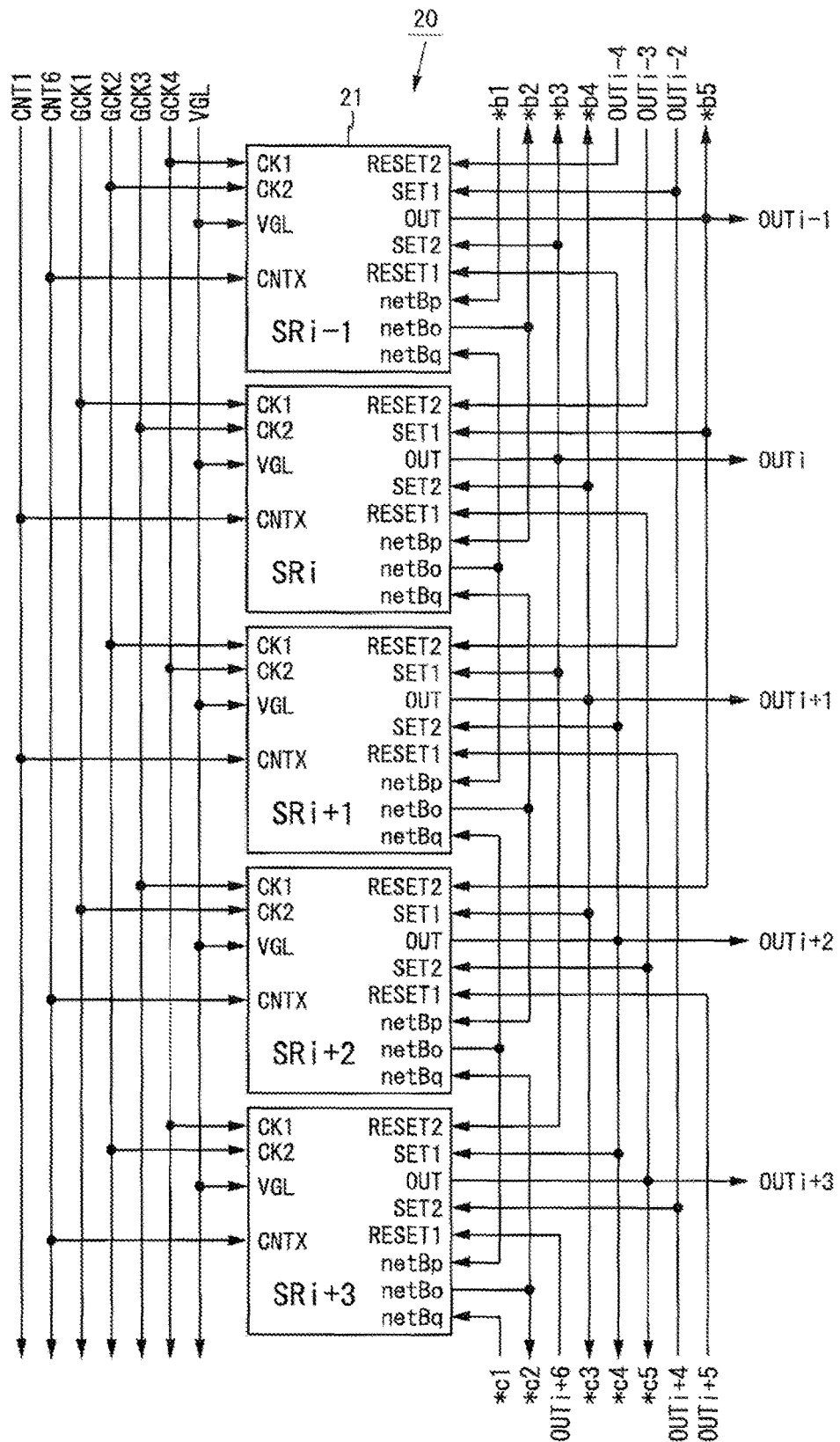
FIG. 10 is a block diagram illustrating a configuration of an intermediate section of a shift register according to a second embodiment.

FIG. 10 is a block diagram illustrating a configuration of an intermediate section of a shift register according to a second embodiment. A shift register 20 according to the present embodiment includes n unit circuits 21 connected at multiple stages. A lead section and an end section of the shift register 20 are omitted from the drawing. In each of embodiments to be described below, differences from the first embodiment will be described.

As illustrated in FIG. 10, the unit circuit 21 includes a control terminal CNTX in addition to the terminals of the unit circuit 11 according to the first embodiment. The control signal CNT1 is supplied to the control terminals CNTX of the unit circuits 21 in the first and second groups. The control signal CNT6 is supplied to the control terminals CNTX of the unit circuits 21 in the third and fourth groups.

Figure 11:
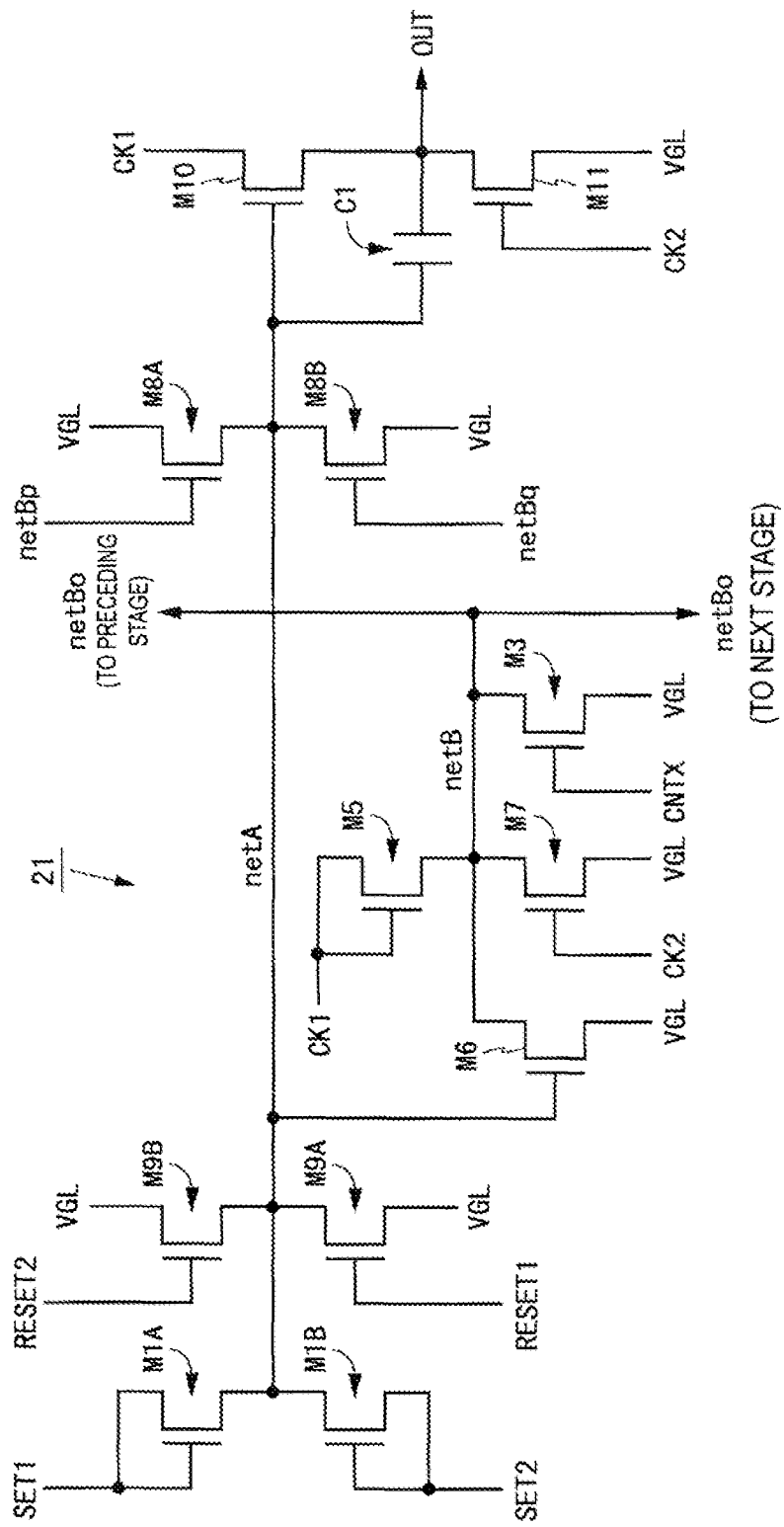
FIG. 11 is a circuit diagram illustrating a configuration of a unit circuit of the shift register according to the second embodiment.

FIG. 11 is a circuit diagram of the unit circuit 21. As illustrated in FIG. 11, the unit circuit 21 is obtained by adding a TFT: M3 to the unit circuit 11. The TFT: M3 is an re-channel TFT. A drain terminal of the TFT: M3 is connected to the node netB. A gate terminal of the TFT: M3 is connected to the control terminal CNTX. The low level potential VGL is applied to a source terminal of the TFT: M3. The number of TFTs for preventing the fluctuations in the potential of the node netA is six in the unit circuit 21.

According to the shift register 20, in the same manner as with the shift register 10 according to the first embodiment, it is possible to prevent the potential of the node netA from fluctuating due to the noise when the clock signal CK1 changes to the high level. Further, with the shift register 20, the circuit volume can be made smaller than that of a known shift register including the unit circuit 95 and having the equivalent function.

Figure 12:
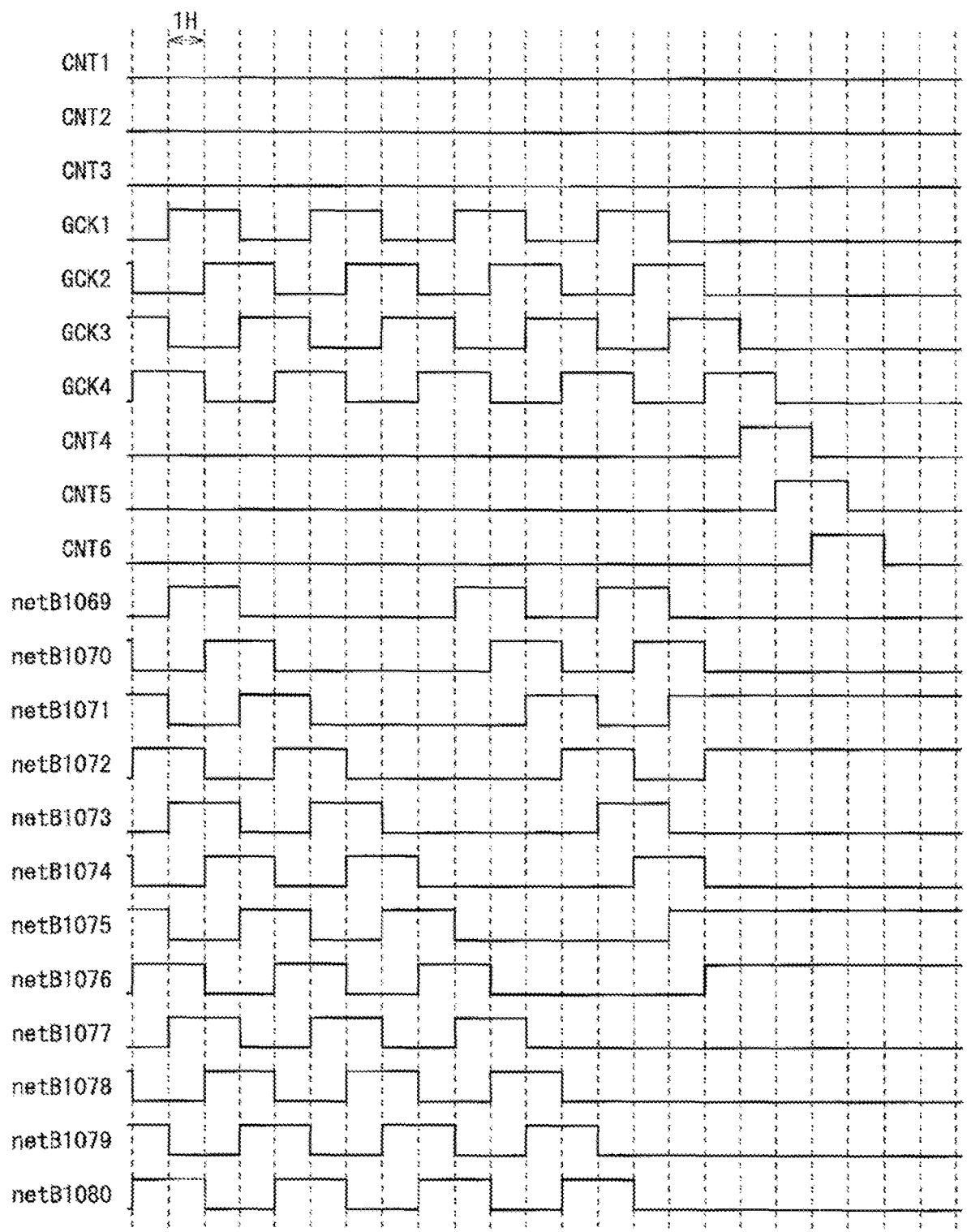
FIG. 12 is a timing chart during the forward shift of the end section of the shift register according to the first embodiment.
Figure 13:
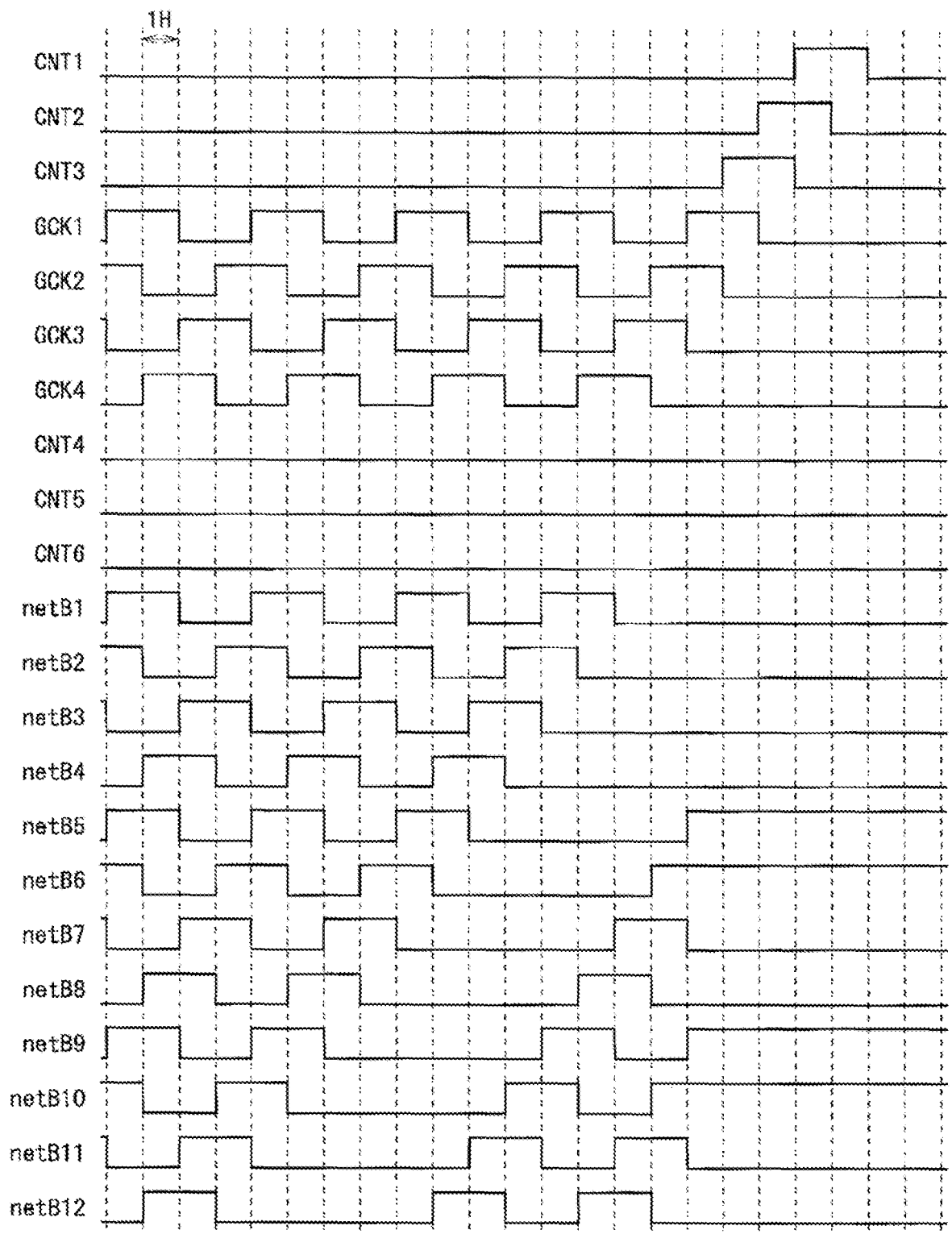
FIG. 13 is a timing chart during the reverse shift of the lead section of the shift register according to the first embodiment.
Figure 14:
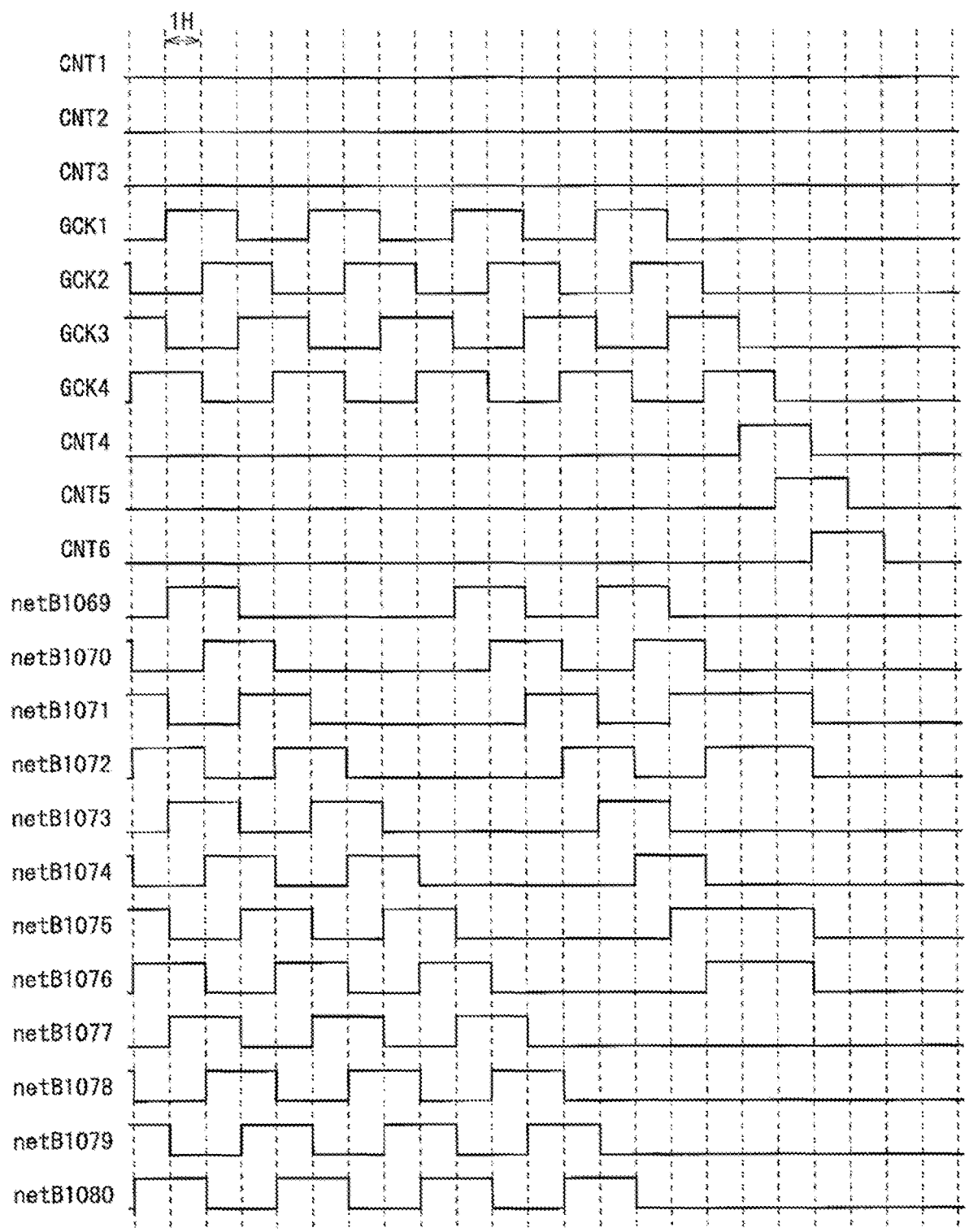
FIG. 14 is a timing chart during the forward shift of an end section of the shift register according to the second embodiment.
Figure 15:
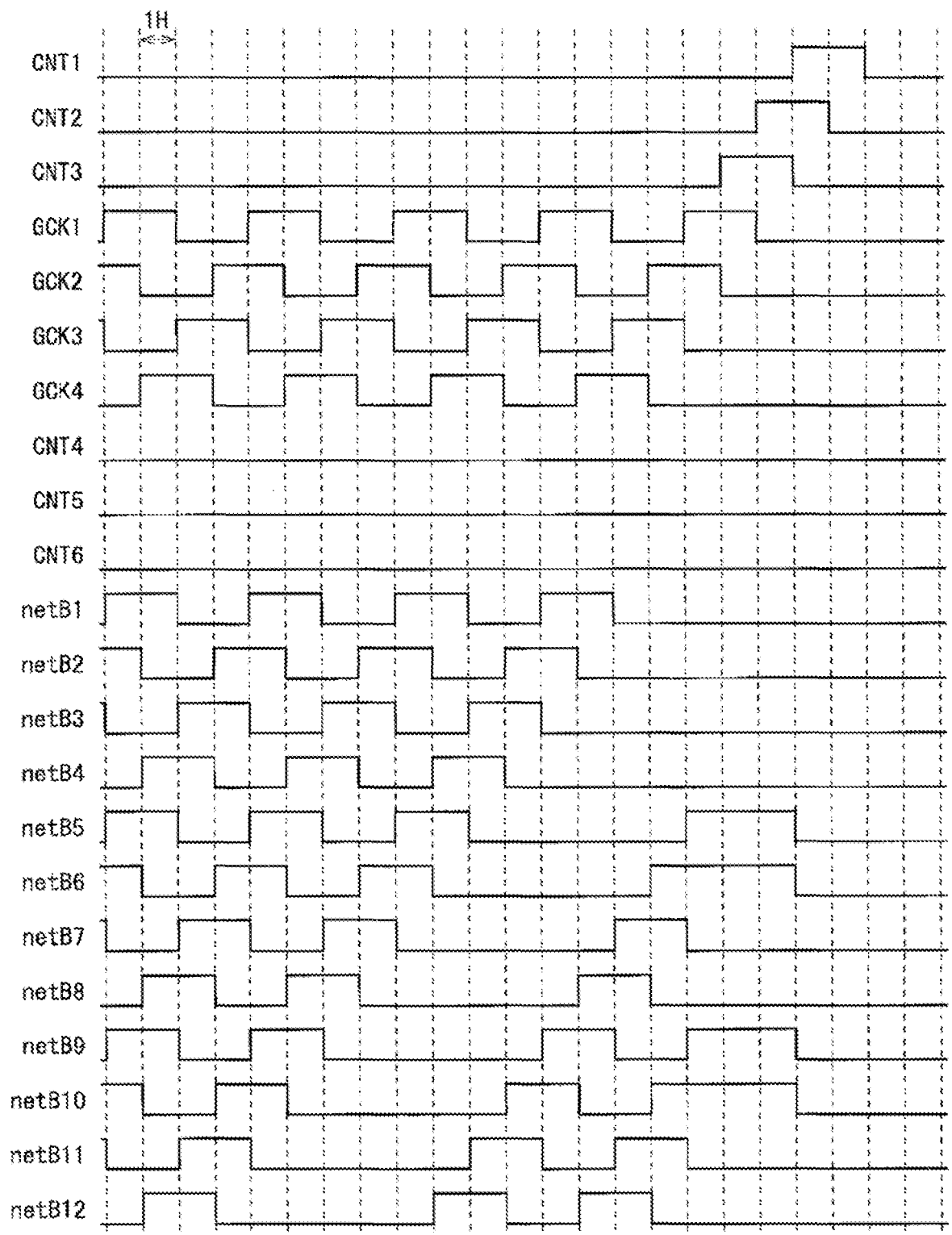
FIG. 15 is a timing chart during the reverse shift of a lead section of the shift register according to the second embodiment.

An effect of the shift register 20 will be described below in comparison to the shift register 10 according to the first embodiment. FIG. 12 is a timing chart during the forward shift of the end section of the shift register 10. FIG. 13 is a timing chart during the reverse shift of the lead section of the shift register 10. FIG. 14 is a timing chart during the forward shift of the end section of the shift register 20. FIG. 15 is a timing chart during the reverse shift of the lead section of the shift register 20. Changes in the gate clocks GCK1 to GCK4 and the control signals CNT1 to CNT6 illustrated in FIG. 12 and FIG. 14 are the same as those illustrated in FIG. 5C. Changes in the gate clock GCK1 to GCK4 and the control signal CNT1 to CNT6 illustrated in FIG. 13 and FIG. 15 are the same as those illustrated in FIG. 6C.

The TFT in the shift register is formed using, for example, amorphous silicon or an oxide semiconductor such as indium gallium zinc oxide (IGZO). The TFT that is formed using those materials has characteristics in that the threshold voltage thereof fluctuates to the plus side, when a high level potential is continuously applied to the gate terminal thereof. Hereinafter, a period from an end of a shift to a start of the next shift will be referred to as a shift pause period.

In the shift register 10, after the gate clock GCK3 changes to the high level a last time at the end of the forward shift, the gate clock GCK1 is not set to the high level (see FIG. 12). Thus, the control signals netBi (control signals netB1071 and netB1075 in FIG. 12) output from the unit circuits 11 in the third group, excluding the unit circuit 11 at the 1079th stage, remain at the high level during the shift pause period. For the same reason, the control signals netBi (control signals netB1072 and netB1076 in FIG. 12) output from the unit circuits 11 in the fourth group, excluding the unit circuit 11 at the 1080th stage, remain at the high level during the shift pause period.

In the shift register 10, the same state is also obtained at the end of the reverse shift. The control signals netBi (control signals netB5 and netB9 in FIG. 13) output from the unit circuits 11 in the first group, excluding the unit circuit 11 at the first stage, and the control signals netBi (control signals netB6 and netB10 in FIG. 13) output from the unit circuits 11 in the second group, excluding the unit circuit 11 at the second stage, remain at the high level during the shift pause period.

In the shift register 10, during the shift pause period, approximately half of the control signals netB1 to netBn remain at the high level, and a high level potential is applied to the gate terminals of approximately half of the TFTs: M8A and M8B (2n in total) in the shift register 10. When the shift pause period is short enough with respect to a vertical period, there is no problem even with this configuration. However, when the shift pause period is not short enough with respect to the vertical period, the threshold voltages of the TFTs: M8A and M8B fluctuate, and the shift register 10 may malfunction after operating for a long period of time.

In order to solve this problem, the unit circuit 21 of the shift register 20 includes the TFT: M3. The gate terminal of the TFT: M3 is connected to the control terminal CNTX, and the control signal CNT1 or CNT6 is supplied to the control terminal CNTX. In the shift register 20, after the gate clocks GCK1 to GCK4 have stopped at the end of the forward shift, the control signal CNT6 is set to the high level for a predetermined period of time (see FIG. 14). Thus, in each of the unit circuits 21 in the third and fourth groups, the TFT: M3 is turned on and the potential of the node netB is set to the low level. Therefore, the control signals netBi (control signals netB1071, netB1072, netB1075, and netB1076 in FIG. 14) output from the unit circuits 21 in the third and fourth groups are set to the low level until the next shift starts after the control signal CNT6 changes to the high level.

Further, in the shift register 20, after the gate clocks GCK1 to GCK4 have stopped at the end of the reverse shift, the control signal CNT1 is set to the high level for a predetermined period of time (see FIG. 15). Thus, in each of the unit circuits 21 in the first and second groups, the TFT: M3 is turned on and the potential of the node netB is set to the low level. Therefore, the control signals netBi (control signals netB5, netB6, netB9, and netB10 in FIG. 15) output from the unit circuits 21 in the first and second groups are set to the low level until the next shift starts after the control signal CNT1 changes to the high level.

Therefore, according to the shift register 20, in addition to the effects of the shift register 10 according to the first embodiment, by controlling the control signal netBi to be at the low level using the TFT: M3 after the end of the shift, and applying the low level potential VGL to the gate terminal of the TFT: M8B in the unit circuit 21 at the preceding stage and the gate terminal of the TFT: M8A in the unit circuit 21 at the next stage, it is possible to prevent the fluctuations in the threshold voltages of the TFTs: M8A and M8B and prevent the fluctuations in the potential of the node netA more effectively.

As described above, a control signal generating circuit of the shift register 20 according to the present embodiment further includes a fourth transistor (the TFT: M3) that applies the off level potential (the low level potential) to the second node (the node netB) based on the second control signal (the control signal CNTX) that is set to the on level after the first clock signal (the clock signal CK1) stops.

According to the shift register 20 configured in this way, by controlling the control signal netBi to be at the off level (the low level) using the fourth transistor after the end of the shift, and applying the off level potential to the control terminal (the gate terminal) of the second potential stabilizing transistor (the TFT: M8B) in the unit circuit 21 at the preceding stage and to the control terminal (the gate terminal) of the first potential stabilizing transistor (the TFT: M8A) in the unit circuit 21 at the next stage, it is possible to prevent the fluctuations in the threshold voltages of the first and second potential stabilizing transistors and prevent the fluctuations in the potential of the first node (the node netA) more effectively.

Figure 16:
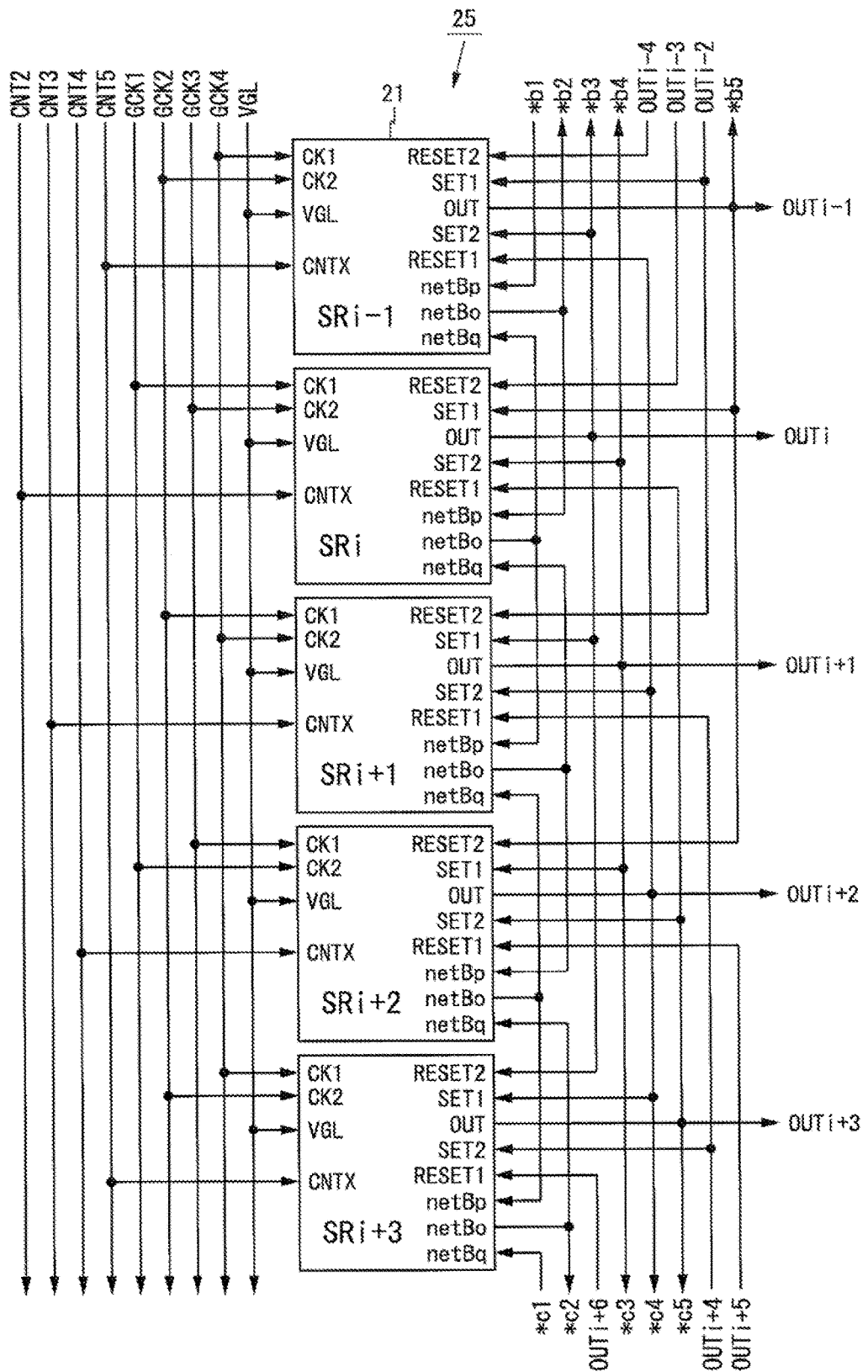
FIG. 16 is a block diagram illustrating a configuration of an intermediate section of a shift register according to a modified example of the second embodiment.

With respect to the shift register 20 according to the present embodiment, the following modified example can be configured. FIG. 16 is a block diagram illustrating a configuration of an intermediate section of a shift register according to the modified example. A shift register 25 according to the modified example is provided with the n unit circuits 21 connected at multiple stages. A lead section and an end section of the shift register 25 are omitted from the drawing.

In the shift register 25, the control signal CNT2 is supplied to the control terminal CNTX of the unit circuit 21 in the first group. The control signal CNT3 is supplied to the control terminal CNTX of the unit circuit 21 in the second group. The control signal CNT4 is supplied to the control terminal CNTX of the unit circuit 21 in the third group. The control signal CNT5 is supplied to the control terminal CNTX of the unit circuit 21 in the fourth group.

Figure 17:
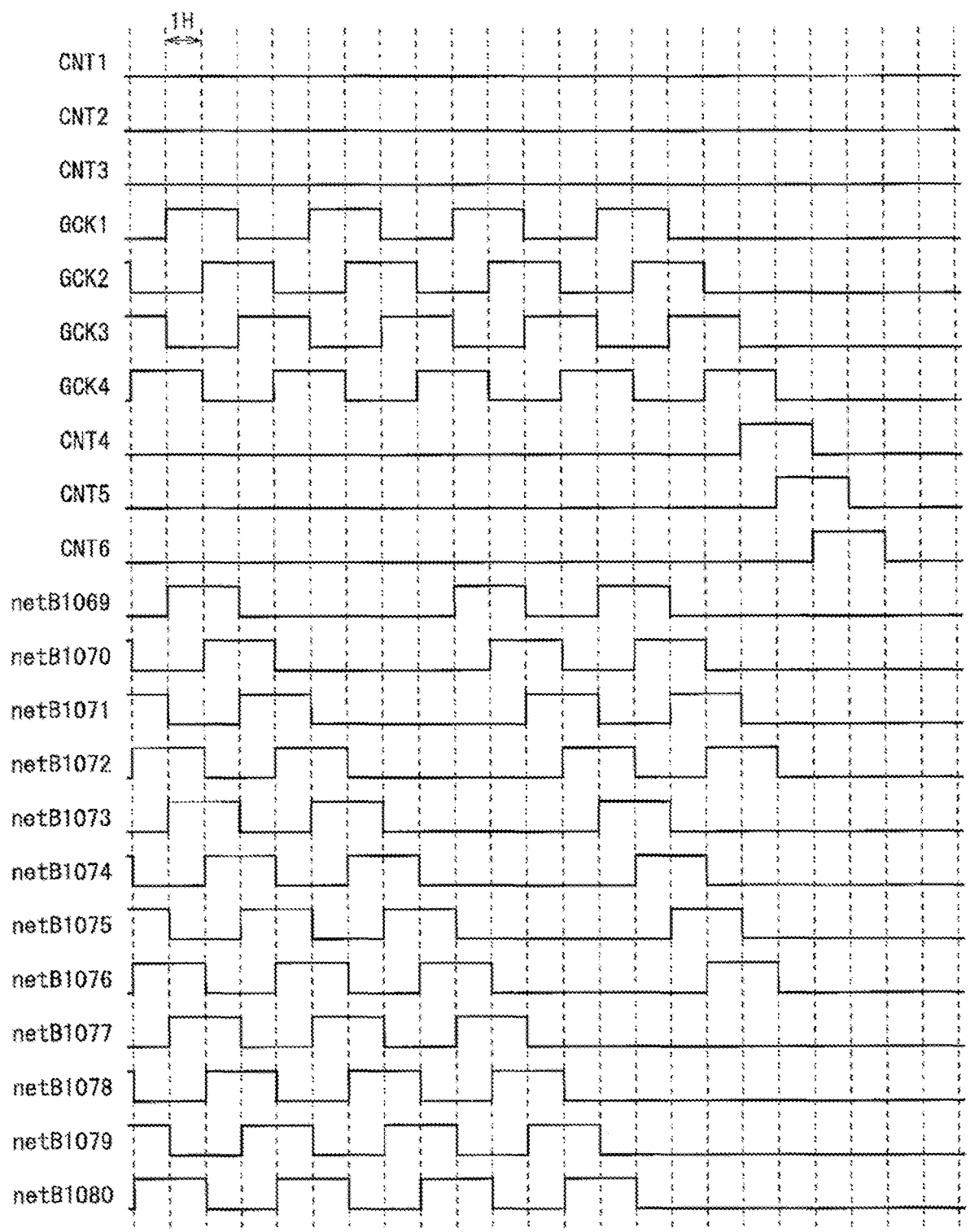
FIG. 17 is a timing chart during the forward shift of an end section of the shift register according to the modified example of the second embodiment.
Figure 18:
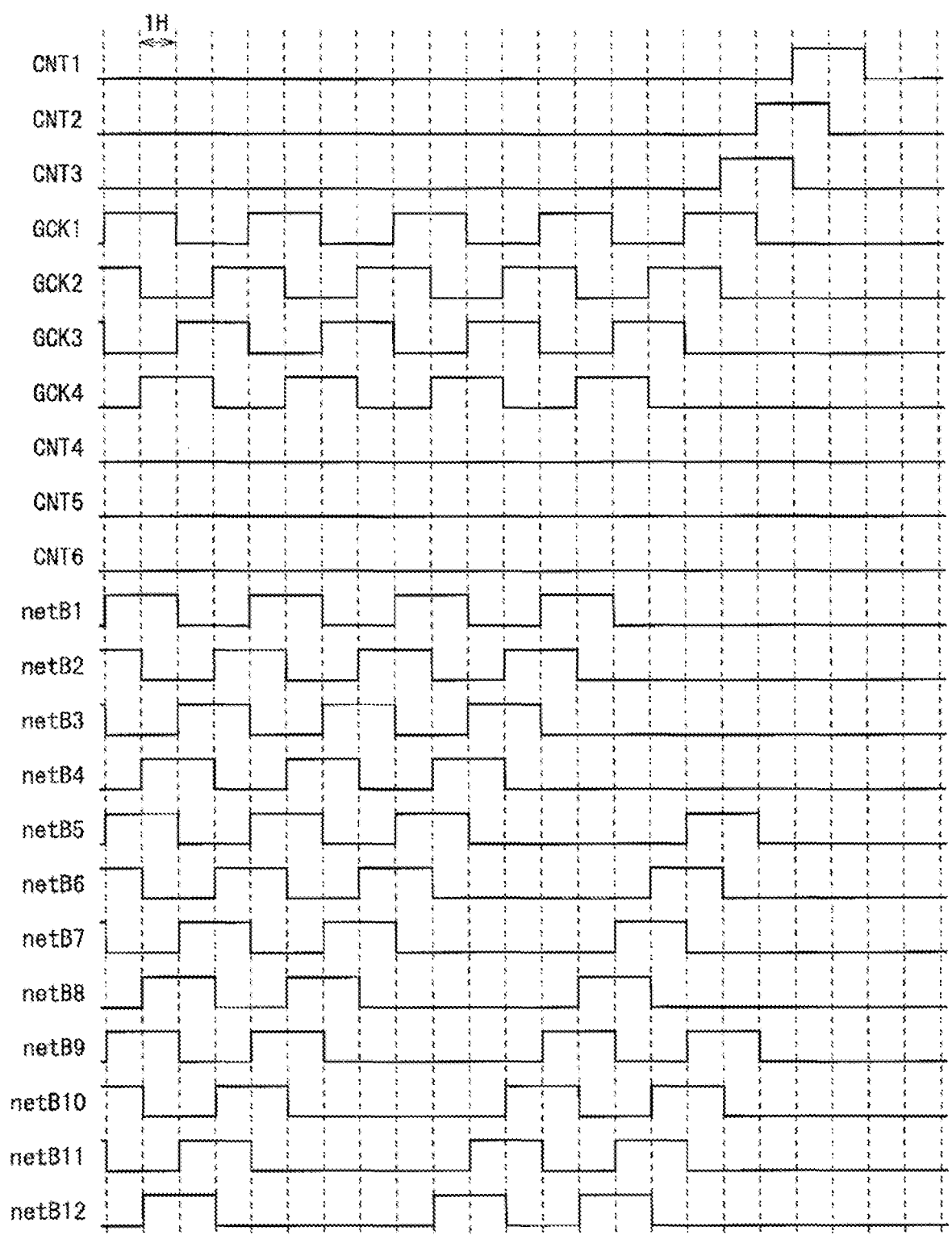
FIG. 18 is a timing chart during the reverse shift of a lead section of the shift register according to the modified example of the second embodiment.

FIG. 17 is a timing chart during the forward shift of the end section of the shift register 25. FIG. 18 is a timing chart during the reverse shift of the lead section of the shift register 25. Changes in the gate clocks GCK1 to GCK4 and the control signals CNT1 to CNT6 illustrated in FIG. 17 are the same as those illustrated in FIG. 5C. Changes in the gate clock GCK1 to GCK4 and the control signal CNT1 to CNT6 illustrated in FIG. 18 are the same as those illustrated in FIG. 6C.

In the shift register 25, after the gate clocks GCK1 to GCK4 have stopped at the end of the forward shift, the control signal CNT4 and CTN 5 are sequentially set to the high level for a predetermined period of time (see FIG. 17). Therefore, the control signals netBi output from the unit circuits 21 in the third group (the control signals netB1071 and netB1075 in FIG. 17) are set to the low level until the next shift starts after the control signal CNT4 changes to the high level. The control signals netBi output from the unit circuits 21 in the fourth group (the control signals netB1072 and netB1076 in FIG. 17) are set to the low level until the next shift starts after the control signal CNT5 changes to the high level.

Further, in the shift register 25, after the gate clocks GCK1 to GCK4 have stopped at the end of the reverse shift, the control signal CNT3 and CTN2 are sequentially set to the high level for a predetermined period of time (see FIG. 18). Therefore, the control signals netBi output from the unit circuits 21 in the second group (the control signals netB6 and netB10 in FIG. 18) are set to the low level until the next shift starts after the control signal CNT3 changes to the high level. The control signals netBi output from the unit circuits 21 in the first group (the control signals netB5 and netB9 in FIG. 18) are set to the low level until the next shift starts after the control signal CNT2 changes to the high level.

In the shift register 20, at the end of the shift, the high level period of the control signal netB may be a period 3H or the period 4H. In the shift register 25, by supplying one of the control signals CNT2 to CNT5 to each of the control terminals CNTX of the unit circuits 21, lengths of the high level period of the control signal netBi can be all be caused to be the period 2H.

Third Embodiment

Figure 19A:
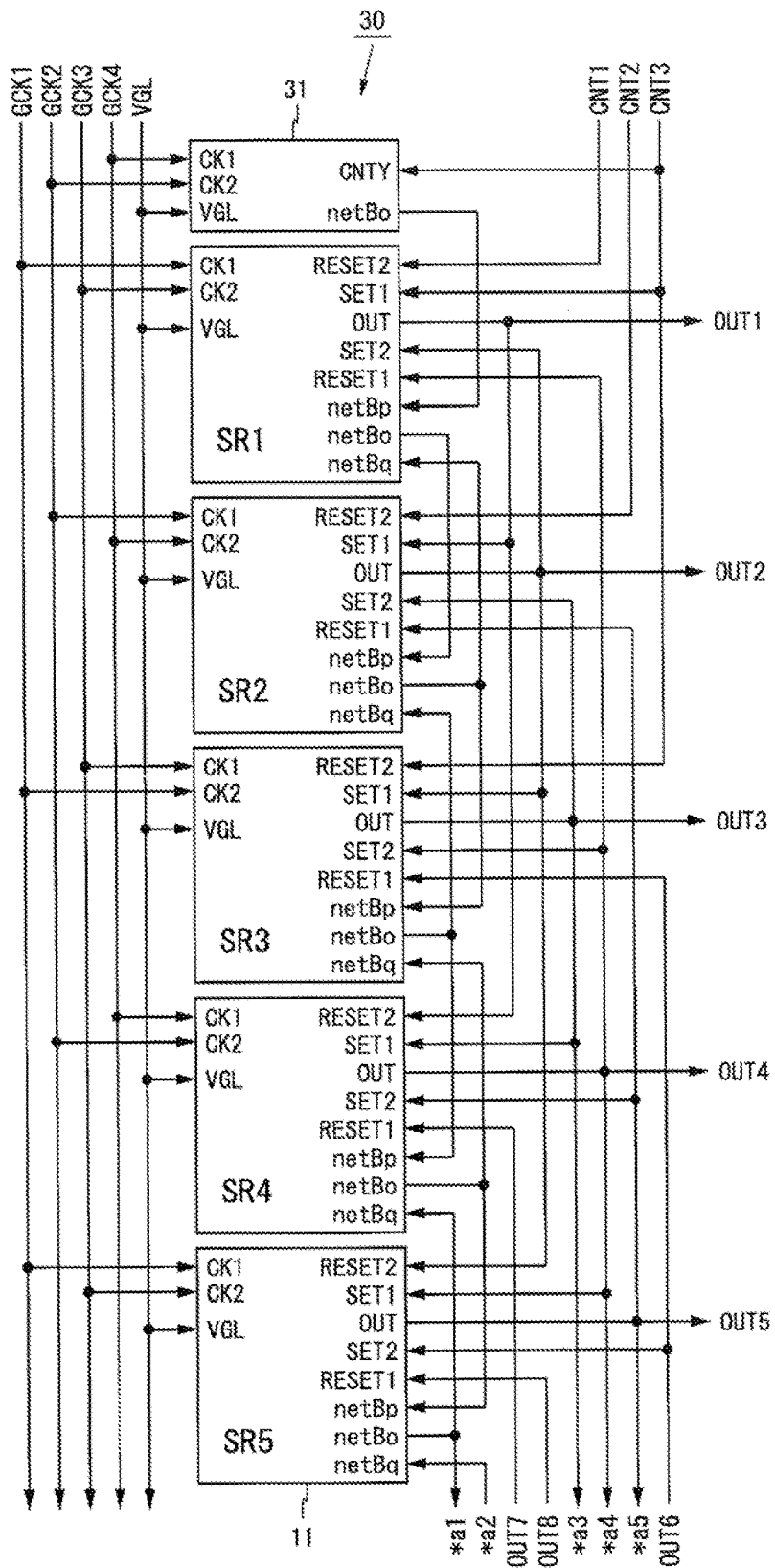
FIG. 19A is a block diagram illustrating a configuration of a lead section of a shift register according to a third embodiment.
Figure 19B:
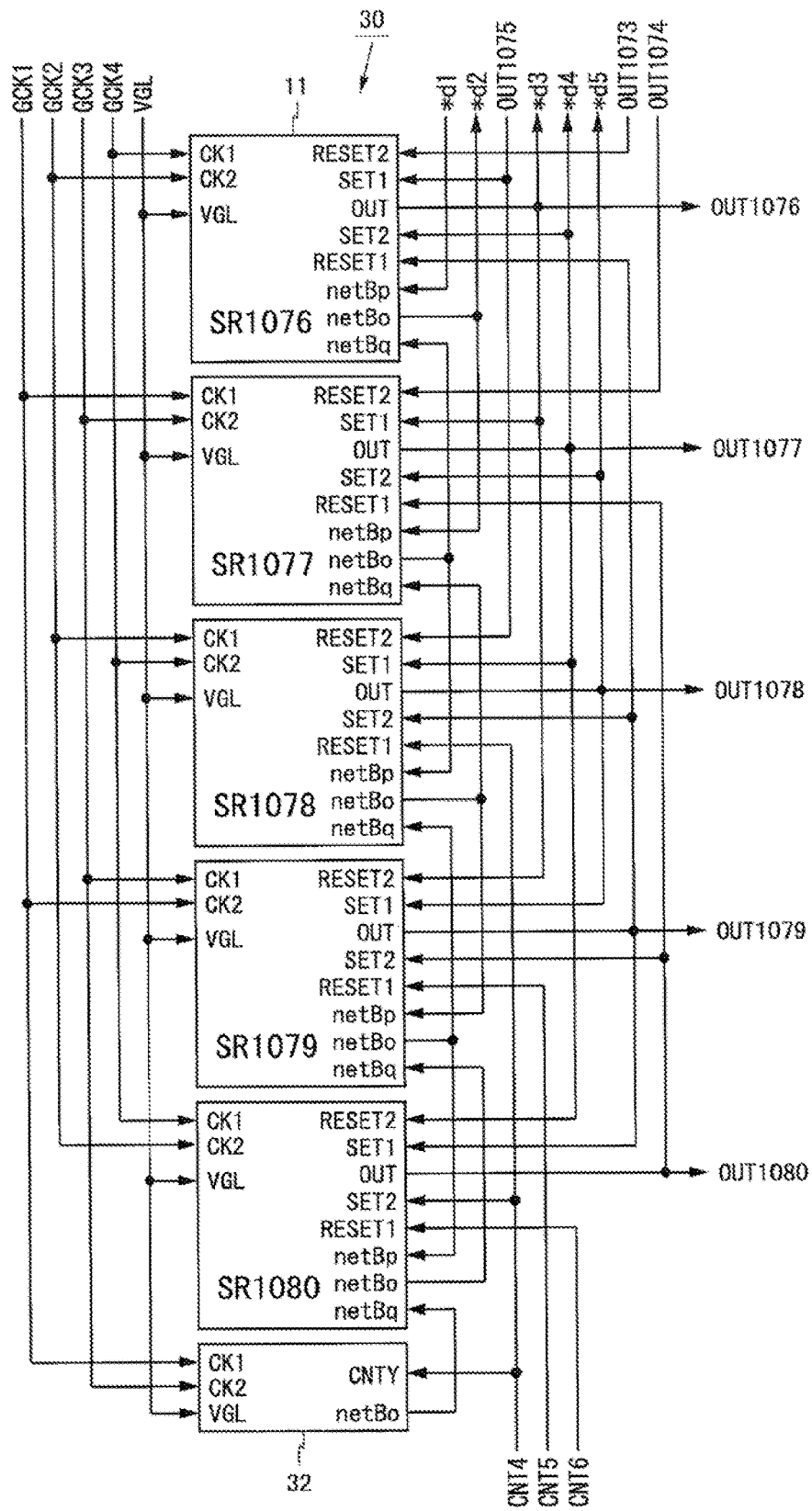
FIG. 19B is a block diagram illustrating a configuration of an end section of the shift register according to the third embodiment.

FIG. 19A and FIG. 19B are block diagrams illustrating a configuration of a shift register according to a third embodiment. A shift register 30 according to the present embodiment includes the n unit circuits 11 connected at multiple stages, an initial stage control signal generating circuit 31, and a final stage control signal generating circuit 32. The initial stage control signal generating circuit 31 is provided before the unit circuit 11 at the first stage. The final stage control signal generating circuit 32 is provided after the unit circuit 11 at the n-th stage. FIG. 19A and FIG. 19B illustrate configurations of a lead section and an end section of the shift register 30, respectively. A configuration of an intermediate section of the shift register 30 is the same as that illustrated in FIG. 1B.

As illustrated in FIG. 19A and FIG. 19B, the initial stage control signal generating circuit 31 and the final stage control signal generating circuit 32 each have the clock terminals CK1 and CK2, a control terminal CNTY, the output terminal netBo, and the power supply terminal VGL. The low level potential VGL is supplied to the power supply terminals VGL of the initial stage control signal generating circuit 31 and the final stage control signal generating circuit 32. The gate clocks GCK4 and GCK2 are supplied to the clock terminals CK1 and CK2 of the initial stage control signal generating circuit 31, respectively. The gate clocks GCK1 and GCK3 are supplied to the clock terminals CK1 and CK2 of the final stage control signal generating circuit 32, respectively. The control signal CNT3 is supplied to the control terminal CNTY of the initial stage control signal generating circuit 31. The control signal CNT4 is supplied to the control terminal CNTY of the final stage control signal generating circuit 32. Hereinafter, a signal output from the output terminal netBo of the initial stage control signal generating circuit 31 will be referred to as an initial stage control signal netB0, and a signal output from the output terminal netBo of the final stage control signal generating circuit 32 will be referred to as a final stage control signal netBn+1. The initial stage control signal netB0 is supplied to the control terminal netBp of the unit circuit 11 at the first stage. The final stage control signal netBn+1 is supplied to the control terminal netBq of the unit circuit 11 at the n-th stage.

Figure 20:
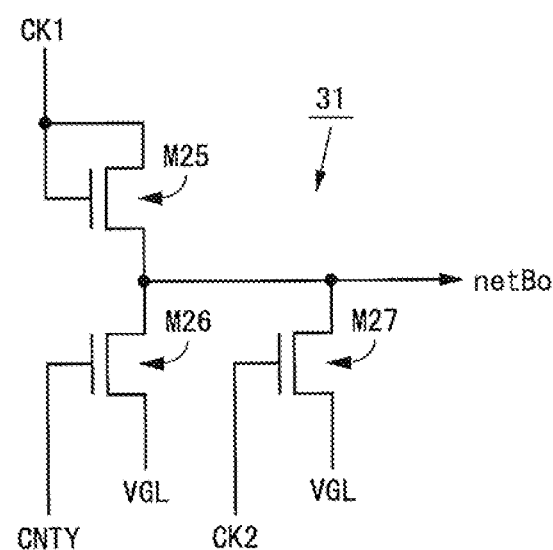
FIG. 20 is a circuit diagram illustrating a configuration of an initial stage control signal generating circuit of the shift register according to the third embodiment.

FIG. 20 is a circuit diagram of the initial stage control signal generating circuit 31. As illustrated in FIG. 20, the initial stage control signal generating circuit 31 includes three TFTs: M25, M26, and M27. Each of the TFTs in the initial stage control signal generating circuit 31 is an n-channel TFT. A drain terminal and a gate terminal of the TFT: M25 are connected to the clock terminal CK1. A source terminal of the TFT: M25 and drain terminals of the TFTs: M26 and M27 are connected to the output terminal netBo. A gate terminal of the TFT: M26 is connected to the control terminal CNTY. A gate terminal of the TFT: M27 is connected to the clock terminal CK2. The low level potential VGL is applied to source terminals of the TFTs: M26 and M27.

In a period (the high level period of the gate clock GCK4) after the clock signal CK1 (the gate clock GCK4) changes to the high level until the clock signal CK2 (the gate clock GCK2) changes to the high level, the initial stage control signal netB0 is set to the high level when the control signal CNTY (the control signal CNT3) is at the low level, and is set to the low level at any other time.

The final stage control signal generating circuit 32 has the same circuit configuration as that of the initial stage control signal generating circuit 31. In a period (the high level period of the gate clock GCK1) after the clock signal CK1 (the gate clock GCK1) changes to the high level until the clock signal CK2 (the gate clock GCK3) changes to the high level, the final stage control signal netBn+1 is set to the high level when the control signal CNTY (the control signal CNT4) is at the low level, and is set to the low level at any other time.

Note that in the initial stage control signal generating circuit 31 and the final stage control signal generating circuit 32, when the TFTs: M25 and M26 are both in the on state, in order to bring the potential of the node netBo to a level close to the low level potential VGL, the sizes of the TFTs: M25 and M26 are designed such that an on-resistance value of the TFT: M26 is much smaller than an on-resistance value of the TFT: M25.

Figure 21A:
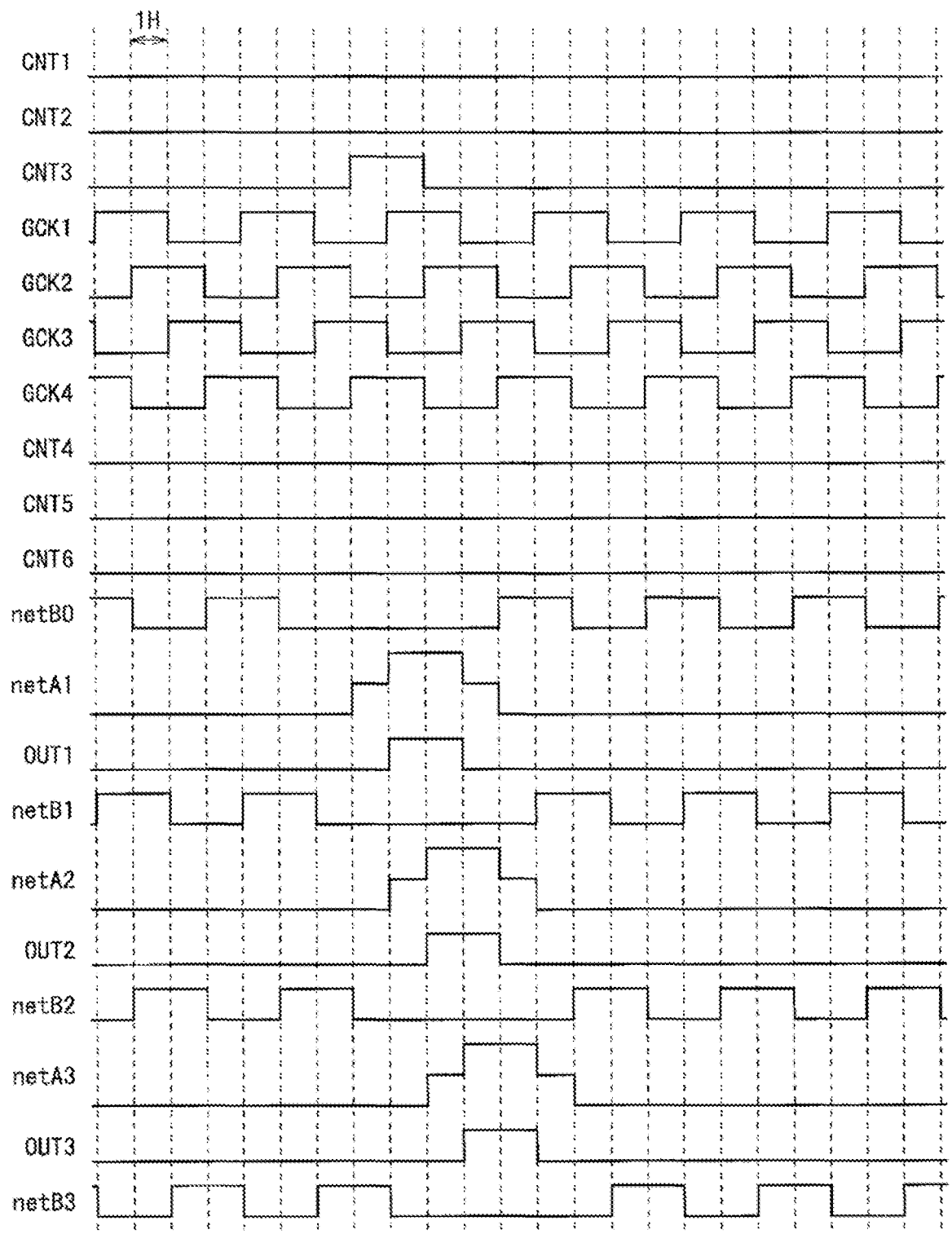
FIG. 21A is a timing chart during the forward shift of the lead section of the shift register according to the third embodiment.
Figure 21B:
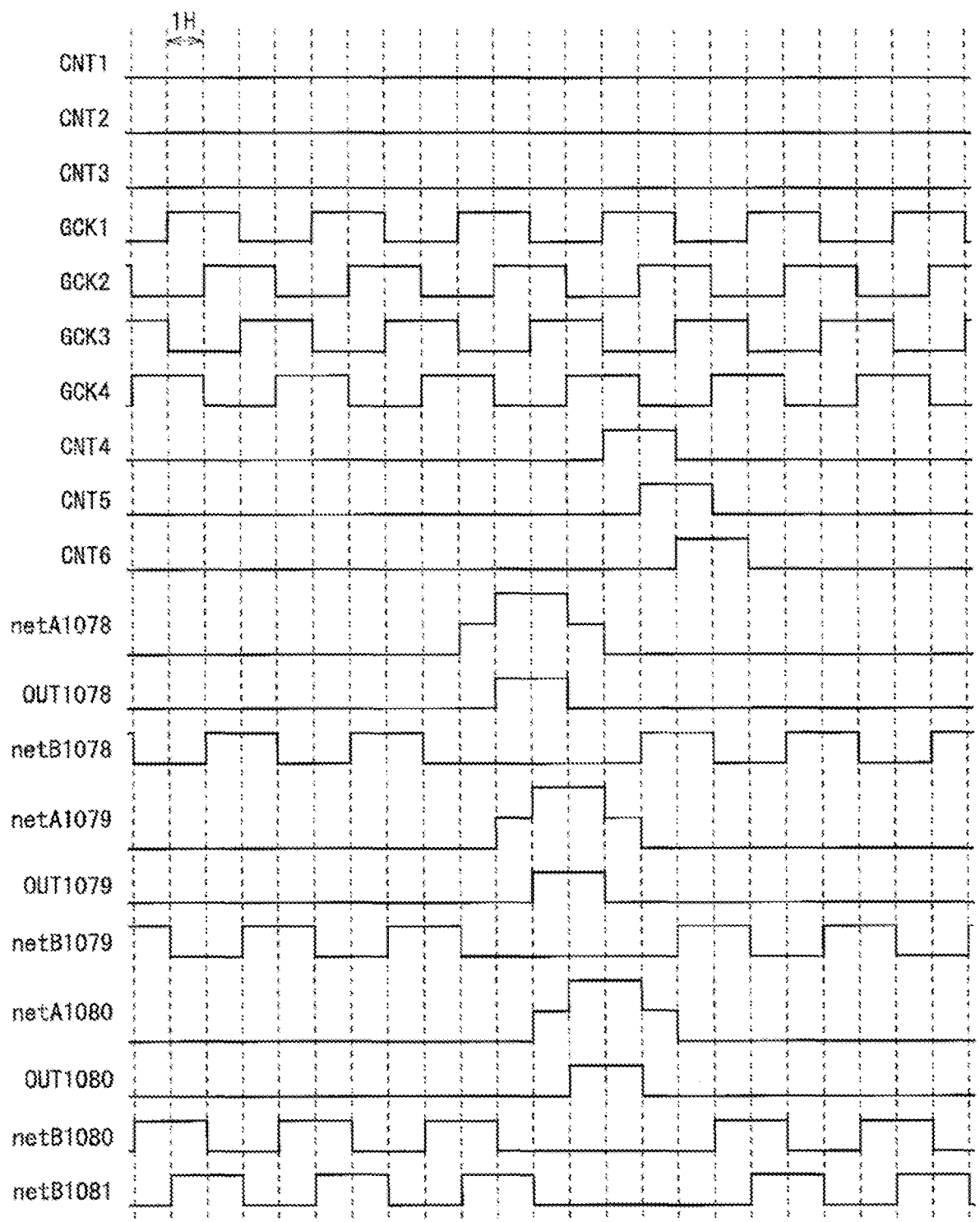
FIG. 21B is a timing chart during the forward shift of the end section of the shift register according to the third embodiment.
Figure 22A:
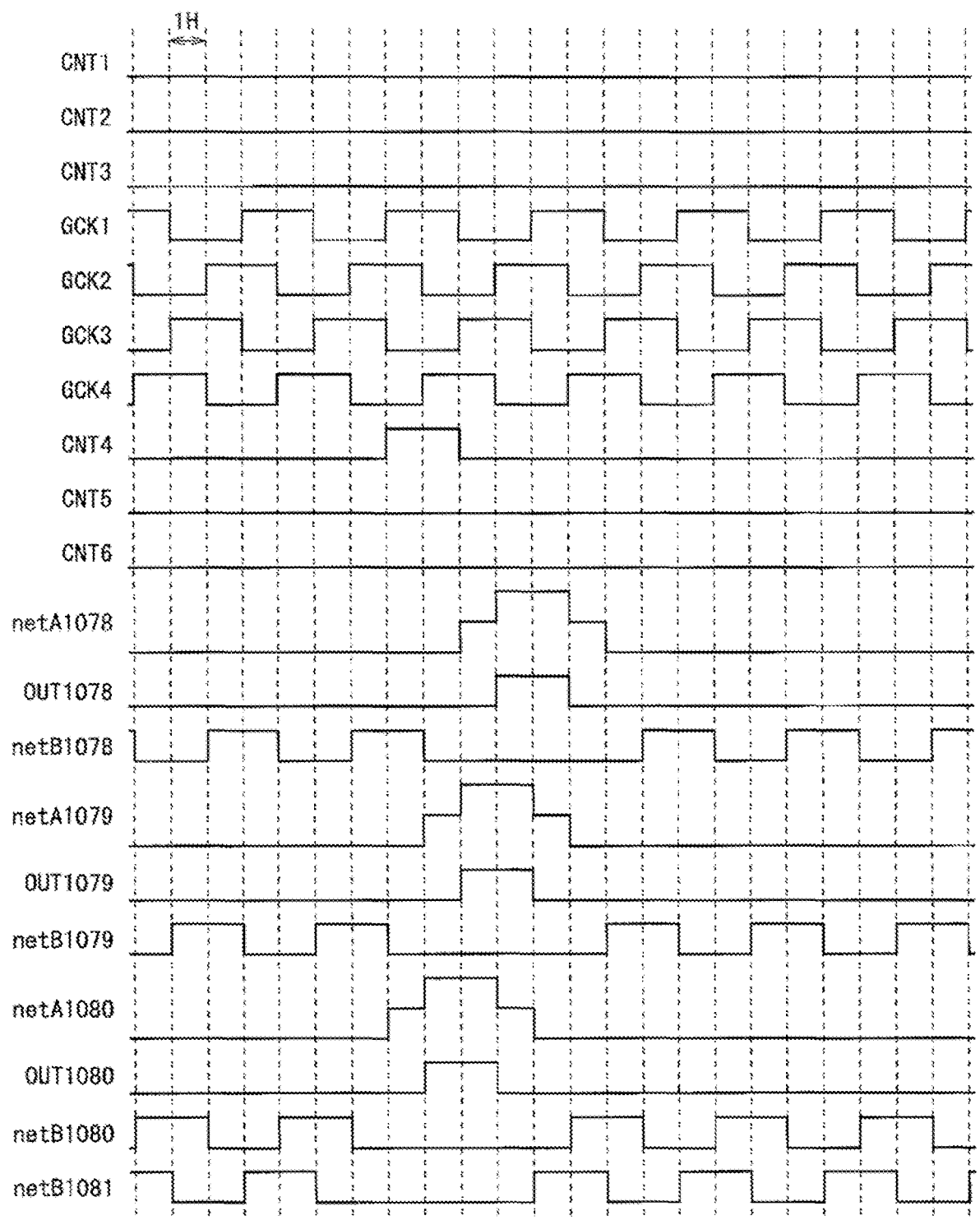
FIG. 22A is a timing chart during the reverse shift of the end section of the shift register according to the third embodiment.
Figure 22B:
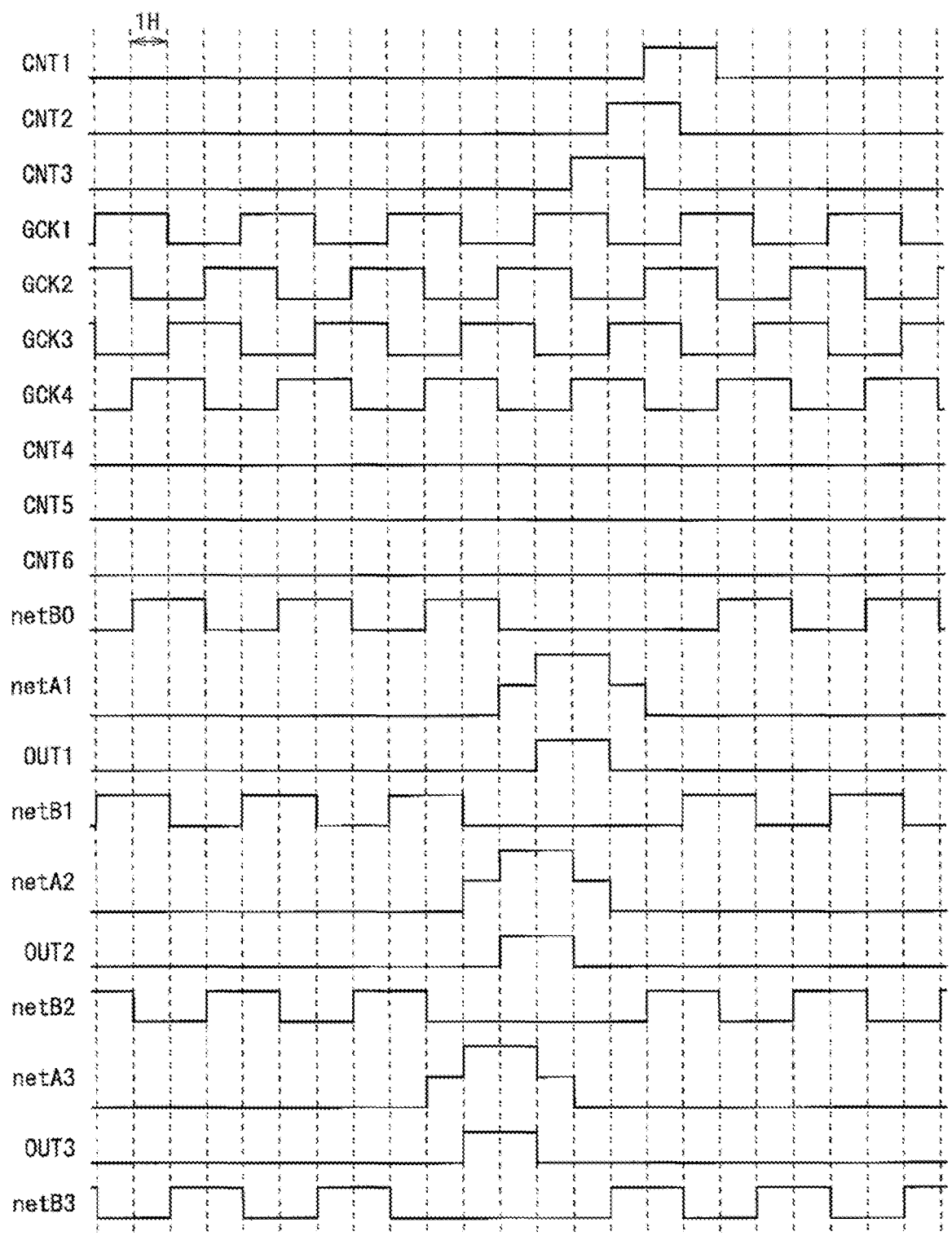
FIG. 22B is a timing chart during the reverse shift of the lead section of the shift register according to the third embodiment.

FIG. 21A is a timing chart during the forward shift of the lead section of the shift register 30. FIG. 21B is a timing chart during the forward shift of the end section of the shift register 30. A timing chart during the forward shift of an intermediate section of the shift register 30 is the same as that illustrated in FIG. 5B. FIG. 22A is a timing chart during the reverse shift of the end section of the shift register 30. FIG. 22B is a timing chart during the reverse shift of the lead section of the shift register 30. A timing chart during the reverse shift of the intermediate section of the shift register 30 is the same as that illustrated in FIG. 6B.

In the shift register 30, the control signal (the initial stage control signal netB0) supplied to the control terminal netBp of the unit circuit 11 at the first stage, and the control signal (the final stage control signal netBn+1) supplied to the control terminal netBq of the unit circuit 11 at the n-th stage is not any of the gate clocks GCK1 to GCK4. Thus, the gate clocks GCK1 to GCK4 need not be at the low level before starting the shift. Therefore, in FIG. 21A, FIG. 21B, FIG. 22A, and FIG. 22B, the gate clocks GCK1 to GCK4 are alternately set to the high level and the low level for the period 2H each time, constantly and without stopping. Even when the gate clocks GCK1 to GCK4 that do not stop even during the shift pause period are supplied to the shift register 30, the shift register 30 operates correctly.

According to the shift register 30, in the same manner as the shift register 10 according to the first embodiment, it is possible to prevent the potential of the node netA from fluctuating due to the noise when the clock signal CK1 changes to the high level. Further, the circuit volume thereof can be made smaller than that of a shift register including the unit circuit 95 and having the equivalent function, and that of a shift register including the unit circuit 91 and not having a part of the function of the shift register 30.

The gate clocks GCK1 to GCK4 supplied to the shift register 30 do not stop even during the shift pause period. Thus, in the unit circuit 11 at the i-th stage, even during the shift pause period, the clock signals CK1 and CK2 are alternately set to the high level, the TFTs: M5 and M7 are alternately turned on, and the control signal netBi is alternately set to the high level and the low level. Thus, even during the shift pause period, the low level potential VGL is periodically applied to the gate terminal of the TFT: M8B of the unit circuit 11 at the preceding stage and to the gate terminal of the TFT: M8A of the unit circuit 11 at the next stage. Therefore, the fluctuations in the threshold voltages of the TFTs: M8A and M8B can be prevented, and the fluctuations in the potential of the node netA can be more effectively prevented. Further, by using the gate clocks GCK1 to GCK4 that do not stop during the shift pause period, the gate clocks GCK1 to GCK4 can also be easily controlled.

As described above, the shift register 30 according to the present embodiment includes the initial stage control signal generating circuit 31 that generates the initial stage control signal netB0, and the final stage control signal generating circuit 32 that generates the final stage control signal netBn+1. Instead of the control signal output from the unit circuit 11 at the preceding stage, the initial stage control signal netB0 is supplied to the first potential stabilizing transistor in the unit circuit 11 at the initial stage (the TFT: M8A in the unit circuit 11 at the first stage), and instead of the control signal output from the unit circuit 11 at the next stage, the final stage control signal netBn+1 is supplied to the second potential stabilizing transistor in the unit circuit 11 at the final stage (the TFT: M8B in the unit circuit 11 at the n-th stage).

According to the shift register 30 configured in this way, by controlling the first potential stabilizing transistor in the unit circuit 11 at the initial stage and the second potential stabilizing transistor in the unit circuit 11 at the final stage using the control signal generated in the initial stage control signal generating circuit 31 and the final stage control signal generating circuit 32, even when the clock signals, which do not stop after the end of the shift, are used, the fluctuations in the threshold voltages of the first and second potential stabilizing transistors can be prevented, and the fluctuations in the potential of the first node (node netA) can be more effectively prevented. Further, by using the clock signals that do not stop after the end of the shift, the clock signals can be easily controlled.

With respect to the shift register 30 according to the present embodiment, the following modified example can be configured. Even when the gate clocks GCK1 to GCK4 that stop during the shift pause period are supplied to the shift register 30, the shift register 30 operates correctly. Therefore, the gate clocks GCK1 to GCK4 that stop during the shift pause period may be supplied to the shift register 30, or the gate clocks GCK1 to GCK4 that do not stop during the shift pause period may be supplied to the shift register 30.

When the gate clocks GCK1 to GCK4 that do not stop during the shift pause period are used, as a shift register according to the modified example, a shift register may be configured that includes the n unit circuits 15 (FIG. 9), the initial stage control signal generating circuit 31, and the final stage control signal generating circuit 32. According to the shift register of the modified example, in addition to the same effect as that of the shift register 30, the circuit volume of the shift register can be reduced even further.

While the first to third embodiments have been described above, when designing a shift register, an optimum embodiment may be selected from the first to third embodiments in accordance with specifications of the display device. For example, when the shift pause period is short enough with respect to one vertical period, the first embodiment may be selected in which the circuit volume is the smallest.

Fourth Embodiment

Figure 23A:
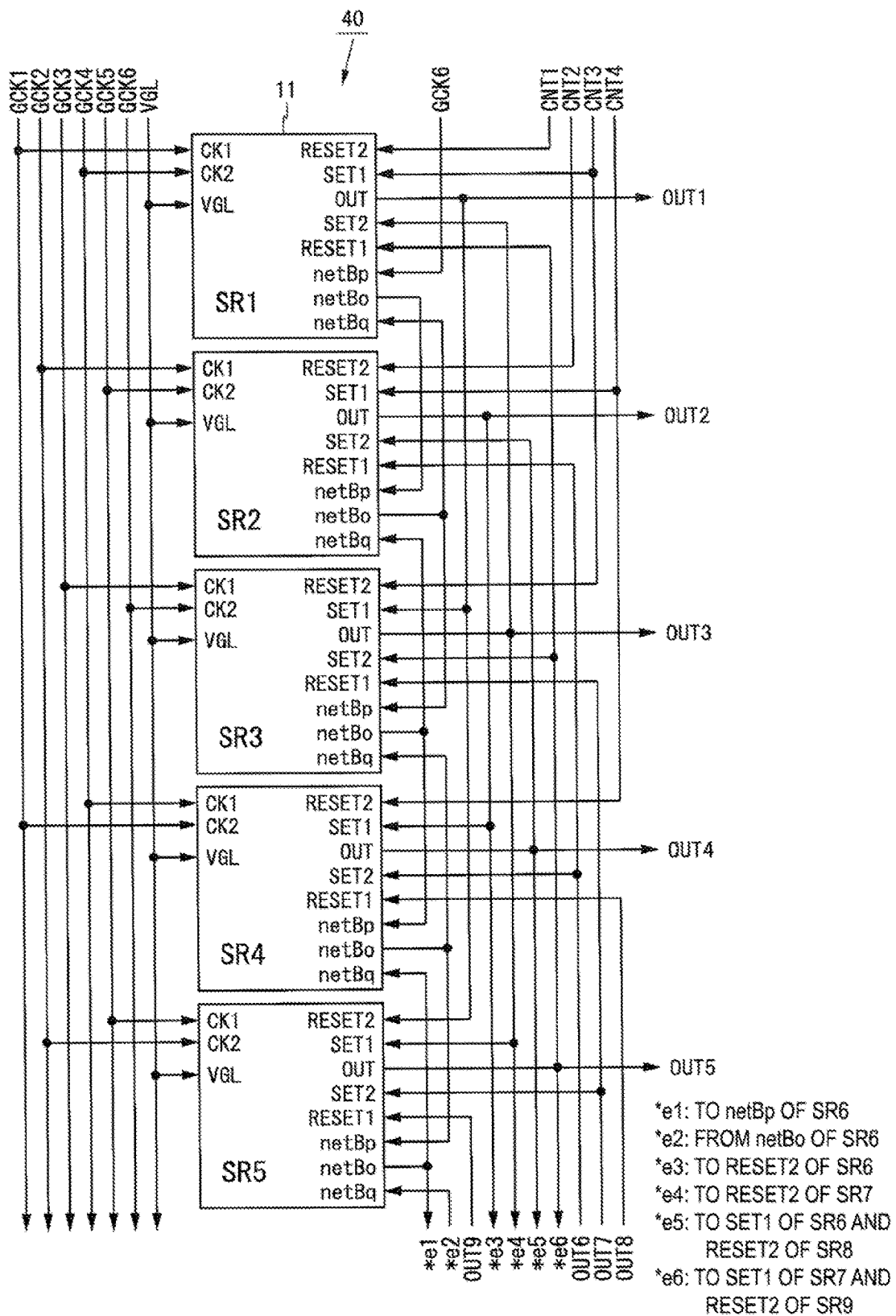
FIG. 23A is a block diagram illustrating a configuration of a lead section of a shift register according to a fourth embodiment.
Figure 23B:
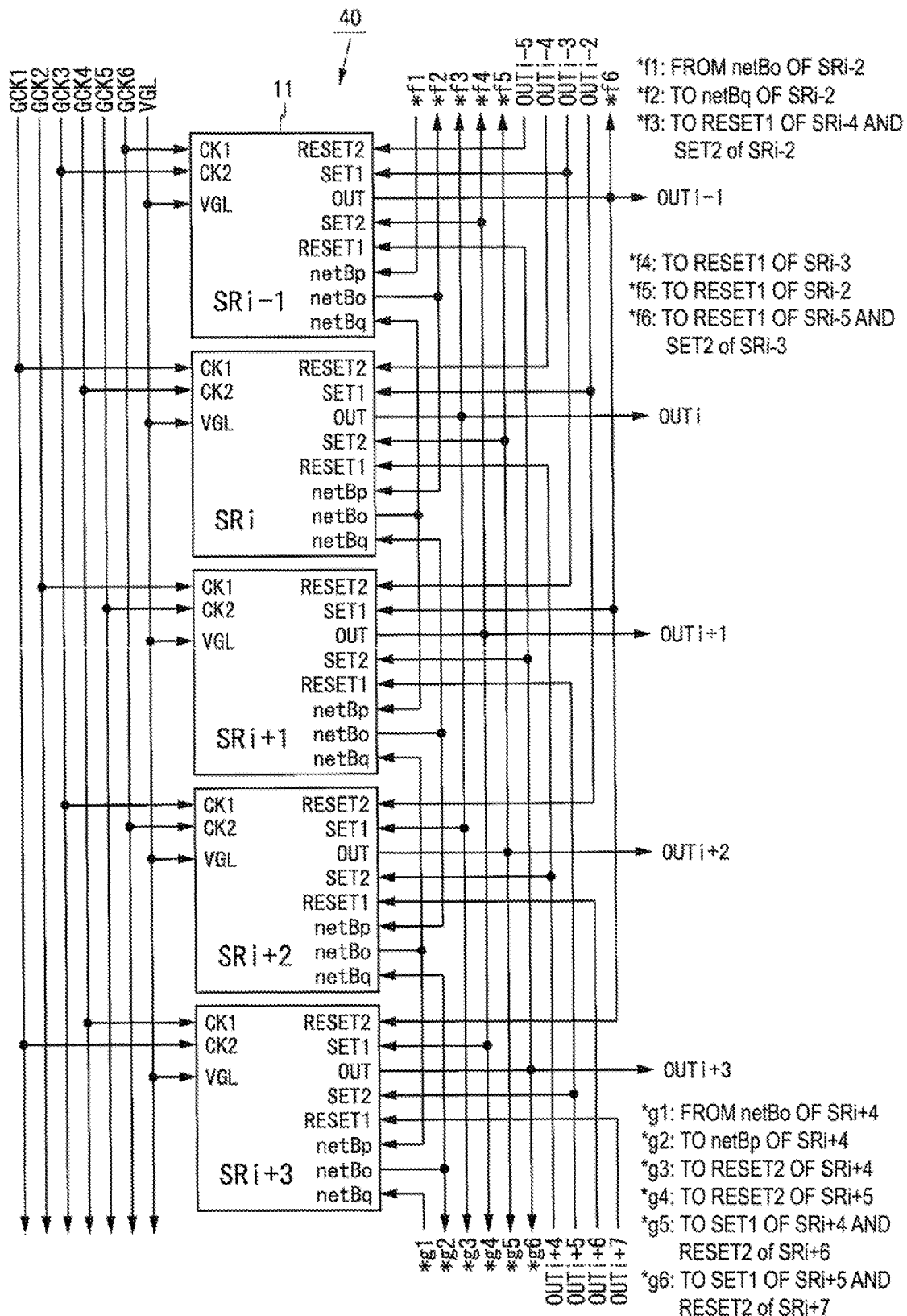
FIG. 23B is a block diagram illustrating a configuration of an intermediate section of the shift register according to the fourth embodiment.
Figure 23C:
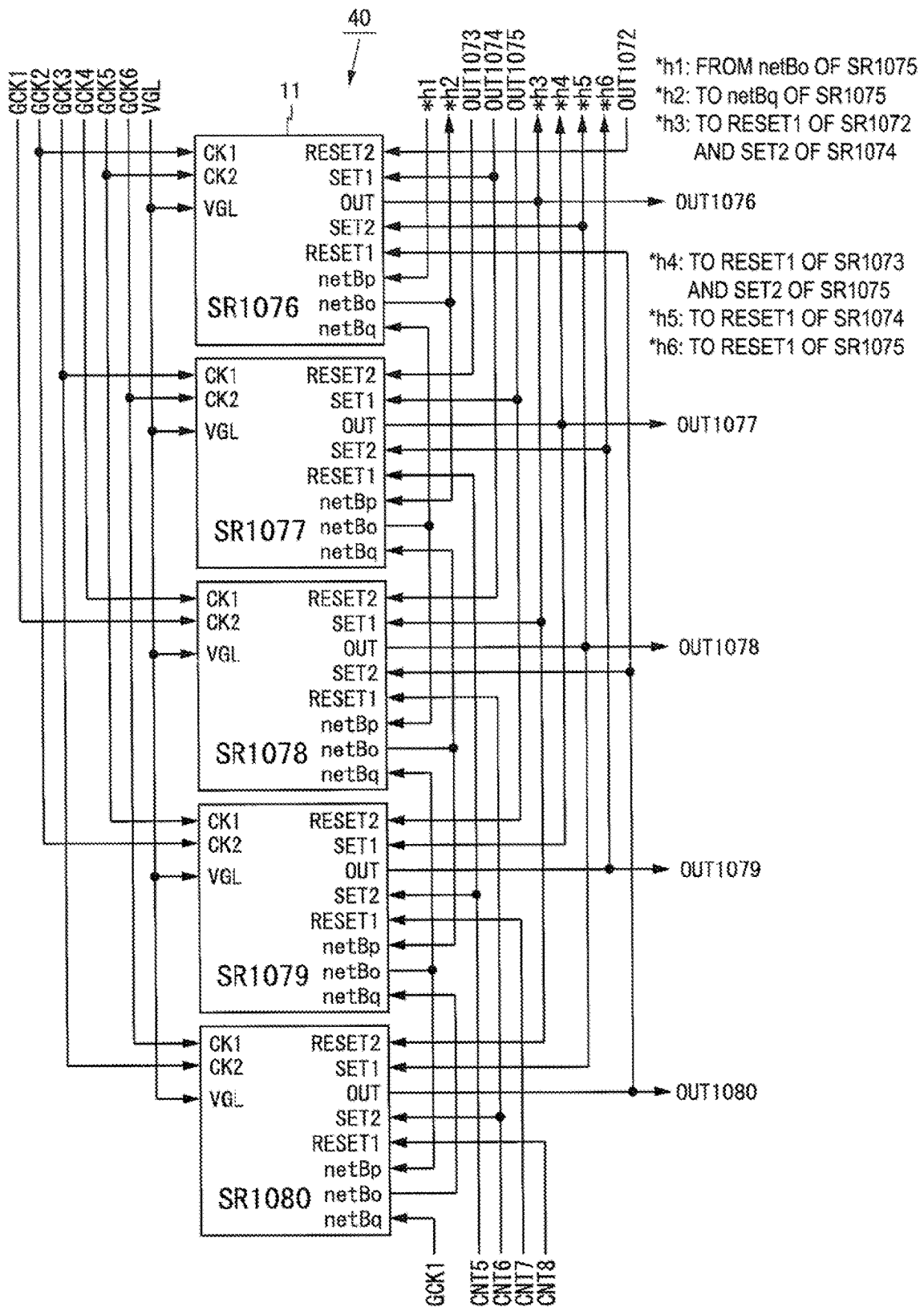
FIG. 23C is a block diagram illustrating a configuration of an end section of the shift register according to the fourth embodiment.

FIG. 23A to FIG. 23C are block diagrams illustrating a configuration of a shift register according to a fourth embodiment. A shift register 40 according to the present embodiment includes the n unit circuits 11 connected at multiple stages. FIG. 23A to FIG. 23C illustrate configurations of a lead section, an intermediate section, and an end section of the shift register 40, respectively. Six-phase gate clocks GCK1 to GCK6, control signals CNT1 to CNT8, and the low level potential VGL are supplied to the shift register 40. The shift register 40 outputs the output signals OUT1 to OUTn based on these signals and the potential.

The n unit circuits 11 are classified into six groups in order of connection. When k is an integer of 1 or more and 180 or less, the unit circuit 11 at the (6k−5)th stage is classified as being in the first group, the unit circuit 11 at the (6k−4)th stage is classified as being in the second group, and the unit circuit 11 at the (6k−3)th stage is classified as being in the third group, the unit circuit 11 at the (6k−2)th stage is classified as being in the fourth group, the unit circuit 11 at the (6k−1)th stage is classified as being in a fifth group, and the unit circuit 11 at the 6k-th stage is classified as being in a sixth group. In FIG. 23B, the unit circuit 11 at the i-th stage is classified as being in the first group.

The gate clock GCK1 is supplied to the clock terminal CK1 of the unit circuit 11 in the first group and the clock terminal CK2 of the unit circuit 11 in the fourth group. The gate clock GCK2 is supplied to the clock terminal CK1 of the unit circuit 11 in the second group and the clock terminal CK2 of the unit circuit 11 in the fifth group. The gate clock GCK3 is supplied to the clock terminal CK1 of the unit circuit 11 in the third group and the clock terminal CK2 of the unit circuit 11 in the sixth group. The gate clock GCK4 is supplied to the clock terminal CK1 of the unit circuit 11 in the fourth group and the clock terminal CK2 of the unit circuit 11 in the first group. The gate clock GCK5 is supplied to the clock terminal CK1 of the unit circuit 11 in the fifth group and the clock terminal CK2 of the unit circuit 11 in the second group. The gate clock GCK6 is supplied to the clock terminal CK1 of the unit circuit 11 in the sixth group and the clock terminal CK2 of the unit circuit 11 in the third group.

An output signal OUTi−2 output from the unit circuit 11 at a stage two stages before the i-th stage is supplied to the set terminal SET1 of the unit circuit 11 at the i-th stage. However, to the set terminals SET1 of the unit circuits 11 at the first to second stages, the control signals CNT3 to CNT4 are supplied, respectively. To the reset terminal RESET1 of the unit circuit 11 at the i-th stage, an output signal OUTi+4 of the unit circuit 11 at a stage four stages after the i-th stage is supplied. However, to the reset terminals RESET1 of the unit circuits 11 at the (n−3)th to n-th stages, the control signals CNT5 to CNT8 are supplied, respectively.

To the set terminal SET2 of the unit circuit 11 at the i-th stage, an output signal OUTi+2 output from the unit circuit 11 at a stage two stages after the i-th stage is supplied. However, to the set terminals SET2 of the unit circuits 11 at the (n−1)th to n-th stages, the control signals CNT5 to CNT6 are supplied, respectively. To the reset terminal RESET2 of the unit circuit 11 at the i-th stage, an output signal OUTi−4 of the unit circuit 11 at a stage four stages before the i-th stage is supplied. However, to the reset terminals RESET2 of the unit circuits 11 at the first to fourth stages, the control signals CNT1 to CNT4 are supplied, respectively.

Figure 24A:
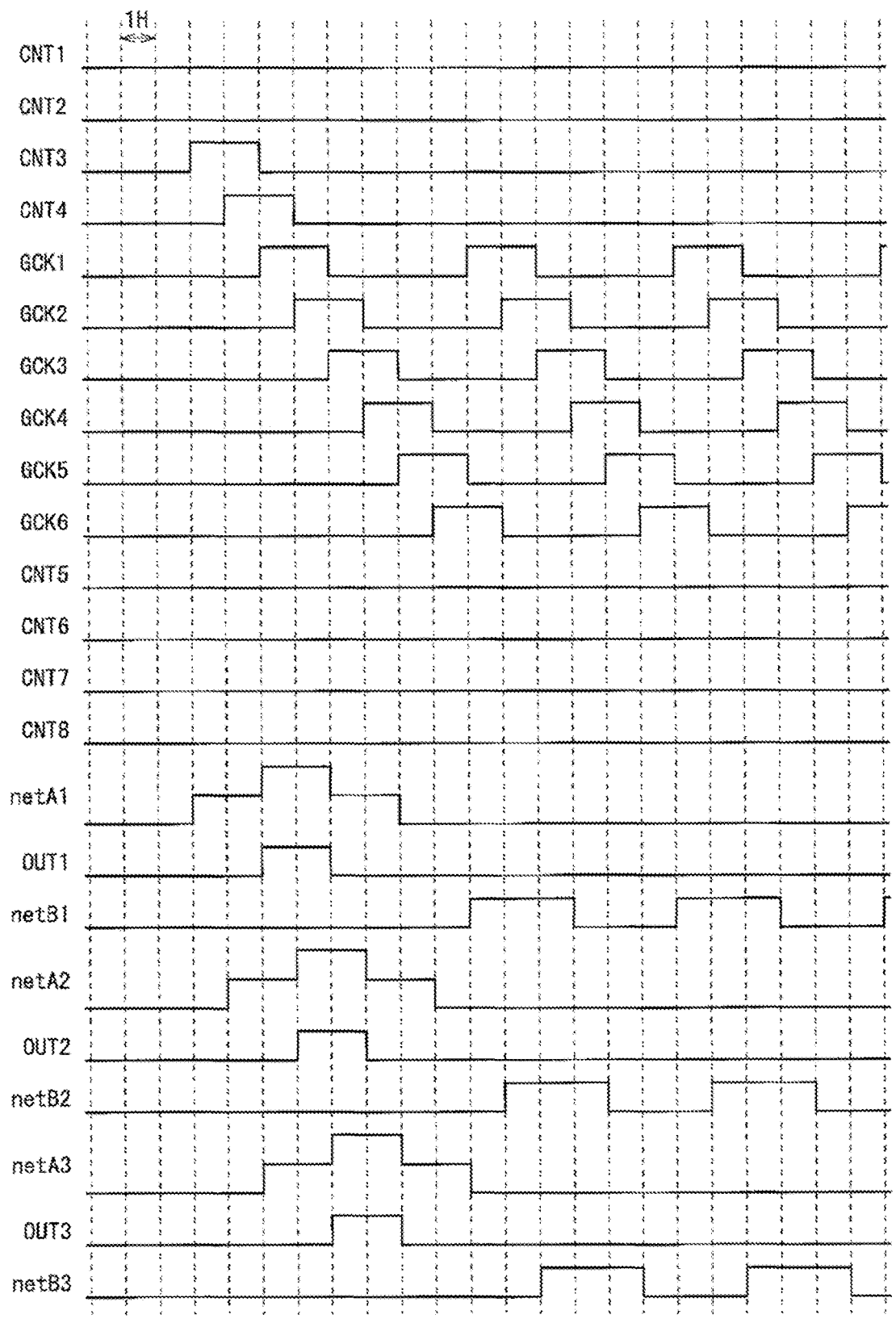
FIG. 24A is a timing chart during the forward shift of the lead section of the shift register according to the fourth embodiment.
Figure 24B:
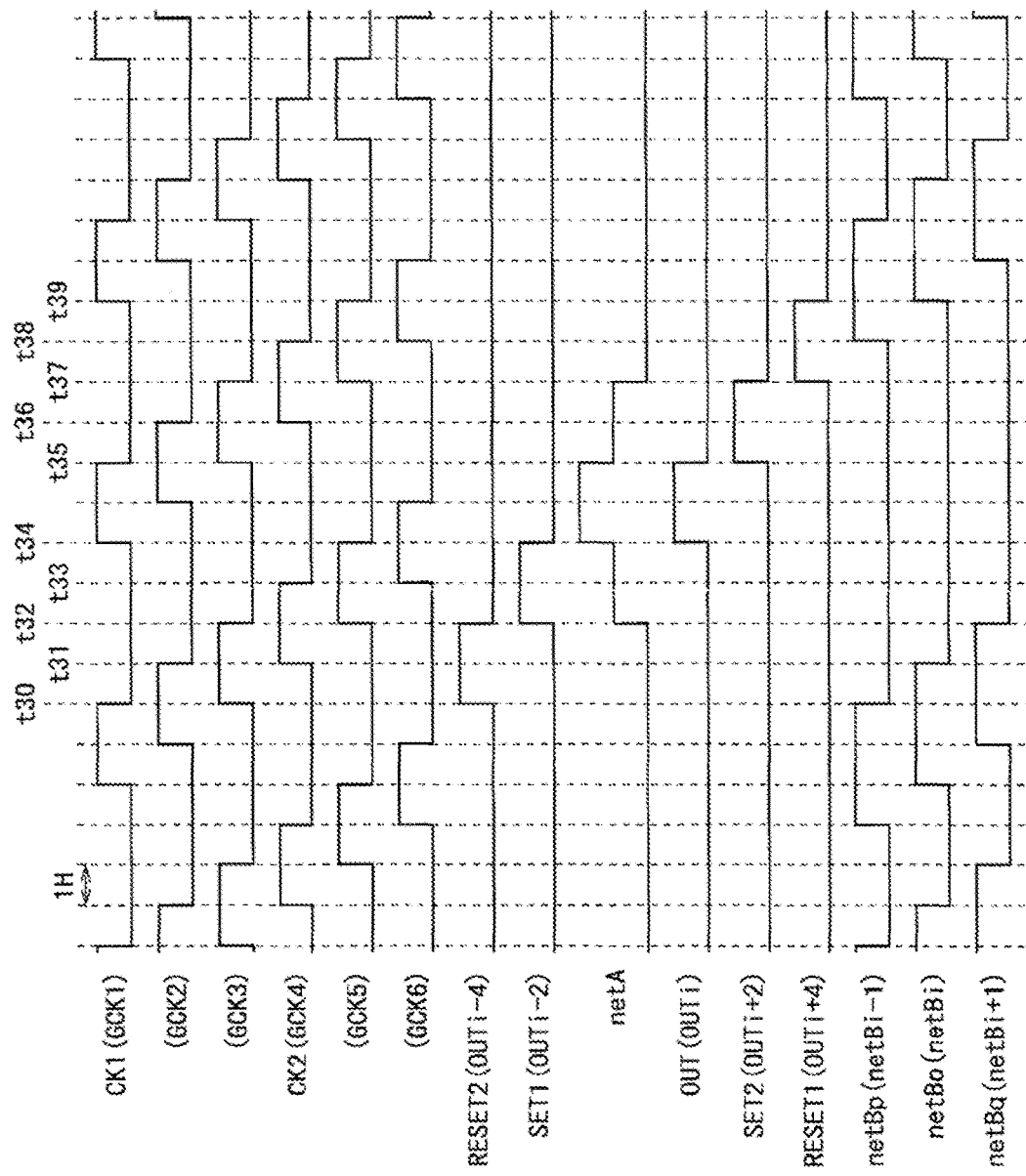
FIG. 24B is a timing chart during the forward shift of the intermediate section of the shift register according to the fourth embodiment.
Figure 24C:
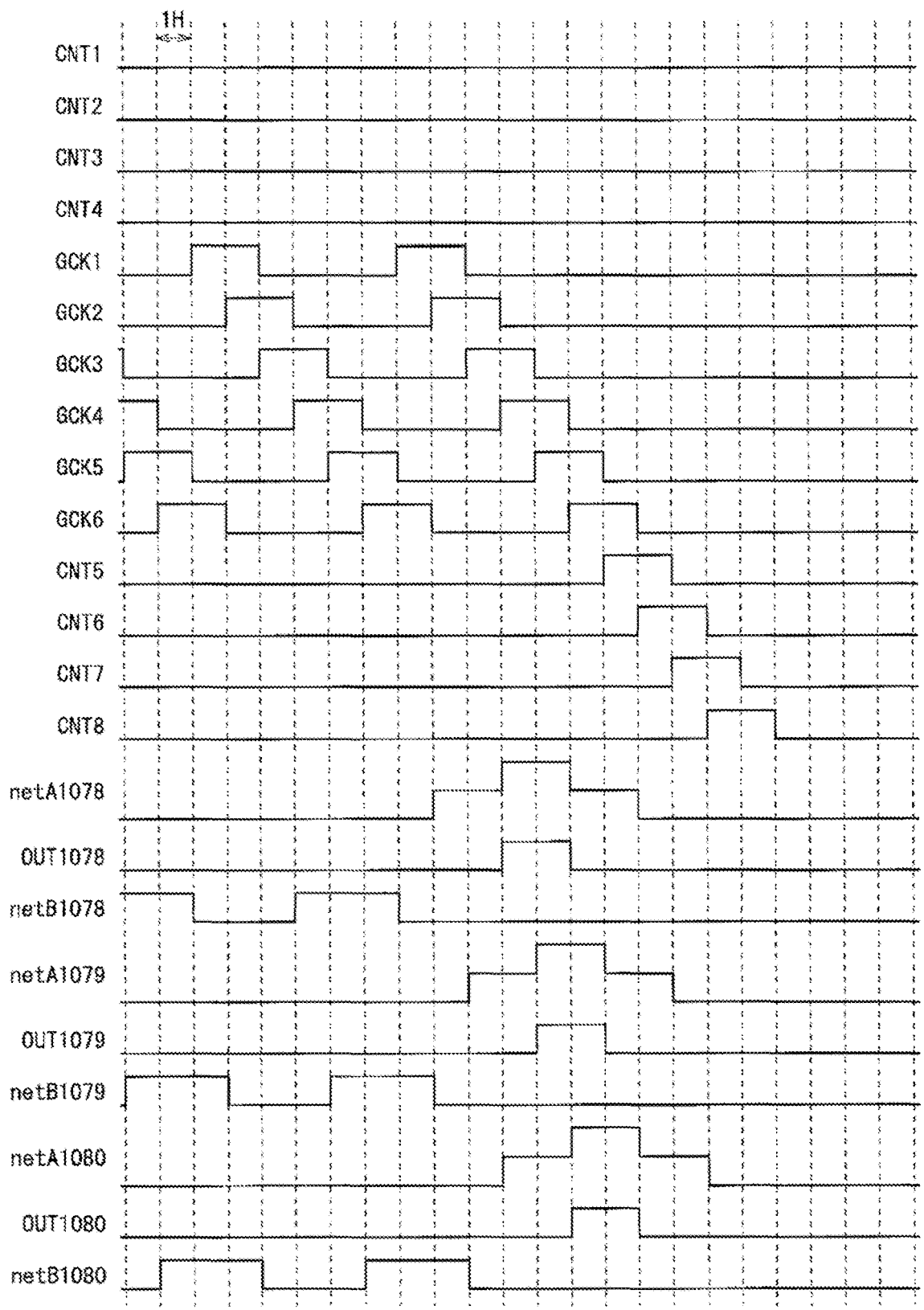
FIG. 24C is a timing chart during the forward shift of the end section of the shift register according to the fourth embodiment.

FIG. 24A to FIG. 24C are timing charts during the forward shift of the shift register 40. FIG. 24A to FIG. 24C illustrate timings of the lead section, the intermediate section, and the end section of the shift register 40, respectively. FIG. 24B illustrates timings of the unit circuit 11 at the i-th stage, which is classified as being in the first group.

As illustrated in FIG. 24A to FIG. 24C, a period of each of the gate clocks GCK1 to GCK6, the length of the high level period, and the length of the low level period are a period 6H, the period 2H, and the period 4H, respectively. The gate clocks GCK2 to GCK6 are delayed by the period 1H with respect to the gate clocks GCK1 to GCK5, respectively. The control signals CNT1 to CNT2 are always at the low level.

As illustrated in FIG. 24A, before the start of the forward shift, the gate clocks GCK1 to GCK6 and the control signals CNT3 to CNT8 are all at the low level. At the start of the forward shift, first, the control signal CNT3 is set to the high level only for the period 2H. The control signal CNT4 is set to the high level only for the period 2H with a delay of the period 1H with respect to the control signal CNT3. The gate clocks GCK 1 to GCK6 are set to the high level only for the period 2H with a delay of the period 1H with respect to the control signal CNT4 and the gate clocks GCK1 to GCK5, respectively. After that, each of the gate clocks GCK1 to GCK6 is alternately set to the high level (the length thereof is the period 2H) and the low level (the length thereof is the period 4H).

As illustrated in FIG. 24C, at the end of the forward shift, first, the gate clock GCK1 is fixed to the low level. The gate clocks GCK2 to GCK6 are fixed to the low level with a delay of the period 1H with respect to the gate clocks GCK1 to GCK5, respectively. The control signal CNT5 is set to the high level only for the period 2H with a delay of the period 1H after the gate clock GCK6 changes to the high level a last time. The control signals CNT6 to CNT8 are set to the high level only for the period 2H with a delay of the period 1H with respect to the control signals CNT5 to CNT7, respectively.

With reference to FIG. 24B, an operation of the unit circuit 11 at the i-th stage during the forward shift will be described. When the unit circuit 11 is classified as being in the first group, the clock signal CK1 is the gate clock GCK1, and the clock signal CK2 is the gate clock GCK4. The clock signal CK2 differs in phase from the clock signal CK1 by a half period.

Immediately before a time t30, the clock signal CK1 and the control signals netBp and netBq are at the high level, and the clock signal CK2, the set signals SET1 and SET2, and the reset signals RESET1 and RESET2 are at the low level. Thus, the TFTs: M5, MBA, and M8B are in the on state, and the TFTs: M1A, M1B, M7, M9A, M9B, and M11 are in the off state. Therefore, the potential of the node netA is at the low level, and the TFTs: M6 and M10 are in the off state. Thus, the potential of the node netB is at the high level, and the output signal OUTi is at the low level.

At the time t30, the clock signal CK1 and the control signal netBp change to the low level, and the reset signal RESET2 changes to the high level. Accordingly, the TFTs: M5 and M8A are turned off, and the TFT: M9B is turned on. Even when the state of the TFT changes, the potentials of the nodes netA and netB and the output signal OUTi do not change. At a time t31, the clock signal CK2 changes to the high level. Accordingly, the TFTs: M7 and M11 are turned on. Thus, the potential of the node netB changes to the low level.

At a time t32, the reset signal RESET2 and the control signal netBq change to the low level, and the set signal SET1 changes to the high level. Accordingly, the TFTs: M8B and M9B are turned off, and the TFT: M1A is turned on. Thus, the potential of the node netA changes to the high level, and the TFTs: M6 and M10 are turned on. At a time t33, the clock signal CK2 changes to the low level. Accordingly, the TFTs:

M7 and M11 are turned off. Even when the state of the TFT changes, the potentials of the nodes netA and netB and the output signal OUTi do not change.

At a time t34, the set signal SET1 changes to the low level, and the clock signal CK1 changes to the high level. Accordingly, the TFT: M1A is turned off, and the TFT: M5 is turned on. At this time, since the TFT: M10 is in the on state, the output signal OUTi changes to the high level. Further, when the clock signal CK1 changes to the high level, the potential of the node netA becomes higher than the normal high level due to the bootstrap effect. Therefore, the output signal OUTi is set to the high level, which is the same level as that of the clock signal CK1, without being reduced by an amount corresponding to the threshold voltage of the TFT: M10.

Note that since the TFT: M6 is turned on at the time t32 and the TFT: M5 is turned on at the time t34, in a period from the time t34 to a time t35, the TFTs: M5 and M6 are both brought into the on state. When both the TFTs: M5 and M6 are in the on state, in order to bring the potential of the node netB to a level close to the low level potential VGL, the sizes of the TFTs: M5 and M6 are designed so that the on-resistance value of the TFT: M6 is much smaller than the on-resistance value of the TFT: M5.

At the time t35, the clock signal CK1 changes to the low level, and the set signal SET2 changes to the high level. Accordingly, the TFT: M5 is turned off, and the TFT: M1B is turned on. At this time, since the TFT: M10 is in the on state, the output signal OUTi changes to the low level. Further, when the clock signal CK1 changes to the low level, the potential of the node netA returns to the normal high level. At a time t36, the clock signal CK2 changes to the high level. Accordingly, the TFTs: M7 and M11 are turned on. Even when the state of the TFT changes, the potentials of the nodes netA and netB and the output signal OUTi do not change.

At a time t37, the set signal SET2 changes to the low level, and the reset signal RESET1 changes to the high level. Accordingly, the TFT: M1B is turned off, and the TFT: M9A is turned on. Thus, the potential of the node netA changes to the low level, and the TFTs: M6 and M10 are turned off. At a time t38, the clock signal CK2 changes to the low level, and the control signal netBp changes to the high level. Accordingly, the TFTs: M7 and M11 are turned off, and the TFT: M8A is turned on. Even when the state of the TFT changes, the potentials of the nodes netA and netB and the output signal OUTi do not change.

At a time t39, the reset signal RESET1 changes to the low level, and the clock signal CK1 changes to the high level. Accordingly, the TFT: M9A is turned off, and the TFT: M5 is turned on. Thus, the potential of the node netB changes to the high level.

After the time t39, a first period (the length thereof is the period 2H) in which the clock signal CK1 is at the high level and the clock signal CK2 is at the low level, a second period (the length thereof is the period 1H) in which the clock signals CK1 and CK2 are both at the low level, a third period (the length thereof is the period 2H) in which the clock signal CK1 is at the low level and the clock signal CK2 is at the high level, and a fourth period (the length thereof is the period 1H) in which the clock signals CK1 and CK2 are both at the low level repeatedly appear in that order.

In the first period, since the TFT: M5 is turned on and the TFT: M7 is turned off, the potential of the node netB is at the high level. In the second period, since the TFTs: M5 and M7 are both turned off, the node netB is in a floating state. The potential of the node netB in the second period is at the high level, which is the same as in the first period. In the third period, since the TFT: M5 is turned off and the TFT: M7 is turned on, the potential of the node netB is at the low level. In the fourth period, since the TFTs: M5 and M7 are both turned off, the node netB is in the floating state. The potential of the node netB in the fourth period is at the low level, which is the same as in the third period.

During the forward shift, the set signal SET2 and the reset signal RESET2 do not affect the operation of the unit circuit 11. The output signal OUTi changes in the same manner as in the forward shift of the shift register 10 according to the first embodiment.

The output signal OUTi is set to the high level only for the period 2H with a delay of the period 2H with respect to the set signal SET1. The set signal SET1 is the output signal OUTi−2 of the unit circuit 11 at the stage two stages before the i-th stage. Therefore, during the forward shift, the output signals OUT1 to OUTn are each set to the high level only for the period 2H in ascending order, with a delay of the period 1H therebetween.

Figure 25A:
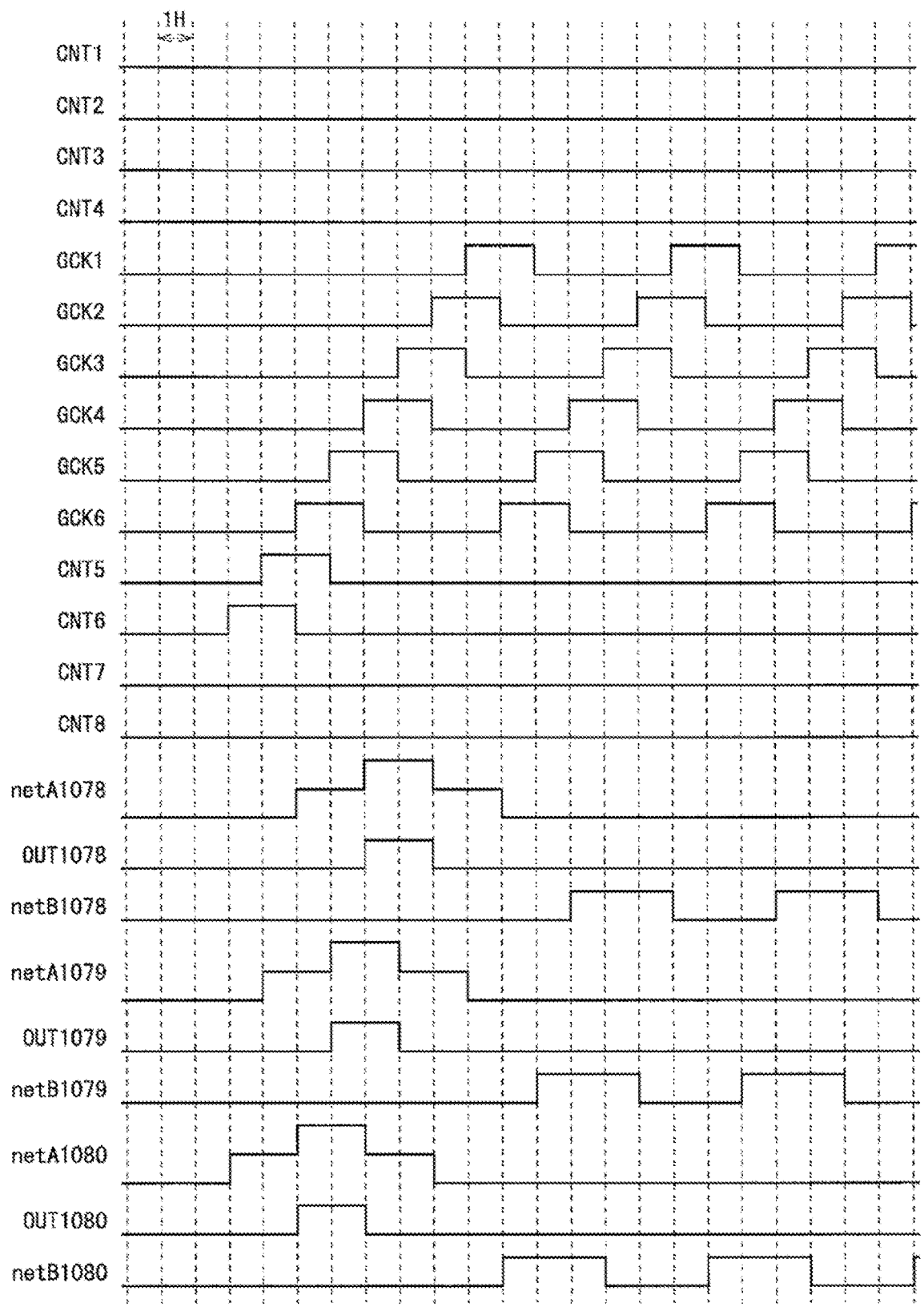
FIG. 25A is a timing chart during the reverse shift of the end section of the shift register according to the fourth embodiment.
Figure 25B:
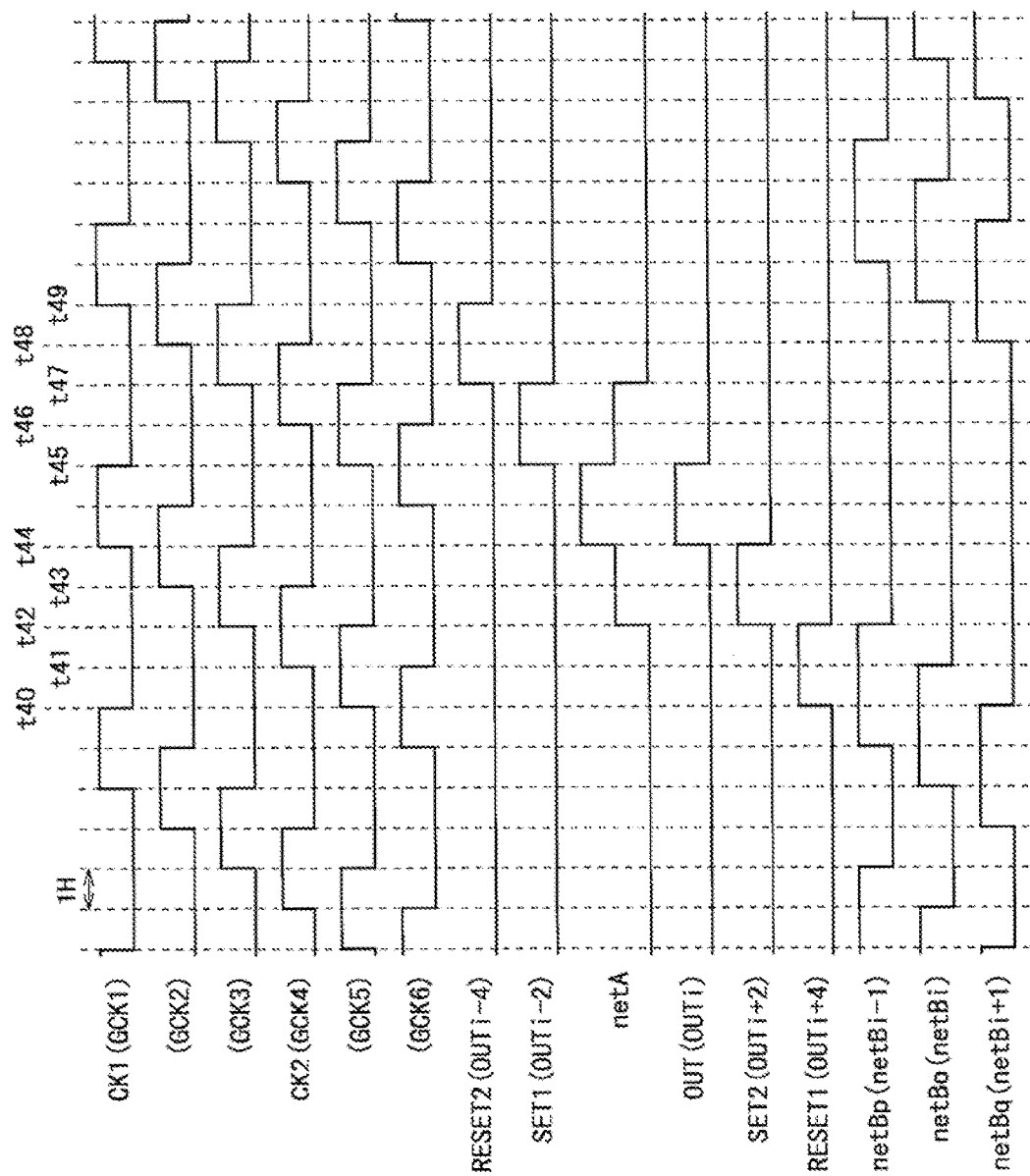
FIG. 25B is a timing chart during the reverse shift of the intermediate section of the shift register according to the fourth embodiment.
Figure 25C:
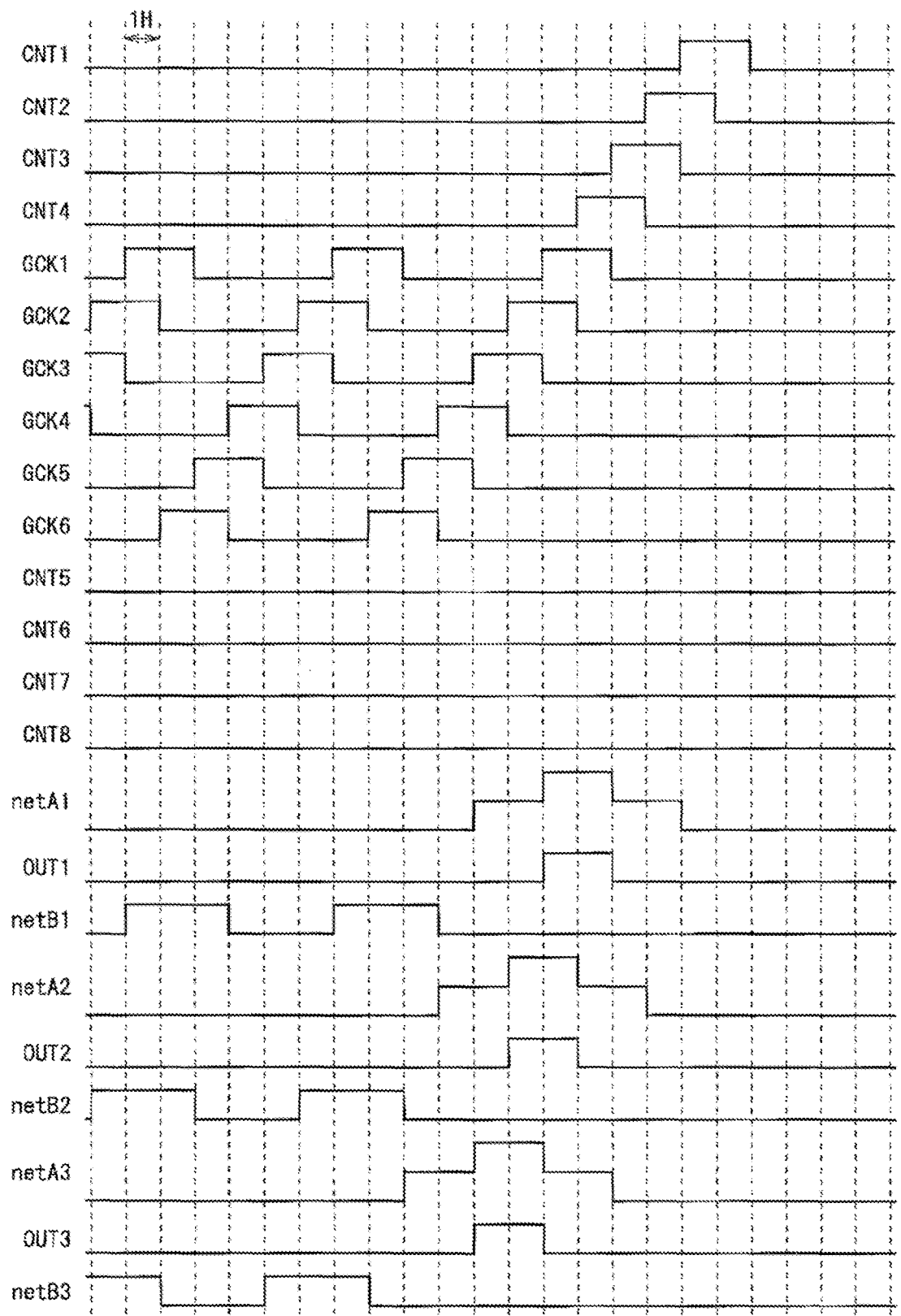
FIG. 25C is a timing chart during the reverse shift of the lead section of the shift register according to the fourth embodiment.

FIG. 25A to FIG. 25C are timing charts during the reverse shift of the shift register 40. FIG. 25A to FIG. 25C illustrate timings of the end section, the intermediate section, and the lead section of the shift register 40, respectively. FIG. 25B illustrates timings of the unit circuit 11 at the i-th stage, which is classified as being in the first group.

As illustrated in FIG. 25A to FIG. 25C, the period of each of the gate clocks GCK1 to GCK6, the length of the high level period, and the length of the low level period are the same as those of the forward shift. The gate clocks GCK1 to GCK5 are delayed by the period 1H with respect to the gate clocks GCK2 to GCK6, respectively. The control signals CNT7 to CNT8 are always at the low level.

As illustrated in FIG. 25A, before the start of the reverse shift, the gate clocks GCK1 to GCK6 and the control signals CNT1 to CNT6 are all at the low level. At the start of the reverse shift, first, the control signal CNT6 is set to the high level only for the period 2H. The control signal CNT5 is set to the high level only for the period 2H with a delay of the period 1H with respect to the control signal CNT6. The gate clocks GCK 1 to GCK6 are set to the high level only for the period 2H with a delay of the period 1H with respect to the gate clocks GCK2 to GCK6 and the control signal CNT5, respectively. After that, each of the gate clocks GCK1 to GCK6 is alternately set to the high level (the length thereof is the period 2H) and the low level (the length thereof is the period 4H).

As illustrated in FIG. 25C, at the end of the reverse shift, first, the gate clock GCK6 is fixed to the low level. The gate clocks GCK1 to GCK5 are fixed to the low level with a delay of the period 1H with respect to the gate clocks GCK2 to GCK6, respectively. The control signal CNT4 is set to the high level only for the period 2H with a delay of the period 1H after the gate clock GCK1 changes to the high level a last time. The control signals CNT1 to CNT3 are set to the high level only for the period 2H with a delay of the period 1H with respect to the control signals CNT2 to CNT4, respectively.

With respect to the operation of the unit circuit 11 at the i-th stage in a period from before the time t30 to after the time t39 illustrated in FIG. 24B, in a period from before a time t40 to after a time t49 illustrated in FIG. 25B, the unit circuit 11 at the i-th stage performs an operation with the set signal SET1 switched with the set signal SET2, the reset signal RESET1 switched with the reset signal RESET2, the control signal netBp switched with the control signal netBq, and the TFTs M1A, M8A, and M9A switched with TFTs: M1B, M8B, and M9B, respectively.

During the reverse shift, the set signal SET1 and the reset signal RESET1 do not affect the operation of the unit circuit 11. The output signal OUTi changes in the same manner as in the reverse shift of the shift register 10 according to the first embodiment.

The output signal OUTi is set to the high level only for the period 2H with a delay of the period 2H with respect to the set signal SET2. The set signal SET1 is the output signal OUTi+2 of the unit circuit 11 at the stage two stages after the i-th stage. Therefore, during the reverse shift, the output signals OUT1 to OUTn are each set to the high level only for the period 2H in descending order, with a delay of the period 1H therebetween.

According to the shift register 40, in the same manner as with the shift register 10 according to the first embodiment, it is possible to prevent the potential of the node netA from fluctuating due to the noise when the clock signal CK1 changes to the high level. Further, the circuit volume thereof can be made smaller than that of a shift register including the unit circuit 95 and having the same function, and that of a shift register including the unit circuit 91 and not having a part of the function of the shift register 30.

Further, in the shift register 10, a period (a charging time of the node netA until it is bootstrapped), during the forward shift, from a point in time when the set signal SET1 changes to the high level to a point in time when the clock signal CK1 changes to the high level is the period 1H. Meanwhile, in the shift register 40, the above-described period is the period 2H. Therefore, according to the shift register 40, a sufficient operating voltage margin can be secured for the charging time of the node netA.

As described above, in the shift register 40 according to the present embodiment, one of the clock signals among the six-phase clock signals (the gate clocks GCK1 to GCK6) is supplied to the unit circuit 11 as the first clock signal (the clock signal CK1), the first set signal is the output signal OUTi−2 of the unit circuit 11 at the stage two stages before the i-th stage, the first reset signal is the output signal OUTi+4 of the unit circuit 11 at the stage four stages after the i-th stage, the second set signal is the output signal OUTi+2 of the unit circuit 11 at the stage two stages after the i-th stage, and the second reset signal is the output signal OUTi−4 of the unit circuit 11 at the stage four stages before the i-th stage. Therefore, the shift register 40 can be provided that has the above-described effect and operates based on the six-phase clock signals. Further, a sufficient operating voltage margin can be secured for the charging time of the node netA.

In the description above, in each of the first to third embodiments, the shift register that operates based on the four-phase clock signals is described, and in the fourth embodiment, the shift register that operates based on the six-phase clock signals is described. In a similar manner, a shift register that operates based on eight-phase clock signals, twelve-phase clock signals, or the like can be configured. Further, a shift register having features of a plurality of the above-described embodiments and the modified examples may be configured by combining the features of each of the embodiments and the modified examples in a chosen manner, as long as those features do not run contrary to the nature of each of the embodiments and the modified examples. For example, features of the second embodiment or the third embodiment may be added to the shift register 40 according to the fourth embodiment.

In the liquid crystal display device illustrated in FIG. 2, the single scanning line drive circuit 3 is arranged along one side (the left side in FIG. 2) of the display region 2, and the scanning line drive circuit 3 drives the scanning lines G1 to Gn from one end (the left end in FIG. 2) (single-side driving with a single-side arrangement). In place of this, two scanning line drive circuits may be arranged along two opposing sides of the display region 2, and the two scanning line drive circuits may drive the scanning lines G1 to Gn from both ends (both-side driving with a both-side arrangement). In this case, the same control signal is supplied to the two scanning line drive circuits, and the two scanning line drive circuits perform the same operation.

Figure 26:
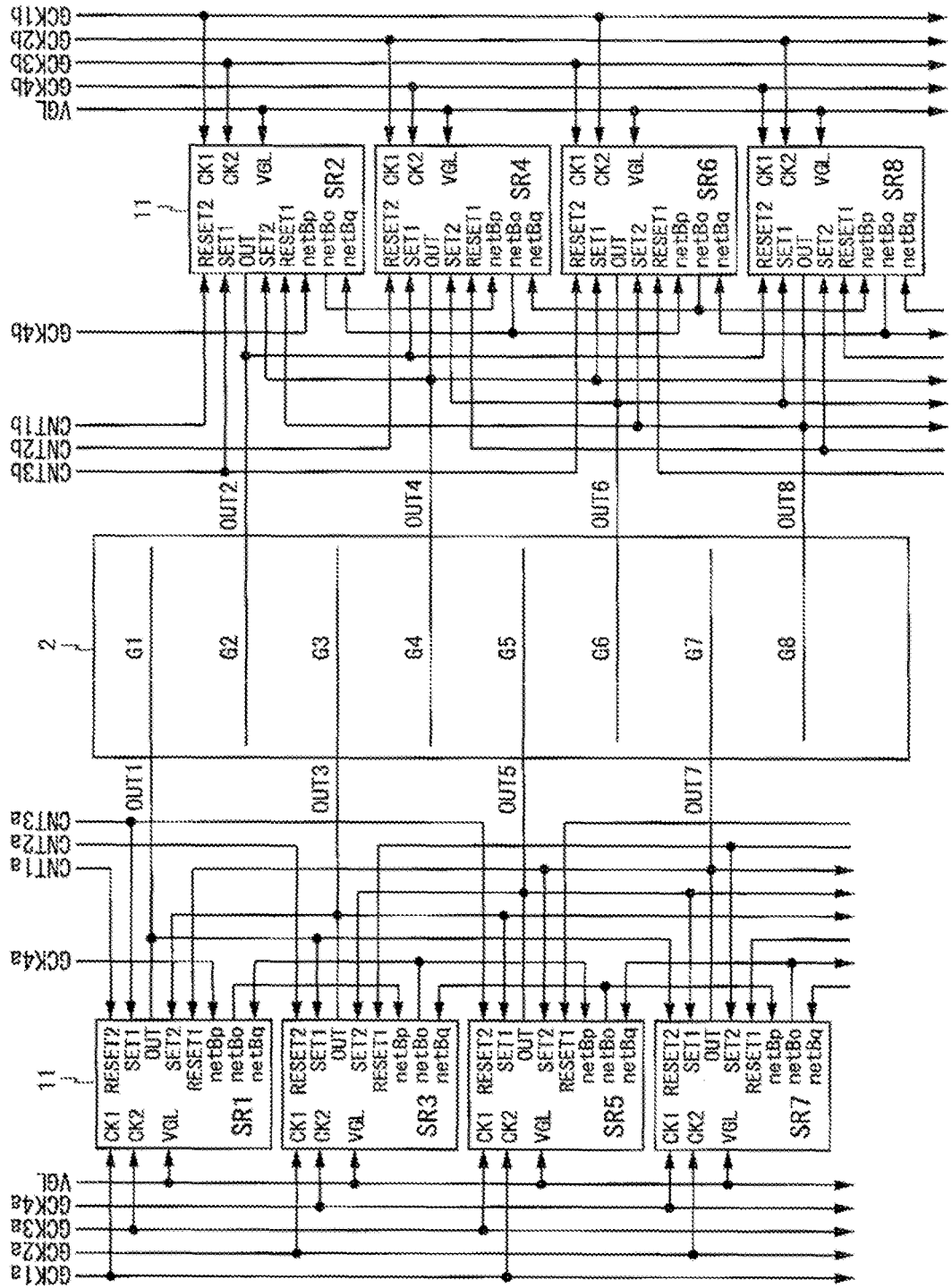
FIG. 26 is a diagram illustrating a portion of a liquid crystal display device including the shift register according to any one of the embodiments.

Alternatively, as illustrated in FIG. 26, two scanning line drive circuits may be arranged along two opposing sides of the display region 2, one of the scanning line drive circuits may drive odd-numbered scanning lines from one end, and the other scanning line drive circuit may drive even-numbered scanning lines from the other end (comb-teeth driving with the both-side arrangement). In this case, different control signals are supplied to the two scanning line drive circuits, and the two scanning line drive circuits operate independently of each other.

In a liquid crystal display device illustrated in FIG. 26, gate clocks GCK1$a$ to GCK4$a$, control signals CNT1$a$ to CNT6$a$ (some not illustrated), and the low level potential VGL are supplied to a scanning line drive circuit disposed on the left side of the display region 2, and gate clocks GCK1$b$ to GCK4$b$, control signals CNT1$b$ to CNT6$b$ (some not illustrated), and the low level potential VGL are supplied to a scanning line drive circuit disposed on the right side of the display region 2. These signals change at half the speed of that of the signals described in the first to fourth embodiments. During the forward shift, the gate clocks GCK1$b$ to GCK4$b$ and the control signals CNT1$b$ to CNT6$b$ are delayed by the period 1H with respect to the gate clocks GCK1$a$ to GCK4$a$ and the control signals CNT1$a$ to CNT6$a$, respectively. The output signals OUT1, OUT3, . . . of the scanning line drive circuit disposed on the left side of the display region 2 are applied to the odd-numbered scanning lines G1, G3, . . . . The output signals OUT2, OUT4, . . . of the scanning line drive circuit disposed on the right side of the display region 2 are applied to the even-numbered scanning lines G2, G4, . . . .

Although the disclosure is described in detail above, the above description is exemplary in all respects and is not limiting. It is understood that numerous other modifications or variations can be made without departing from the scope of the disclosure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A shift register configured to shift in both directions, the shift register comprising:
   a plurality of unit circuits connected at multiple stages, wherein the unit circuit includes
   an output transistor, one of conduction terminals thereof being supplied with a first clock signal, another conduction terminal thereof being connected to an output terminal of an output signal, and a control terminal thereof being connected to a first node,
   a first set transistor configured to apply an on-level potential to the first node based on a first set signal, a first reset transistor configured to apply an off-level potential to the first node based on a first reset signal, a second set transistor configured to apply an on-level potential to the first node based on a second set signal, a second reset transistor configured to apply an off-level potential to the first node based on a second reset signal, a control signal generating circuit configured to generate a control signal that changes to an on level when the first clock signal changes to an on level while a potential of the first node is at an off level, and to output the control signal to the unit circuits at a preceding stage and a next stage, a first potential stabilizing transistor configured to apply an off-level potential to the first node based on a control signal output from the unit circuit at the preceding stage, and a second potential stabilizing transistor configured to apply an off-level potential to the first node based on a control signal output from the unit circuit at the next stage.

2. The shift register according to claim 1, wherein the control signal generating circuit includes a first transistor that, based on the first clock signal, applies an on-level potential to a second node connected to an output terminal of the control signal, and a second transistor that, based on the potential of the first node, applies an off-level potential to the second node.

3. The shift register according to claim 2, wherein the control signal generating circuit further includes a third transistor that, based on the first clock signal and a second clock signal that differs in phase from the first clock signal by a half period, applies an off-level potential to the second node.

4. The shift register according to claim 3, wherein the control signal generating circuit further includes a fourth transistor that, based on a second control signal that is set to an on level after the first clock signal stops, applies an off level potential to the second node.

5. The shift register according to claim 1, wherein instead of the control signal output from the unit circuit at the preceding stage, one clock signal among multi-phase clock signals is supplied to the first potential stabilizing transistor in the unit circuit at an initial stage, and instead of the control signal output from the unit circuit at the next stage, another clock signal among the multi-phase clock signals is supplied to the second potential stabilizing transistor in the unit circuit at a final stage.

6. The shift register according to claim 1 further comprising:

an initial stage control signal generating circuit configured to generate an initial stage control signal; and a final stage control signal generating circuit configured to generate a final stage control signal, wherein instead of the control signal output from the unit circuit at the preceding stage, the initial stage control signal is supplied to the first potential stabilizing transistor in the unit circuit at an initial stage, and instead of the control signal output from the unit circuit at the next stage, the final stage control signal is supplied to the second potential stabilizing transistor in the unit circuit at a final stage.

7. The shift register according to claim 1, wherein one clock signal among four-phase clock signals is supplied to the unit circuit as the first clock signal, the first set signal is an output signal of the unit circuit at the preceding stage, the first reset signal is an output signal of a unit circuit at a stage three stages after, the second set signal is an output signal of the unit circuit at the next stage, and the second reset signal is an output signal of a unit circuit at a stage three stages preceding.

8. The shift register according to claim 1, wherein one clock signal among six-phase clock signals is supplied to the unit circuit as the first clock signal, the first set signal is an output signal of a unit circuit at a stage two stages preceding, the first reset signal is an output signal of a unit circuit at a stage four stages after, the second set signal is an output signal of a unit circuit two stages after, and the second reset signal is an output signal of a unit circuit at a stage four stages preceding.

9. A display device comprising:

a plurality of pixel circuits;

a plurality of scanning lines;

a plurality of data lines;

a data line drive circuit configured to drive the data lines; and a scanning line drive circuit including the shift register according to claim 1 and configured to drive the scanning lines.

* * * * *